(12) United States Patent
Froese et al.

(10) Patent No.: US 11,258,163 B2
(45) Date of Patent: Feb. 22, 2022

(54) HOUSING AND ANTENNA ARCHITECTURE FOR MOBILE DEVICE

(71) Applicant: Apple Inc., Cupertino, CA (US)

(72) Inventors: Kevin M. Froese, San Francisco, CA (US); Paul U. Leutheuser, Saratoga, CA (US); Martin J. Auclair, Campbell, CA (US); Christopher J. Durning, Cupertino, CA (US); Jun Ham, Cupertino, CA (US); Lucy E. Browning, San Francisco, CA (US); Sawyer I. Cohen, Menlo Park, CA (US); Richard Hung Minh Dinh, Cupertino, CA (US); Donald J. Parr, Mountain View, CA (US)

(73) Assignee: APPLE INC., Cupertino, CA (US)

( * ) Notice: Subject to any disclaimer, the term of this patent is extended or adjusted under 35 U.S.C. 154(b) by 567 days.

(21) Appl. No.: 16/142,285

(22) Filed: Sep. 26, 2018

(65) Prior Publication Data

US 2020/0076056 A1 Mar. 5, 2020

Related U.S. Application Data

(60) Provisional application No. 62/725,237, filed on Aug. 30, 2018.

(51) Int. Cl.
*H01Q 1/30* (2006.01)
*H01Q 1/24* (2006.01)
(Continued)

(52) U.S. Cl.
CPC ............. *H01Q 1/243* (2013.01); *H01Q 5/30* (2015.01); *H04M 1/0283* (2013.01);
(Continued)

(58) Field of Classification Search
CPC .................................. H01Q 1/243; H01Q 5/30
See application file for complete search history.

(56) References Cited

U.S. PATENT DOCUMENTS

| 4,106,839 A | 8/1978 | Cooper |
| 4,256,412 A | 3/1981 | Tybus et al. |
| (Continued) | | |

FOREIGN PATENT DOCUMENTS

| CN | 101087500 | 12/2007 |
| CN | 102159045 | 8/2011 |
| (Continued) | | |

OTHER PUBLICATIONS

Author Unknown, "Improved Touchscreen Products," Research Disclosure, Kenneth Mason Publications, Hampshire, UK, GB, vol. 428, No. 53, Dec. 1, 1999.

(Continued)

*Primary Examiner* — Graham P Smith
(74) *Attorney, Agent, or Firm* — Brownstein Hyatt Farber Schreck, LLP

(57) ABSTRACT

A device includes a display and a housing. The housing surrounds the display and has four corners defining portions of an exterior surface of the device. The housing includes a first housing segment defining at least part of a first corner of the four corners and configured to operate as an antenna; a second housing segment defining at least part of a second corner of the four corners; and a third housing segment defining at least part of a third corner of the four corners. The third corner forms part of the housing diagonally opposite the second corner. The housing further includes a non-conductive housing component that structurally couples the first housing segment to another portion of the housing.

20 Claims, 46 Drawing Sheets

(51) Int. Cl.
*H01Q 5/30* (2015.01)
*H04M 1/02* (2006.01)
*H05K 5/00* (2006.01)
*H05K 5/02* (2006.01)

(52) U.S. Cl.
CPC ......... *H05K 5/0017* (2013.01); *H05K 5/0208* (2013.01); *H05K 5/0217* (2013.01)

(56) References Cited

U.S. PATENT DOCUMENTS

| | | |
|---|---|---|
| 4,855,174 A | 8/1989 | Kamamoto et al. |
| 4,989,622 A | 2/1991 | Kozuka et al. |
| 5,055,347 A | 10/1991 | Bacon, Jr. |
| 5,512,374 A | 4/1996 | Wallace et al. |
| 6,061,104 A | 5/2000 | Evanicky et al. |
| 6,093,887 A | 7/2000 | Ponto et al. |
| 6,189,938 B1 | 2/2001 | Nakadaira et al. |
| 6,288,330 B1 | 9/2001 | Chen |
| 6,359,768 B1 | 3/2002 | Eversley et al. |
| 6,392,873 B1 | 5/2002 | Honda |
| 6,442,826 B1 | 9/2002 | Staudt et al. |
| 6,473,069 B1 | 10/2002 | Gerpheide |
| 6,483,024 B1 | 11/2002 | Smithson et al. |
| 6,589,891 B1 | 7/2003 | Rast |
| 6,654,256 B2 | 11/2003 | Gough |
| 6,671,160 B2 | 12/2003 | Hayden |
| 6,940,731 B2 | 9/2005 | Davis et al. |
| 6,996,425 B2 | 2/2006 | Watanabe |
| 7,048,242 B2 | 5/2006 | Oddsen, Jr. |
| 7,436,653 B2 | 10/2008 | Yang et al. |
| 7,491,900 B1 | 2/2009 | Peets et al. |
| 7,586,753 B2 | 9/2009 | Lu |
| 7,604,377 B2 | 10/2009 | Yu et al. |
| 7,755,913 B2 | 7/2010 | He |
| 7,829,812 B2 | 11/2010 | Tolbert et al. |
| 7,920,904 B2 | 4/2011 | Kim et al. |
| 7,986,525 B2 | 7/2011 | Wang |
| 8,066,233 B2 | 11/2011 | Fujikawa et al. |
| 8,092,897 B2 | 1/2012 | Honma et al. |
| 8,101,859 B2 | 1/2012 | Zadesky |
| 8,164,898 B2 | 4/2012 | Lin et al. |
| D660,193 S | 5/2012 | Neuner |
| 8,195,244 B2 | 6/2012 | Smoyer et al. |
| 8,199,488 B2 | 6/2012 | Zou et al. |
| 8,358,513 B2 | 1/2013 | Kim et al. |
| 8,396,521 B2 | 3/2013 | Horimoto et al. |
| 8,456,847 B2 | 6/2013 | Hwang et al. |
| 8,509,863 B2 | 8/2013 | Vedurmudi et al. |
| 8,553,907 B2 | 10/2013 | Thomason et al. |
| 8,558,977 B2 | 10/2013 | Gettemy et al. |
| 8,587,935 B2 | 11/2013 | Lee |
| 8,654,524 B2 | 2/2014 | Pance et al. |
| 8,665,236 B2 | 3/2014 | Myers |
| 8,675,359 B2 | 3/2014 | Chen |
| 8,681,115 B2 | 3/2014 | Kurita |
| 8,744,529 B2 | 6/2014 | Freund et al. |
| 8,773,848 B2 | 7/2014 | Russell-Clarke et al. |
| 8,824,140 B2 | 9/2014 | Prest et al. |
| 8,974,924 B2 | 3/2015 | Weber et al. |
| 8,975,540 B2 | 3/2015 | Mareno et al. |
| 9,007,748 B2 | 4/2015 | Jarvis |
| 9,086,748 B2 | 7/2015 | Nam et al. |
| 9,124,676 B2 | 9/2015 | Allore et al. |
| 9,135,944 B2 | 9/2015 | Jenks |
| 9,162,519 B2 | 10/2015 | Suehiro et al. |
| 9,173,306 B2 | 10/2015 | Lim et al. |
| 9,203,463 B2 | 12/2015 | Asrani et al. |
| 9,218,116 B2 | 12/2015 | Benko et al. |
| 9,250,659 B2 | 2/2016 | Tsai et al. |
| 9,390,869 B2 | 7/2016 | Lee et al. |
| 9,429,997 B2 | 8/2016 | Myers et al. |
| 9,448,631 B2 | 9/2016 | Winter et al. |
| 9,489,054 B1 | 11/2016 | Sumsion et al. |
| 9,532,723 B2 | 1/2017 | Kim et al. |
| 9,642,241 B2 | 5/2017 | Huitema et al. |
| 9,654,164 B2 | 5/2017 | Irci et al. |
| 9,740,237 B2 | 8/2017 | Moore et al. |
| 9,804,635 B2 | 10/2017 | Kim et al. |
| 9,826,649 B2 | 11/2017 | Narajowski et al. |
| 9,898,903 B2 | 2/2018 | Khoshkava et al. |
| 9,955,603 B2 | 4/2018 | Kiple et al. |
| 10,013,075 B2 | 7/2018 | Shipman |
| 10,042,442 B2 | 8/2018 | Kwak |
| 10,110,267 B2 | 10/2018 | Kim et al. |
| 10,321,590 B2 | 6/2019 | Cater et al. |
| 10,424,765 B2 | 9/2019 | Hwang et al. |
| 10,468,753 B2 | 11/2019 | Kim et al. |
| 10,705,570 B2 | 7/2020 | Kuna et al. |
| 2002/0072335 A1 | 6/2002 | Watanabe |
| 2002/0130981 A1 | 9/2002 | Ma et al. |
| 2004/0190239 A1 | 9/2004 | Weng |
| 2005/0140565 A1 | 6/2005 | Krombach |
| 2007/0195495 A1 | 8/2007 | Kim et al. |
| 2007/0287512 A1 | 12/2007 | Kilpi et al. |
| 2008/0084384 A1 | 4/2008 | Gregorio et al. |
| 2008/0174037 A1 | 7/2008 | Chen |
| 2009/0041984 A1 | 2/2009 | Mayers et al. |
| 2010/0137043 A1 | 6/2010 | Horimoto et al. |
| 2010/0151925 A1 | 6/2010 | Vedurmudi et al. |
| 2010/0265182 A1 | 10/2010 | Ball et al. |
| 2010/0315399 A1 | 12/2010 | Jacobson et al. |
| 2011/0047459 A1 | 2/2011 | Van Der Westhuizen |
| 2011/0065479 A1 | 3/2011 | Nader |
| 2011/0095994 A1 | 4/2011 | Birnbaum |
| 2011/0205169 A1 | 8/2011 | Yasutake et al. |
| 2012/0088072 A1 | 4/2012 | Pawloski et al. |
| 2012/0175165 A1 | 7/2012 | Merz et al. |
| 2012/0236477 A1 | 9/2012 | Weber |
| 2013/0051000 A1 | 2/2013 | Yu et al. |
| 2013/0273295 A1 | 10/2013 | Kenney et al. |
| 2014/0015773 A1 | 1/2014 | Loeffler |
| 2014/0368455 A1 | 12/2014 | Croisonnier et al. |
| 2015/0090571 A1 | 4/2015 | Leong et al. |
| 2015/0109223 A1 | 4/2015 | Kessler et al. |
| 2015/0124401 A1 | 5/2015 | Prest et al. |
| 2015/0183185 A1 | 7/2015 | Chang |
| 2015/0185946 A1 | 7/2015 | Fourie |
| 2015/0255853 A1 | 9/2015 | Kwong et al. |
| 2016/0098107 A1 | 4/2016 | Morrell et al. |
| 2016/0103544 A1 | 4/2016 | Filiz et al. |
| 2016/0147257 A1 | 5/2016 | Yamazaki |
| 2016/0270247 A1 | 9/2016 | Jones et al. |
| 2016/0308563 A1 | 10/2016 | Ouyang et al. |
| 2017/0010771 A1 | 1/2017 | Bernstein et al. |
| 2017/0264722 A1* | 9/2017 | Zhong ............... H01Q 1/42 |
| 2018/0210515 A1 | 7/2018 | Lyles et al. |
| 2018/0213660 A1 | 7/2018 | Prest et al. |
| 2018/0217668 A1 | 8/2018 | Ligtenberg et al. |
| 2018/0217669 A1 | 8/2018 | Ligtenberg et al. |
| 2018/0218859 A1 | 8/2018 | Ligtenberg et al. |
| 2018/0284845 A1 | 10/2018 | Honma et al. |
| 2019/0101960 A1 | 4/2019 | Silvanto et al. |
| 2019/0361543 A1 | 11/2019 | Zhang |
| 2019/0377385 A1 | 12/2019 | Bushnell |
| 2020/0057525 A1 | 2/2020 | Prest et al. |
| 2020/0076057 A1 | 3/2020 | Leutheuser et al. |
| 2020/0076058 A1 | 3/2020 | Zhang et al. |
| 2020/0278747 A1 | 9/2020 | Ligtenberg et al. |

FOREIGN PATENT DOCUMENTS

| | | |
|---|---|---|
| CN | 202281978 | 6/2012 |
| CN | 102984904 | 3/2013 |
| CN | 203054674 | 7/2013 |
| CN | 103390793 | 11/2013 |
| CN | 203416294 | 1/2014 |
| CN | 104742308 | 7/2015 |
| CN | 105228966 | 1/2016 |
| CN | 107221506 | 9/2017 |
| CN | 107275751 | 10/2017 |
| CN | 107735903 | 2/2018 |
| CN | 108400425 | 8/2018 |
| EP | 2565742 | 3/2013 |

(56) References Cited

FOREIGN PATENT DOCUMENTS

| | | |
|---|---|---|
| EP | 2843501 | 3/2015 |
| EP | 2993730 | 3/2016 |
| EP | 3144768 | 3/2017 |
| EP | 3438786 | 2/2019 |
| GB | 2516439 | 1/2015 |
| GB | 2529885 | 3/2016 |
| JP | S58151619 | 9/1983 |
| JP | H61039144 | 2/1986 |
| JP | H10102265 | 4/1998 |
| JP | H63249697 | 10/1998 |
| JP | 2001216077 | 8/2001 |
| JP | 20023431 F | 11/2002 |
| JP | 2004272690 | 9/2004 |
| JP | 2006243812 | 9/2006 |
| JP | 2007072375 | 3/2007 |
| JP | 2011014149 | 1/2011 |
| JP | 2011239139 | 11/2011 |
| JP | 2011248888 | 12/2011 |
| JP | 2012027592 | 2/2012 |
| JP | 2012222553 | 11/2012 |
| JP | 2013508818 | 3/2013 |
| JP | 2014186075 | 10/2014 |
| JP | 2015031952 | 2/2015 |
| KR | 20110049416 | 5/2011 |
| KR | 20150012312 | 2/2015 |
| KR | 20160019833 | 2/2016 |
| KR | 20160052275 | 5/2016 |
| KR | 20160134504 | 11/2016 |
| TW | 201129285 | 8/2011 |
| TW | 201532835 | 9/2015 |
| TW | 201701119 | 1/2017 |
| WO | WO2009/002605 | 12/2008 |
| WO | WO2009/049331 | 4/2009 |
| WO | WO2009/129123 | 10/2009 |
| WO | WO2012/129247 | 9/2012 |
| WO | WO2014/037945 | 3/2014 |
| WO | WO2015/153701 | 10/2015 |
| WO | WO2016/039803 | 3/2016 |
| WO | WO2016/053901 | 4/2016 |
| WO | WO2018/013573 | 1/2018 |
| WO | WO2018/142132 | 8/2018 |

OTHER PUBLICATIONS

Kim et al., "Ultrathin Cross-Linked Perfluoropolyether Film Coatings from Liquid $CO_2$ and Subsequent UV Curing," Chem. Matter, vol. 22, pp. 2411-2413, 2010.
U.S. Appl. No. 16/142,352, filed Sep. 26, 2018, pending.
U.S. Appl. No. 16/145,019, filed Sep. 28, 2018, pending.
U.S. Appl. No. 16/183,591, filed Nov. 7, 2018, pending.
U.S. Appl. No. 16/205,145, filed Nov. 29, 2018, pending.
U.S. Appl. No. 16/290,515, filed Mar. 1, 2019, pending.
Author Unknown, "Smart Watch—New Fashion Men/women Bluetooth Touch Screen Smart Watch Wrist Wrap Watch Phone," https://www.fargoshopping.co.ke/, 5 pages, Mar. 2016.

* cited by examiner

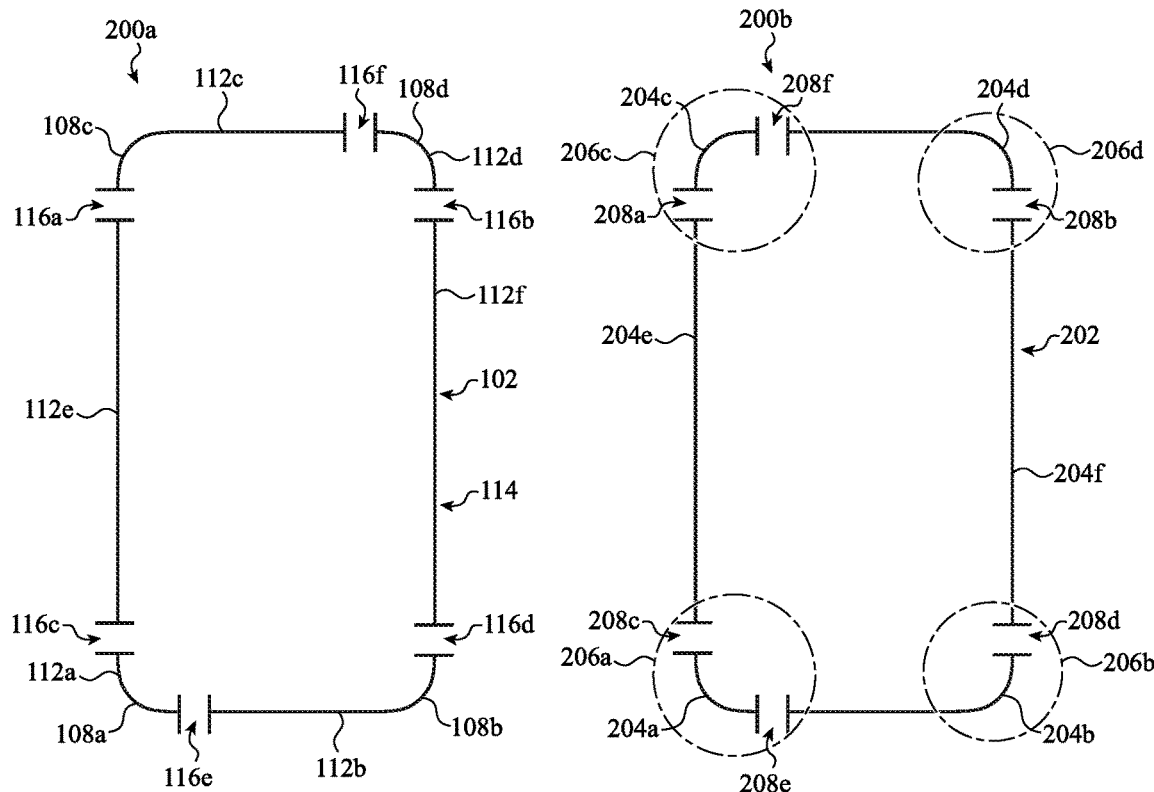
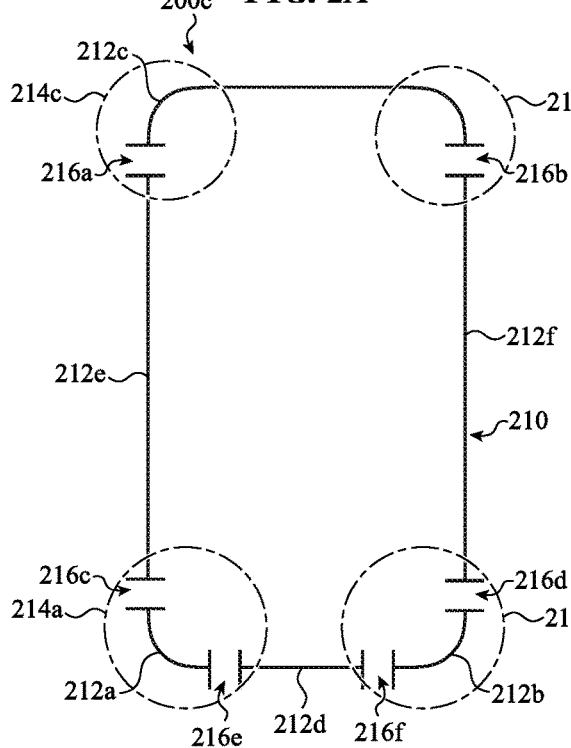
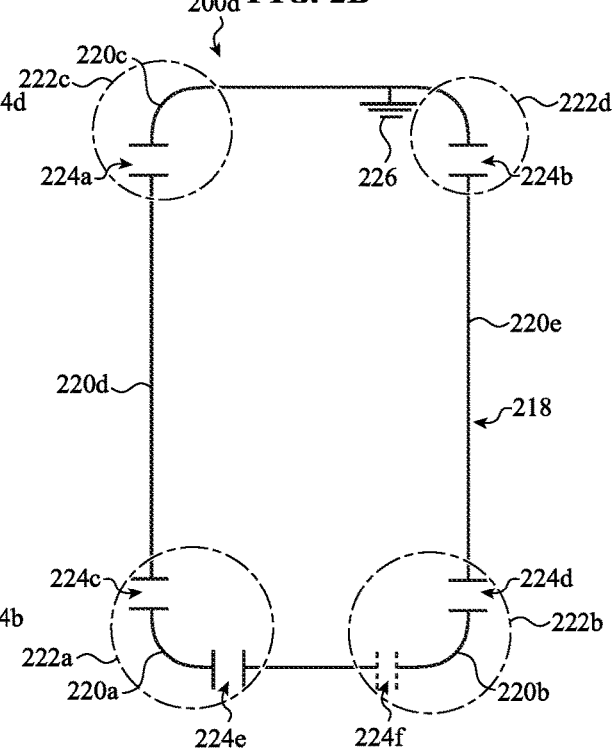
FIG. 2A
FIG. 2B
FIG. 2C
FIG. 2D

HOUSING AND ANTENNA ARCHITECTURE FOR MOBILE DEVICE

CROSS-REFERENCE TO RELATED APPLICATION(S)

This application is a nonprovisional patent application of and claims the benefit of U.S. Provisional Patent Application No. 62/725,237, filed Aug. 30, 2018 and titled "Housing and Antenna Architecture for Mobile Device", the disclosure of which is hereby incorporated herein by reference in its entirety.

FIELD

The described embodiments generally relate to a housing and antenna architecture for a mobile device. More particularly, the described embodiments relate to a segmented housing in which housing segments may be positioned at each of one or more corners defining portions of an exterior surface of the device. In some embodiments, one or more of the housing segments may be operable as an antenna for the device.

BACKGROUND

Portable electronic devices have become more compact over the years. There is an increasing need to make housings that are both aesthetically pleasing and structurally robust. Some traditional housings are formed from a single material in order to simplify manufacturing and assembly. However, a single-piece housing may not provide some of the structural, functional, and/or aesthetic benefits of a multi-segment housing, as described herein. The devices, housings, and components described herein, and the corresponding methods of manufacture described herein, may be used to improve the manufacturability and function of multi-segment housings while maintaining the benefits of multi-segment housings.

SUMMARY

Some example embodiments are directed to multi-segment housings that include multiple conductive segments. The multiple conductive segments may be structurally coupled by one or more non-conductive housing components, which non-conductive housing components may define segments or splits between the conductive segments. One or more of the conductive segments may be configured to operate as an antenna, and the non-conductive housing component(s) may provide electrical insulation between a conductive segment and one or more other conductive segments or components. In some embodiments, a sidewall of a device may have a generally rectangular shape, and four different conductive segments may define four different corners about the sidewall. Each of the four different conductive segments may be configured to operate as a different antenna when the device wirelessly communicates with other devices, or different combinations of the conductive segments may be configured for wireless communication in different wireless communication modes.

In a first aspect, the present disclosure describes a device including a display and a housing. The housing may surround the display and have four corners defining portions of an exterior surface of the device. The housing may include a first housing segment defining at least part of a first corner of the four corners, a second housing segment defining at least part of a second corner of the four corners, a third housing segment defining at least part of a third corner of the four corners, and a non-conductive housing component that structurally couples the first housing segment to another portion of the housing. The third corner may form part of the housing diagonally opposite the second corner. The first housing segment may be configured to operate as an antenna.

In another aspect, the present disclosure describes a device including a display, a housing, and wireless communication circuitry. The housing may define a sidewall of the device surrounding a perimeter of the display. The housing may include a first conductive segment defining at least part of a first corner of the sidewall, a second conductive segment defining at least part of a second corner of the sidewall, a third conductive segment defining at least part of a third corner of the sidewall, a fourth conductive segment defining at least part of a fourth corner of the sidewall, and a non-conductive housing component that structurally couples the first conductive segment to the second conductive segment and electrically insulates the first conductive segment from the second conductive segment. The wireless communication circuitry may be coupled to at least the first conductive segment.

In still another aspect of the disclosure, a device includes a display, a housing, and wireless communication circuitry. The housing may define a sidewall of the device and at least partially define an interior volume including the display. The housing may include a first conductive antenna segment defining a first portion of the sidewall, a second conductive antenna segment defining a second portion of the sidewall, and a non-conductive housing component defining a third portion of the sidewall and electrically insulating the second conductive antenna segment from the first conductive antenna segment. The wireless communication circuitry may be disposed within the interior volume. The wireless communication circuitry may be operable in a first wireless communication with the second conductive antenna segment electrically disconnected from the first conductive antenna segment, and in a second wireless communication mode with the second conductive antenna segment electrically connected to the first conductive antenna segment.

In another aspect, the present disclosure describes a device including a display and a housing. The housing may define a sidewall of the device and an interior volume including the display. The housing may include a first housing segment defining a first portion of the sidewall and a first interlock feature extending into the interior volume. The first interlock feature may have a first interlock surface and a first hole extending into the first interlock surface. The housing may also include a second housing segment defining a second portion of the sidewall and a second interlock feature extending into the interior volume. The second interlock feature may have a second interlock surface opposite to the first interlock surface and a second hole extending into the second interlock surface. A non-conductive housing component may at least partially fill the first hole and the second hole, thereby structurally coupling the first housing segment to the second housing segment.

In yet another aspect, the present disclosure describes another device including a display and a housing. The housing may at least partially surround the display and include a first housing segment defining at least a first portion of an exterior surface of the device and a first interlock feature. The first interlock feature may have an interlock surface that is offset with respect to an end surface of the first housing segment, and the first interlock feature may have a first opening formed in the interlock surface. The housing may also include a second housing segment defining at least a second portion of the exterior surface of the device and a second interlock feature. The second interlock feature may have a second opening aligned with the first opening. The housing may further include a non-conductive housing component defining a third portion of the exterior surface of the device. The non-conductive housing component may extend into the first opening and the second opening.

In still another aspect of the disclosure, a device includes a display and a housing, with the housing defining a sidewall that extends around the display. The housing may include a first housing segment defining a first portion of the sidewall and a first interlock feature having a first hole, a second housing segment defining a second portion of the sidewall and a second interlock feature having a second hole, and a non-conductive housing component. The second hole may be substantially aligned with the first hole, and the non-conductive housing component may at least partially fill the first hole and the second hole, thereby structurally coupling the first housing segment to the second housing segment.

In addition to the aspects and embodiments described above, further aspects and embodiments will become apparent by reference to the drawings and by study of the following description.

BRIEF DESCRIPTION OF THE DRAWINGS

The disclosure will be readily understood by the following detailed description in conjunction with the accompanying drawings, wherein like reference numerals designate like structural elements, and in which:

FIGS. 2A-2E show a number of different configurations for a multi-segment housing that forms a sidewall of a device;

Figure 1A:
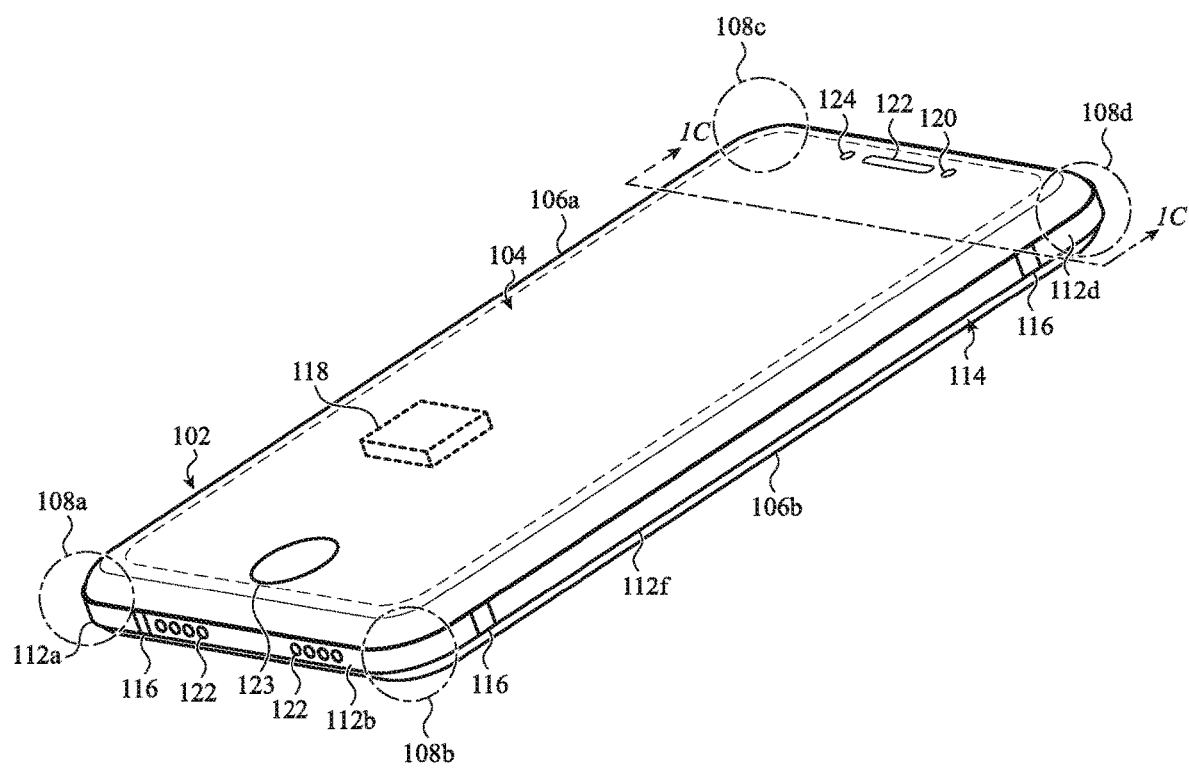
FIGS. 1A-1C show an example of an electronic device such as a mobile phone or tablet computer.

The use of cross-hatching or shading in the accompanying figures is generally provided to clarify the boundaries between adjacent elements and also to facilitate legibility of the figures. Accordingly, neither the presence nor the absence of cross-hatching or shading conveys or indicates any preference or requirement for particular materials, material properties, element proportions, element dimensions, commonalities of similarly illustrated elements, or any other characteristic, attribute, or property for any element illustrated in the accompanying figures.

Additionally, it should be understood that the proportions and dimensions (either relative or absolute) of the various features and elements (and collections and groupings thereof) and the boundaries, separations, and positional relationships presented therebetween, are provided in the accompanying figures merely to facilitate an understanding of the various embodiments described herein and, accordingly, may not necessarily be presented or illustrated to scale, and are not intended to indicate any preference or requirement for an illustrated embodiment to the exclusion of embodiments described with reference thereto.

DETAILED DESCRIPTION

Reference will now be made in detail to representative embodiments illustrated in the accompanying drawings. It should be understood that the following description is not intended to limit the embodiments to one preferred embodiment. To the contrary, it is intended to cover alternatives, modifications, and equivalents as can be included within the spirit and scope of the described embodiments as defined by the appended claims.

The embodiments described herein are directed to a multi-segment housing that may include multiple conductive segments. The conductive segments may define respective portions of a sidewall or exterior surface of the device. The multiple conductive segments may be structurally coupled by one or more non-conductive segments or "splits". One or more of the conductive segments may be configured to operate as an antenna (i.e., one or more conductive segments may be configured to operate as one or more antennas). One or more of the non-conductive segments may provide electrical insulation between a conductive segment and adjacent conductive segments or components.

Some example embodiments are directed to a non-conductive segment that is structurally interlocked with one or more adjacent housing segments. In particular, a non-conductive housing segment or component may be molded into a gap between a pair of housing segments, and a portion of the non-conductive housing segment that is located or positioned internal to a housing may flow into and around various features to provide a structural interlock between the pair of housing segments. As described in more detail below, the non-conductive housing segment (or split) may be molded into one or more holes, openings, recesses, or cavities in interlock features that are formed near the ends of housing segments, internal to the housing. In some implementations, a non-conductive housing segment or component may at least partially fills the holes, openings, recesses, or cavities in interlock features formed near the adjacent ends of adjacent housing segments.

As described in more detail below, one or more of the housing segments may be formed from a conductive material and may be configured to function as an antenna for an electronic device. In particular, one or more housing segments may be operably coupled to wireless communication circuitry, and may be configured as an antenna to transmit and receive wireless communication signals. In some cases, separate housing segments may define the four main corners of a device or housing. Each separate housing segment may be configured to operate as an antenna in order to facilitate single-band or multi-band wireless communication.

These and other embodiments are described with reference to FIGS. 1A-23. However, those skilled in the art will readily appreciate that the detailed description given herein with respect to these figures is for explanatory purposes only and should not be construed as limiting.

Directional terminology, such as "top", "bottom", "upper", "lower", "front", "back", "over", "under", "above", "below", "left", "right", etc. is used with reference to the orientation of some of the components in some of the figures described below. Because components in various embodiments can be positioned in a number of different orientations, directional terminology is used for purposes of illustration only and is in no way limiting. The directional terminology is intended to be construed broadly, and therefore should not be interpreted to preclude components being oriented in different ways. The use of alternative terminology, such as "or", is intended to indicate different combinations of the alternative elements. For example, A or B is intended to include, A, or B, or A and B.

Figure 1B:
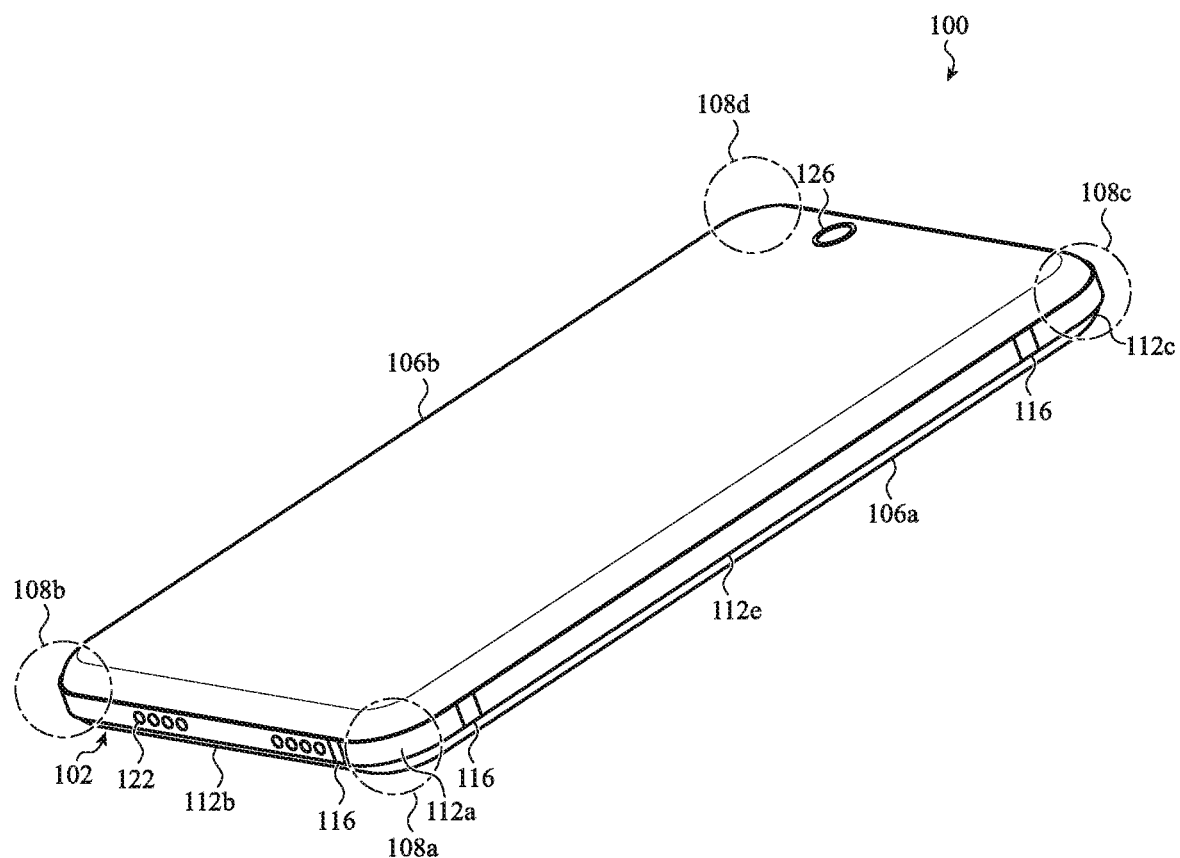
Figure 1C:
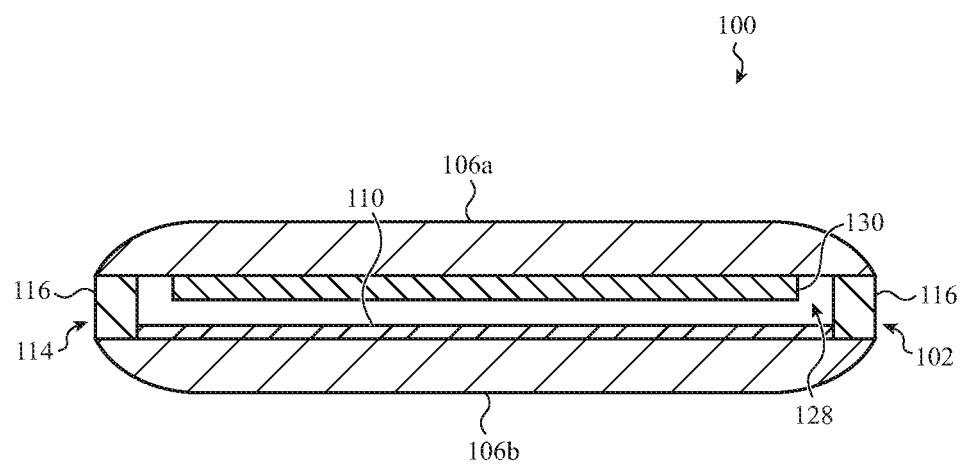

FIGS. 1A-1C show an example of an electronic device or simply "device" 100. The device's dimensions and form factor, including the ratio of the length of its long sides to the length of its short sides, suggest that the device 100 is a mobile phone (e.g., a smartphone). However, the device's dimensions and form factor are arbitrarily chosen, and the device 100 could alternatively be any portable electronic device including, for example a mobile phone, tablet computer, portable computer, portable terminal, or other portable or mobile device. FIG. 1A shows a front isometric view of the device 100; FIG. 1B shows a rear isometric view of the device 100; and FIG. 1C shows a cross-section of the device 100. The device 100 may include a housing 102 that at least partially surrounds a display 104. The housing 102 may include or support a front cover 106a or a rear cover 106b. The front cover 106a may be positioned over the display 104, and may provide a window through which the display 104 may be viewed. In some embodiments, the display 104 may be attached to (or abut) the housing 102 and/or the cover 106a.

As shown in FIGS. 1A & 1B, the housing 102 may define four corners 108 (e.g., corners 108a, 108b, 108c, and 108d) that surround the display 104 and define portions of an exterior surface of the device 100. In the current example, each of the four corners 108 of the housing 102 is positioned at a respective corner of a generally rectangular display 104. However, the relative positions of the corners 108 may vary depending on the implementation. By way of example, the corners 108 are shown to be rounded in x/y dimensions defining the front and rear surfaces of the device 100 shown in FIGS. 1A & 1B, but may alternatively be squared or have other shapes. The housing 102 may have a generally rectangular shape having a length dimension that is greater than a width dimension. In some cases the length may be greater than 100 mm and the width may be greater than 50 mm. The housing 102 may also have a thickness that ranges between 5 mm and 15 mm.

In some cases, the housing 102 may be a multi-segment housing that includes multiple conductive or metal segments that are separated by one or more non-conductive segments. In some cases the multi-segment housing, may include a support plate 110 (see, FIG. 1C) and/or additional internal structural components that are used to support internal electronic circuitry or electronic components.

The housing segments 112 of the housing 102 may form or define part or all of a sidewall 114. In particular, the housing segments 112 may define portions of a side surface (e.g., portions of an exterior surface or exterior side surface) of the device 100, which portions of the side surface may include four corners 108 of the sidewall 114. As shown in FIGS. 1A & 1B, the housing segments 112 or sidewall 114 may at least partially surround a perimeter of the display 104, and in some cases may be configured to protect the display 104 from drops of the device 100 that involve an impact to an edge or corner 108 of the sidewall 114. By way of example, the housing 102 may include six housing segments 112 that are structurally coupled to other portions of the housing 102 by a set of one or more non-conductive segments or housing components 116.

As used herein, the term "corner" may be used to refer to a portion of an exterior surface or sidewall of a device that forms a transition between adjoining sides or sidewalls. The term corner may refer to a region that includes 3-dimensional (3D) structure(s) that include portions of the sidewalls and/or portions of the front or rear covers 106a, 106b defining the front and rear surfaces, respectively. The term "corner" may also be used to refer to a portion of a sidewall 114 that extends (linearly or non-linearly) between the front and rear surfaces of a device and also joins adjacent sidewalls. In some embodiments, the corner portion of a sidewall may define a curved or arcuate contour between the front and rear surfaces. In some embodiments, the corner portion of a sidewall may define a flat side that joins the front and rear surfaces. As described herein, a generally rectangular device may be considered to have four corners that define the perimeters of the front and rear surfaces of the device with each corner connected to two adjacent corners. A generally rectangular device may also be considered to have four corners joined by four sides, with the four corners, in combination with the four sides, defining the perimeters of the front and rear surfaces of the device.

As explained in more detail herein, one or more of the housing segments 112 may be mechanically or structurally coupled to one or more adjacent housing segments 112 by the non-conductive housing segments or components 116, which segments or components 116 may partially or completely fill gaps between the housing segments 112. In some cases, the non-conductive housing segments or components 116 may also couple the housing segments 112 to the support plate 110 or another internal structure. A contiguous or monolithic piece of non-conductive material (e.g., a monolithic non-conductive component) may join or form all or multiple ones of the non-conductive housing segments or components 116 (or fill all or multiple ones of the gaps between housing segments 112), or different pieces of non-conductive material may join different sets of adjacent housing segments 112 (or fill different gaps between different pairs of adjacent housing segments 112). At least one non-conductive housing segment or component in the set of non-conductive housing segments or components 116 may define a portion (e.g., a segment) of an exterior surface of the sidewall 114 or housing 102. In some alternative embodiments, the housing 102 may include more or fewer housing segments separated by more or fewer gaps filled by non-conductive housing segments or components 116. In addition to mechanically coupling housing segments 112, the non-conductive housing segment(s) or component(s) may electrically insulate housing segments 112.

The housing segments 112 may have various lengths or shapes, and may be positioned symmetrically or asymmetrically about the device 100 or its sidewall 114. By way of example, and with reference to FIGS. 1A & 1B, the device 100 is shown to have a first housing segment 112a defining at least part (or all) of a first corner 108a of the sidewall 114. A second housing segment 112b defines at least part of a second corner 108b of the sidewall 114, a third housing segment 112c defines at least part of a third corner 108c of the sidewall 114, and a fourth housing segment 112d defines at least part of a fourth corner 108d of the sidewall 114. In some embodiments, the second and third housing segments 112b, 112c may traverse greater lengths along the sidewall 114 than the first and fourth housing segments 112a, 112d. A fifth housing segment 112e defines at least part of a first edge of the sidewall 114, between the first housing segment 112a and the third housing segment 112c, and a sixth housing segment 112f defines at least part of a second edge of the sidewall 114, between the second housing segment 112b and the fourth housing segment 112d. The third corner 108c forms a part of the housing 102 that is diagonally opposite the second corner 108b, and the fourth corner 108d forms a part of the housing 102 that is diagonally opposite the first corner 108a. The second edge forms part of the housing 102 that is opposite the first edge. The designations "first," "second," "third," "fourth", "fifth", and "sixth" are arbitrary, and are used herein only for ease of explanation.

In this example, a different housing segment 112 forms each of the four corners 108. However, the specific configuration of housing segments 112 may vary depending on the implementation. For example, a single housing segment may define two or more corners of a device, as described with reference to FIG. 2D, or substantially straight or non-corner housing segments may be positioned at the top and bottom edges of a device (e.g., similarly to the fifth and sixth housing segments 112e, 112f positioned at the side edges of the device 100). A housing may include more or fewer housing segments than the housing segments 112 shown in FIGS. 1A & 1B, and the housing segments may be distributed in various ways about a device's sidewall, as described with reference to FIGS. 2A-2E.

In some embodiments, one or more of the housing segments 112 may be a conductive segment formed from a metal or conductive material, and may be configured to operate as an antenna for the device 100. Housing segments 112 that are configured to be operated as antennas may sometimes be referred to herein as conductive antenna segments. Wireless communication circuitry 118 within the device 100 may be electrically coupled to one or more of the conductive segments. For example, wireless communication circuitry 118 may be coupled to one or more (or each) of the housing segments 112 that is conductive and configured to operate as an antenna. When the housing segments 112a, 112b, 112, 112d defining the corners 108 of the device 100 are conductive segments, the wireless communication circuitry 118 may be operable to configure the conductive segments (as antennas) for wireless communication in one or more wireless frequency bands. Configuring the conductive segments for wireless communication may enable the device 100 to communicate with other devices in one or more wireless communication modes, such as a 4×4 multiple-input multiple-output (MIMO) wireless communication mode, or other wireless communication modes that use one or more antenna, and up to four antennas, simultaneously. The wireless communication circuitry 118 may include one or more radio frequency (RF) transmitters or receivers, one or more switches, one or more modems, and so on.

In general, the housing segments 112 may be formed from a metal material including, for example, steel, stainless steel, aluminum, titanium, and/or a metal alloy. In some embodiments, the housing segments 112 may be formed from a non-metal material and may be coated or covered by a metal or metallic coating or layer. The non-conductive housing segments or components 116 may be formed from a polymer material, composite, or other non-conductive material. Example polymers include, polycarbonate, acrylonitrile butadiene styrene (ABS), polyurethane, polyether ether ketone (PEEK), polybutylene terephthalate (PBT), polyamide, or other similar materials.

In some embodiments, the non-conductive housing segments or components 116 may be formed by a polymer material having a fiber fill, and the polymer material may structurally couple the housing segments 112 in addition to forming portions of an exterior surface of the sidewall 114 (e.g., portions of the sidewall 114 that bridge or fill exterior gaps between housing segments 112). In other embodiments, the non-conductive housing segments or components 116 may include a first portion formed from a first polymer material and a second portion formed from a second polymer material. The first polymer material may have a fiber fill and structurally couple the housing segments 112. The second polymer material may be different from the first polymer material and form portions of an exterior surface of the sidewall 114. Each polymer having a fiber fill may have a fiber fill including glass or other types of fibers. In some embodiments, the second polymer material may also have a fiber fill, but have a fiber fill that differs from the fiber fill of the first polymer material.

As shown in FIGS. 1A & 1B, the device 100 may include various other components. For example, the front of the device 100 may include one or more front-facing cameras 120, speakers 122, sensors 124, microphones, or other components (e.g., audio, imaging, or sensing components) that are configured to transmit or receive signals to/from the device 100. In some cases, a front-facing camera 120, alone or in combination with other sensors, may be configured to operate as a bio-authentication or facial recognition sensor. The device 100 may also include various input devices, including a mechanical or virtual button 123, which may be located along the front surface of the device 100. The device 100 may also include buttons or other input devices positioned along the sidewall 114 and/or rear surface of the device 100. By way of example, the rear surface of the device 100 is shown to include a rear-facing camera 126 or other optical sensor (see, FIG. 1B). A flash or light source may also be positioned along the rear of the device 100 (e.g., near the camera 126).

As discussed previously, the device 100 may include a display 104 that is at least partially surrounded by the housing 102. The display 104 may include one or more display elements including, for example, a light-emitting display (LED), organic light-emitting display (OLED), liquid crystal display (LCD), electroluminescent display (EL), or other type of display element. The display 104 may also include one or more touch and/or force sensors that are configured to detect a touch and/or a force applied to an external surface of the device 100. The touch sensor may include a capacitive array of nodes or elements that are configured to detect a location of a touch along a surface of the cover 106. The force sensor may include a capacitive array and/or strain sensor that is configured to detect an amount of force applied along the surface of the cover 106a.

FIG. 1C depicts a cross-sectional view of the device 100 of FIGS. 1A and 1B. As shown in FIG. 1C, the housing 102 may include one or more non-conductive housing segments or components 116 that structurally couple the housing segments 112. The housing 102 may also include a front cover 106a and a rear cover 106b, which may be structurally coupled to the non-conductive housing segments or components 116 and/or one or more of the housing segments 112. In some cases, the rear cover 106b may be a discrete or separate component that is attached to the non-conductive housing segments or components 116 and/or one or more of the housing segments 112. In other cases, the rear cover 106 may be integrally formed with one or more of the housing segments 112 or non-conductive housing segments or components 116 to form a component that defines both the rear surface of the device 100 as well as one or more portions of the sidewall 116 of the device 100.

As shown in FIG. 1C, the sidewall 114 or housing 102 may define an interior volume 128 in which various electronic components of the device 100, including the display 104, may be positioned. In this example, the display 104 is at least partially positioned within the internal volume 128 and attached to an inner surface of the cover 106a. A touch sensor, force sensor, or other sensing element may be integrated with the cover 106a and/or the display 104 and may be configured to detect a touch and/or force applied to an outer surface of the cover 106a. In some cases, the touch sensor, force sensor, and/or other sensing element may be positioned between the cover 106a and the display 104.

The touch sensor and/or force sensor may include an array of electrodes that are configured to detect a location and/or force of a touch using a capacitive, resistive, strain-based, or other sensing configuration. The touch sensor may include, for example, a set of capacitive touch sensing elements, a set of resistive touch sensing elements, or a set of ultrasonic touch sensing elements. When a user of the device touches the cover 106a, the touch sensor (or touch sensing system) may detect one or more touches on the cover 106a and determine locations of the touches on the cover 106a. The touches may include, for example, touches by a user's finger or stylus. A force sensor or force sensing system may include, for example, a set of capacitive force sensing elements, a set of resistive force sensing elements, or one or more pressure transducers. When a user of the device 100 presses on the cover 106a (e.g., applies a force to the cover 106a), the force sensing system may determine an amount of force applied to the cover 106a. In some embodiments, the force sensor (or force sensing system) may be used alone or in combination with the touch sensor (or touch sensing system) to determine a location of an applied force, or an amount of force associated with each touch in a set of multiple contemporaneous touches.

As shown in FIG. 1C, a support plate 110 may be coupled to the non-conductive housing segments or components 116 and/or one or more of the housing segments 112 and may be used to attach or mount various other components of the device 100. For example, wireless communication circuitry, a camera(s), a bio-authentication sensor(s), a processor, and other components may be attached to the support plate 110. As examples, the support plate 110 may be metallic or plastic (or may be formed using any of the various materials that may be used to form the housing segments 112). In some cases, the various electronic components may be attached or integrated with one or more printed circuit boards (PCBs) or other logic boards that are attached to the support plate 110. The processor may include a single processor or multiple processors, and may be configured to operate the touch sensing system, the force sensing system, the wireless communication circuitry, the camera(s), the bio-authentication sensor(s), or other components of the device 100. A more detailed description of the various components of the device 100 is included below with respect to FIG. 23.

Turning to FIGS. 2A-2E, there are shown a number of different configurations 200 for a multi-segment housing that forms a sidewall of a device (e.g., a device such as the device 100 described with reference to FIGS. 1A-1C). One or more conductive segments of the multi-segment housings may be configured to operate as antennas for the device.

FIG. 2A shows a first sidewall configuration 200a for a device (e.g., the device 100). The sidewall 114 may include six housing segments, which housing segments may be the housing segments 112 described with reference to FIGS. 1A-1C. Each of the housing segments 112 may be conductive or non-conductive. In some embodiments, at least one of the housing segments 112 positioned at a corner 108 of the sidewall 114 may be conductive and operated as an antenna for a device. In some embodiments, each of the housing segments 112 positioned at a corner 108 of the sidewall 114 may be conductive, and may be operated as an antenna for a device. The housing segments 112 positioned at the left and right edges of the sidewall 114 may also be conductive, and may be operated as separate antennas of a device, or as conductive antenna segments that may be electrically connected or disconnected to other conductive antenna segments of a device.

The housing segments 112 may include a first housing segment 112a defining at least part (or all) of a first corner 108a of the sidewall 114, a second housing segment 112b defining at least part (or all) of a second corner 108b of the sidewall 114, a third housing segment 112c defining at least part (or all) of a third corner 108c of the sidewall 114, a fourth housing segment 112d defining at least part (or all) of a fourth corner 108d of the sidewall 114, a fifth housing segment 112e defining an edge disposed between the first and third housing segments 112a, and a sixth housing segment 112f defining an edge disposed between the second and fourth housing segments 112b, 112d. The third corner 108c forms a part of the housing 102 that is diagonally opposite the second corner 108b, and the fourth corner 108d forms a part of the housing 102 that is diagonally opposite the first corner 108a. In some embodiments, and as shown, each of the second and third housing segments 112b, 112c may extend along a greater portion of the sidewall 114 than each of the first and fourth housing segments 112a, 112d.

The first and fourth housing segments 112a, 112d may be substantially confined to the first and fourth corners 108a, 108d respectively, but in some embodiments (not shown) one or both of the first or fourth housing segments 112a, 112d may extend along one or more edges of the sidewall 114. Alternatively, the first or fourth housing segment 112a, 112d may wrap around less than all of a corner 108a or 108d of the sidewall 114.

The second and third housing segments 112b, 112c may wrap around the second and third corners 108b, 108c respectively, and may also extend along one or more edges of the sidewall 114. For example, the second housing segment 112b may extend along a bottom edge of the sidewall 114 (given the orientation of the sidewall 114 shown in FIG. 2A), and the third housing segment 112c may extend along a top edge of the sidewall 114. Alternatively, the second or third housing segment 112b, 112c may wrap around less than all of a corner 108b or 108c of the sidewall 114 and extend along one or more side edges of the sidewall 114.

Housing segments 112 that terminate in adjacent ends along the sidewall 114 may be structurally coupled to one another by a set of one or more non-conductive housing components 116 (e.g., non-conductive housing components, 116a, 116b, 116c, 116d, 116e, and 116f) that partially or completely fill gaps between adjacent ends of housing segments 112 about the sidewall 114. The sidewall 114 shown in FIG. 2A has six such gaps. At least one non-conductive housing component 116 in the set of non-conductive housing components 116 may define a portion of an exterior surface of the sidewall 114 (and also an exterior surface of the housing 102 or device 100 that includes the sidewall 114).

In some embodiments, each of the housing segments 112a, 112b, 112c, 112d positioned at a corner 108a, 108b, 108c, 108d of the sidewall 114 may be operated as a different antenna, and in some cases the housing segments 112a, 112b, 112c, 112d may be operated as different antennas simultaneously. The housing segments 112 may also be operated as antennas individually or in pairs, as may be useful for different wireless communication modes. In some examples, the first and fourth housing segments 112a, 112d may be used to communicate, individually or in parallel, over a same wireless frequency band or bands (e.g., the mid and high wireless frequency bands described with reference to FIG. 19), and the second and third housing segments 112b, 112c may be used to communicate, individually or in parallel, over a different set of one or more wireless frequency bands (e.g., the low, mid, and high wireless frequency bands described with reference to FIG. 19). The use of housing segments positioned at diagonally opposite corners of the sidewall 114 as antennas that communicate over the same wireless frequency band(s) provides a relatively maximum spatial separation between the antennas, such that the antennas are less likely to couple to one another.

Optionally, the fifth housing segment 112e may be connected or disconnected to one of the corner housing segments (e.g., to the first housing segment 112a or the third housing segment 112c) by a circuit disposed interior to a housing including the sidewall 114, or the sixth housing segment 112f may be connected or disconnected to one of the corner housing segments (e.g., to the second housing segment 112b or the fourth housing segment 112d) by a circuit disposed interior to the housing including the sidewall 114. Such switchable connections enable the housing segments 112 defining the sidewall 114 to be tuned to communicate over different wireless frequency bands.

FIG. 2B shows another sidewall configuration 200b for a device (e.g., the device 100). The sidewall 202 may include six housing segments 204. As an example, the housing segments 204 may include a first housing segment 204a defining at least part (or all) of a first corner 206a of the sidewall 202, a second housing segment 204b defining at least part (or all) of a second corner 206b of the sidewall 202, a third housing segment 204c defining at least part (or all) of a third corner 206c of the sidewall 202, a fourth housing segment 204d defining at least part (or all) of a fourth corner 206d of the sidewall 202, a fifth housing segment 204e defining an edge disposed between the first and third housing segments 204a, 204c, and a sixth housing segment 204f defining an edge disposed between the second and fourth housing segments 204b, 204d. The third corner 206c forms a part of the housing 202 that is diagonally opposite the second corner 206b, and the fourth corner 206d forms a part of the housing 202 that is diagonally opposite the first corner 206a.

Housing segments 204 that terminate in adjacent ends along the sidewall 202 may be structurally coupled to one another by a set of one or more non-conductive housing components 208 (e.g., non-conductive housing components, 208a, 208b, 208c, 208d, 208e, and 208f) that partially or completely fill gaps between adjacent ends of housing segments 204 about the sidewall 202. The sidewall 202 shown in FIG. 2B has six such gaps. At least one non-conductive housing component 208 in the set of non-conductive housing components 208 may define a portion (e.g., a segment) of an exterior surface of the sidewall 202 (and also an exterior surface of the housing that includes the sidewall 202). In some embodiments, the non-conductive housing components 208 may be variously configured and positioned, or formed of various materials, as described with reference to FIGS. 1A-1C.

The sidewall 202 and housing segments 204 may be formed, structurally coupled, and electrically insulated similarly to the sidewall 114 and housing segments 112 described with reference to FIG. 2A. However, the gap between the third and fourth housing segments 112c, 112d in FIG. 2A may be moved to the left along the top of the sidewall 202, such that the third housing segment 204c may be substantially confined to the third corner 206c, and the fourth housing segment 204d may wrap around the fourth corner 206d and extend along the top edge of the sidewall 202 (that is, along the top edge of the sidewall 202 given the orientation of the sidewall 202 shown in FIG. 2B). In alternative embodiments (not shown), the third housing segment 204c may also extend along one or more side edges of the sidewall 202, or may wrap around less than all of the third corner; or the fourth housing segment 204d may wrap around less than all of the fourth corner 206d.

In some embodiments, each of the housing segments 204a, 204b, 204c, 204d positioned at a corner 206 of the sidewall 202 may be operated as a different antenna, and in some cases the housing segments 204a, 204b, 204c, 204d may be operated as different antennas simultaneously. The housing segments 204a, 204b, 204c, 204d may also be operated individually or in pairs, as may be useful for different wireless communication modes. In some examples, the first and third housing segments 204a, 204c may be used to communicate, individually or in parallel, over a same wireless frequency band or bands (e.g., the mid and high wireless frequency bands described with reference to FIG. 19), and the second and fourth housing segments 204b, 204c may be used to communicate, individually or in parallel, over a different set of one or more wireless frequency bands (e.g., the low, mid, and high wireless frequency bands described with reference to FIG. 19).

Optionally, the fifth housing segment 204e may be connected or disconnected to one of the corner housing segments (e.g., to the first housing segment 204a or the third housing segment 204c) by a circuit disposed interior to a housing including the sidewall 202, or the sixth housing segment 204f may be connected or disconnected to one of the corner housing segments (e.g., to the second housing segment 204b or the fourth housing segment 204d) by a circuit disposed interior to the housing including the sidewall 202. Such switchable connections enable the housing segments 204 defining the sidewall 202 to be tuned to communicate over different wireless frequency bands.

FIG. 2C shows another sidewall configuration 200c for a device (e.g., the device 100). The sidewall 210 includes six housing segments 214. The sidewall 210 and housing segments 212 may be formed, structurally coupled, and electrically insulated similarly to the sidewall 114 and housing segments 112 described with reference to FIG. 2A. However, the manner in which the sidewall 210 is divided between the housing segments 212 differs, such that three housing segments 212a, 212b, 212d are positioned near the bottom edge of the sidewall 210 (given the orientation of the sidewall 210 shown in FIG. 2C), and a single housing segment 212c is positioned near a top edge of the sidewall 210. Alternatively, three housing segments may be positioned near the top edge of the sidewall 210, and a single housing segment may be positioned near the bottom edge of the sidewall 210.

The housing segments 212 may include a first housing segment 212a defining at least part (or all) of a first corner 214a of the sidewall 210, a second housing segment 212b defining at least part (or all) of a second corner 214b of the sidewall 210, a third housing segment 212c defining at least parts (or all) of third and fourth adjacent corners 214c, 214d of the sidewall 210 and a first edge of the sidewall 210 disposed between the third and fourth corners 214c, 214d, a fourth housing segment 212d defining at least part of a second edge opposite the first edge, a fifth housing segment 212e defining an edge disposed between the first and third housing segments 212a, 212c, and a sixth housing segment 212f defining an edge disposed between the second and third housing segments 212b, 212c.

The first and second housing segments 212a, 212b may be substantially confined to the first and second corners 214a, 214b respectively, but in some embodiments (not shown) one or both of the first or second housing segments 212a, 212b may extend along one or more side edges of the sidewall 210. Alternatively, the first or second housing segment 212a, 212b may wrap around less than all of a corner of the sidewall 210.

Housing segments 212 that terminate in adjacent ends along the sidewall 210 may be structurally coupled to one another by a set of one or more non-conductive housing components 214 (e.g., non-conductive housing components, 216a, 216b, 216c, 216d, 216e, and 2160 that partially or completely fill gaps between adjacent ends of housing segments 212 about the sidewall 210. The sidewall 210 shown in FIG. 2C has six such gaps. At least one non-conductive housing component 216 in the set of non-conductive housing components 216 may define a portion (e.g., a segment) of an exterior surface of the sidewall 210 (and also an exterior surface of the housing that includes the sidewall 210). In some embodiments, the non-conductive housing components 216 may be variously configured and positioned, or formed of various materials, as described with reference to FIGS. 1A-1C.

The sidewall 210 and housing segments 212 may be formed, structurally coupled, and electrically insulated similarly to the sidewall 202 and housing segments 204 described with reference to FIG. 2A.

In some embodiments, each of the first, second, third, and fourth housing segments 212a, 212b, 212c, 212d may be operated as a different antenna, and in some cases the housing segments 212a, 212b, 212c, 212d may be operated as different antennas simultaneously. The housing segments 212a, 212b, 212c, 212d may also be operated individually or in pairs, as may be useful for different wireless communication modes. In some examples, the first and second housing segments 212a, 212b may be used to communicate, individually or in parallel, over a same wireless frequency band or bands (e.g., the mid and high wireless frequency bands described with reference to FIG. 19), and the third and fourth housing segments 212c, 212d may be used to communicate, individually or in parallel, over a different set of one or more wireless frequency bands (e.g., the low, mid, and high wireless frequency bands described with reference to FIG. 19).

Optionally, the fifth housing segment 212e may be connected or disconnected to one of the corner housing segments (e.g., to the first housing segment 212a or the third housing segment 212c) by a circuit disposed interior to a housing including the sidewall 210, or the sixth housing segment 212f may be connected or disconnected to one of the corner housing segments (e.g., to the second housing segment 212b or the third housing segment 212c) by a circuit disposed interior to the housing including the sidewall 210. Such switchable connections enable the housing segments 212 defining the sidewall 210 to be tuned to communicate over different wireless frequency bands.

FIG. 2D shows a sidewall configuration 200d for a device (e.g., the device 100). The sidewall 218 includes five housing segments 220. The housing segments 220 may include a first housing segment 220a defining at least part (or all) of a first corner 222a of the sidewall 218, a second housing segment 220b defining at least part (or all) of a second corner 222b of the sidewall 218, a third housing segment 220c defining at least parts (or all) of third and fourth adjacent corners 222c, 222d of the sidewall 218 and a first edge of the sidewall 218 disposed between the third and fourth corners 222c, 222d, a fourth housing segment 220d defining an edge disposed between the first and third housing segments 220a, 220c, and a fifth housing segment 220e defining an edge disposed between the second and third housing segments 220b, 220c.

Housing segments 220 that terminate in adjacent ends along the sidewall 218 may be structurally coupled to one another by a set of one or more non-conductive housing components 224 (e.g., non-conductive housing components, 224a, 224b, 224c, 224d, and 224e) that partially or completely fill gaps between adjacent ends of housing segments 220 about the sidewall 218. The sidewall 218 shown in FIG. 2D has five such gaps. At least one non-conductive housing component 224 in the set of non-conductive housing components 224 may define a portion (e.g., a segment) of an exterior surface of the sidewall 218 (and also an exterior surface of the housing that includes the sidewall 218). In some embodiments, the non-conductive housing components 224 may be variously configured and positioned, or formed of various materials, as described with reference to FIGS. 1A-1C.

The sidewall 218 and housing segments 220 may be formed, structurally coupled, and electrically insulated similarly to the sidewall 114 and housing segments 112 described with reference to FIG. 2A. However, the third and fourth housing segments 112c, 112d shown in FIG. 2A are replaced with a singular housing segment 220c having a ground connection 226 where the gap between the third and fourth housing segments 112c, 112d is shown in FIG. 2A. The ground connection 226 provides separation between left and right portions of the housing segment 220c and enables the left and right portions to be operated as different antennas (e.g., similarly to the third and fourth segments 112c, 112d described with reference to FIG. 2A).

In some embodiments of the sidewall 218, a portion of the second housing segment 220b may be removed and filled with a non-conductive material 224f to provide an apparent symmetry between the lower left and lower right portions of the sidewall 218.

Figure 2E:
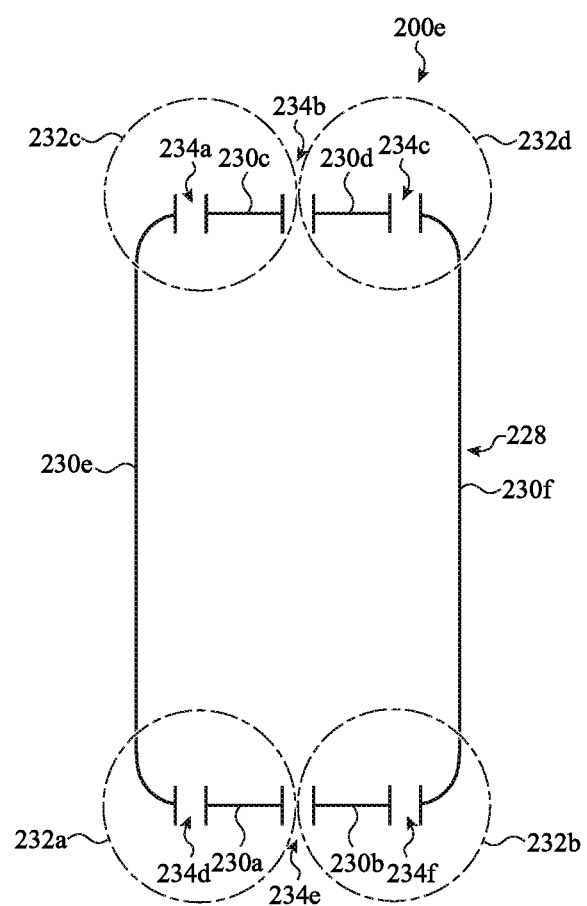

FIG. 2E shows a sidewall configuration 200e for a device (e.g., the device 100). The sidewall 228 includes six housing segments 230. The housing segments 230 may include a first housing segment 230a positioned near a first corner 232a of the sidewall 228, a second housing segment 230b positioned near a second corner 232b of the sidewall 228, a third housing segment 230c positioned near a third corner 232s of the sidewall 228, a fourth housing segment 230d positioned near a fourth corner 232d of the sidewall 228, a fifth housing segment 230e defining a first edge of the sidewall 228 and disposed between the first and third corners 232a, 232c, and a sixth housing segment 230f defining a second edge of the sidewall 228 and disposed between the second and fourth corners 232b, 232d.

Housing segments 230 that terminate in adjacent ends along the sidewall 228 may be structurally coupled to one another by a set of one or more non-conductive housing components 234 (e.g., non-conductive housing components, 234a, 234b, 234c, 234d, 234e, and 2340 that partially or completely fill gaps between adjacent ends of housing segments 230 about the sidewall 228. The sidewall 228 shown in FIG. 2E has six such gaps. At least one non-conductive housing component 234 in the set of non-conductive housing components 234 may define a portion (e.g., a segment) of an exterior surface of the sidewall 228 (and also an exterior surface of the housing that includes the sidewall 228). In some embodiments, the non-conductive housing components 234 may be variously configured and positioned, or formed of various materials, as described with reference to FIGS. 1A-1C.

The sidewall 228 and housing segments 230 may be formed, structurally coupled, and electrically insulated similarly to the sidewall 114 and housing segments 112 described with reference to FIG. 2A.

In each of the sidewall configurations 200a-e described with reference to FIGS. 2A-2E, housing segments 112, 204, 212, 220, or 230 that are configured to be operated as primary antennas for a device may be positioned at the corners or top and bottom edges of a device's sidewall 114, 202, 210, 218, or 228. Such a placement of antennas may be useful in that the antennas are positioned away from the sidewall edges that would normally be gripped by a user of a device that includes the sidewall. Housing segments 112, 204, 212, 220, or 230 that are configured to be operated in pairs, in a same wireless frequency band, may be positioned at opposite corners or opposite extents of the sidewalls 114, 202, 210, 218, or 228.

Figure 3A:
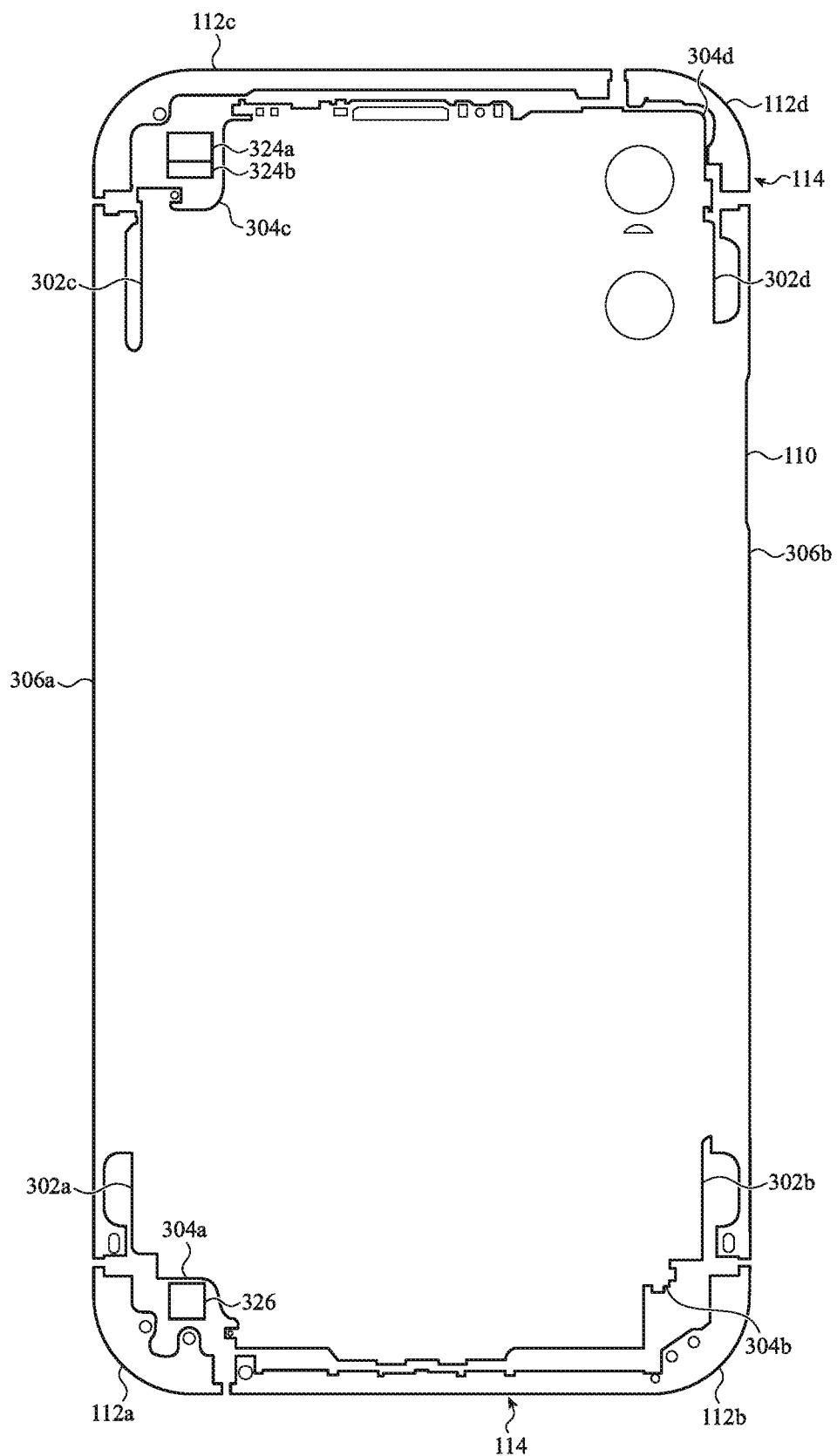
FIGS. 3A-3C show example implementations of the first, second, third, and fourth housing segments described with reference to FIGS. 1A-1C & 2A, and show example positions of the housing segments with respect to a support plate.
Figure 3B:
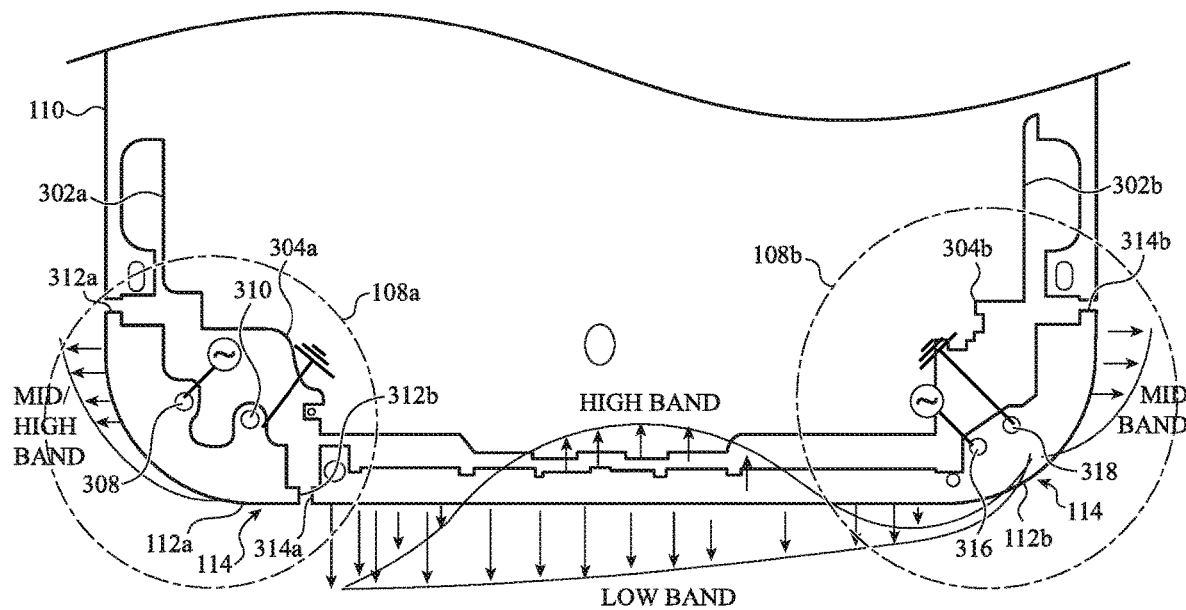
Figure 3C:
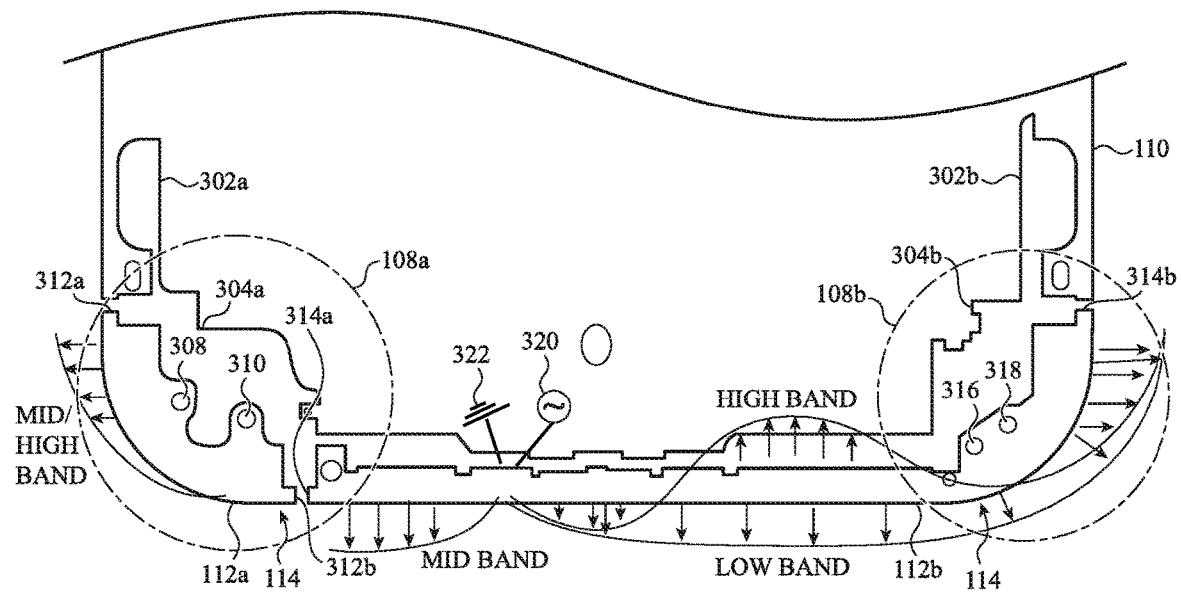

FIGS. 3A-3C show example implementations of the first, second, third, and fourth housing segments 112a, 112b, 112c, and 112d described with reference to FIGS. 1A-1C & 2A, and show example positions of the housing segments 112 with respect to a support plate 110. The housing segments 112 and support plate 110 may be examples of the housing segments and support plate described with reference to FIGS. 1A-1C & 2A.

Each of the housing segments 112 shown defines a rounded corner 108 of a housing sidewall 114. In alternative embodiments, the corners 108 may be squared corners, tapered corners of an octagon, or corners have other rounded or tapered shapes.

As shown primarily with reference to FIG. 3A, the first, second, third, and fourth housing segments 112a, 112b, 112c, 112d may not overlap the support plate 110, and may be electrically insulated from the support plate 110. A set of one or more non-conductive housing components (not shown in FIG. 3A but shown in FIG. 4) may form a structural bridge or bridges between the support plate 110 and the housing segments 112, and in some cases may encapsulate portions of the support plate 110. As examples, the non-conductive housing component(s) may adhere to the support plate 110 or be adhesively bonded to the support plate 110. In some cases, the housing segments 112 may have interlock features that extend inward from the ends of the housing segments 112, toward the support plate 110 or an interior volume defined at least in part by the housing segments 112, as shown in later figures (e.g., FIGS. 5A-10C). The non-conductive housing component(s) may extend into, through, or around such interlock features, such that the non-conductive housing component(s) may better hold, grab or retain the housing segments 112. Having a separation between the housing segments 112 and the support plate 110 can allow the housing segments 112 to resonate more freely when operated as antennas. The support plate 110 may be separated from some housing segments 112 (or some portions of housing segments 112) more than from other housing segments 112 (or other portions of housing segments 112). In alternative embodiments, the support plate 110 may extend under one or more of the housing segments 112 but be electrically insulated from the housing segments 112, or the support plate 110 may be grounded to one or more of the housing segments 112 at selected points (e.g., at a ground connection, such as the ground connection described 226 with reference to FIG. 2D).

In some embodiments, the housing segments 112e, 112f disposed along the long sides of the device 100 described with reference to FIGS. 1A-1C may be conductive, and may be welded or otherwise structurally and electrically coupled to the left and right sides 306a, 306b (e.g., the long sides) of the support plate 110. In other embodiments, the housing segments 112e, 112f may be conductive, and may be integrally formed as extensions of the support plate 110 (e.g., in a pan configuration). In still other embodiments, the housing segments 112e, 112f may be non-conductive, and may be formed as extensions of the non-conductive housing component that structurally couples the first, second, third, and fourth housing segments 112a, 112b, 112c, 112d. In the latter embodiments, the support plate 110 may also be non-conductive, and may be part of a monolithic component that structurally couples the housing segments 112.

As also shown in FIG. 3A, the support plate 110 may define portions (e.g., antenna portions) or entireties of one or more slot antenna features 302 (e.g., slot antenna features 302a, 302b, 302c, and 302d). By way of example, a slot antenna feature 302 is shown near each of the four main corners 304 (e.g., corners 304a, 304b, 304c, and 304d) of the support plate 110. A fifth housing segment may be coupled to the left side 306a of the support plate 110 (i.e., the left edge as shown in FIG. 3A) and define further portions (e.g., further antenna portions) of the slot antenna feature 302a or 302c. Similarly, a sixth housing segment may be coupled to the right side 306b of the support plate 110 and define further portions (e.g., further antenna portions) of the right-side slot antenna feature 302b or 302d. In some embodiments, the fifth housing segment may be electrically connected to, or disconnected from, the first or third housing segment 112a or 112c, thereby adding the left-side slot antenna feature 302a or 302c to the first or third housing segment 112a or 112c and enabling an antenna including the first or third housing segment 112a or 112c to resonate in a different wireless frequency band. In some embodiments, the sixth housing segment may be electrically connected to, or disconnected from, the second or fourth housing segment 112b or 112d, thereby adding the right-side slot antenna feature 302b or 302d to the second or fourth housing segment 112b or 112d and enabling an antenna including the second or fourth housing segment 112b or 112d to resonate in a different wireless frequency band, such as the B42 wireless frequency band. In some cases the fifth and sixth housing segments may be welded (e.g., spot welded or laser welded) to the support plate 110 along the left and right sides 306a, 306b of the support plate 110.

In some embodiments, the support plate 110 or housing segments 112 may additionally or alternatively define all or portions of other antenna tuning features, FIG. 3A further shows potential locations of antennas 324, 326 that may be housed within the interior volume defined by the housing segments 112. In some embodiments, the interior antennas 324, 326 may be positioned at or near the corners defined by the first and third housing segments 112a, 112c. In other embodiments, the interior antennas 324, 326 may be positioned elsewhere. In some embodiments, the interior antennas 324, 326 may be used in combination with antennas incorporating the second and fourth housing segments 112b, 112d to operate in the B42 wireless frequency band. The interior antennas 324, 326 may be positioned near the left side of the sidewall 114 to provide good separation (and decoupling) from the antennas incorporating the second and fourth housing segments 112b, 112d.

In some embodiments, different portions 324a, 324b of the interior antenna 324 may be operated as different antennas to facilitate wireless communication in one or more wireless communication modes, in one or more wireless frequency bands.

FIGS. 3B & 3C show example locations of feed and ground connectors to the housing segments 112a and 112b, which feed and ground connectors enable the housing segments 112a, 112b to be operated as antennas. The locations of feed and ground connectors described with reference to FIGS. 3B & 3C can be replicated for the third and fourth housing segments 112c, 112d, or feed and ground connectors for the third and fourth housing segments 112c, 112d may be located in alternate locations.

As shown in FIG. 3B, feed and ground connectors 308, 310 for the first housing segment 112a may be located interior to the sidewall 114, on opposite sides of the first corner 108a. In the embodiment shown, the feed connector 308 may be located more toward the apex of the first corner 108a than the leftmost end 312a of the first housing segment 112a. The ground connector 310 may be located more toward the rightmost end 312b of the first housing segment 112a. Alternatively, the locations of the feed connector 308 and ground connector 310 may be swapped, with the feed connector 308 being located more toward the rightmost end 312b of the first housing segment 112a. The arrangement shown in FIG. 3B may be advantageous in that the ground connector 310, along with the gap between adjacent ends 312b, 314a of the first and second housing segments 112a, 112b, helps define a demarcation point between the antennas provided by the first and second housing segments 112a, 112b. The arrangement shown also enables a switchable coupling of the fifth housing segment and slot antenna feature 302a to the first housing segment 112a, to extend the length of the resonate portion of an antenna including the first housing segment 112a.

As also shown in FIG. 3B, feed and ground connectors 316, 318 for the second housing segment 112b may be located interior to the sidewall 114 near the second corner 108b. In the embodiment shown, the ground connector 318 may be located closer to the rightmost end 314b of the second housing segment 112b than the feed connector 315. Alternatively, the feed and ground connectors 316, 318 may be swapped, with the feed connector 316 being located more toward the rightmost end 314b of the second housing segment 112b. The arrangement shown in FIG. 3B enables a switchable coupling of the sixth housing segment and slot antenna feature 302b to the second housing segment 112b, to extend the length of the resonate portion of an antenna including the second housing segment 112b.

As shown, the resonate portion of the first housing segment 112a may resonate within frequencies of the mid and high bands described with reference to FIG. 19. The second housing segment 112b may have two resonate portions, with the leftmost resonate portion resonating within frequencies of the low and high wireless frequency bands described with reference to FIG. 19, and the rightmost resonant portion resonating within frequencies of the mid wireless frequency band described with reference to FIG. 19. The lengths of the arrows extending from the housing segments 112a, 112b represent the relative voltages along the housing segments 112a, 112b. Longer length arrows indicate increased voltage and areas of better antenna efficiency in various wireless frequency bands. As shown, the portions of the first and second housing segments 112a, 112b with highest efficiency are at various ends of the housing segments 112a, 112b. To achieve maximum possible efficiencies, it is therefore desirable to electrically insulate these ends (e.g., ends 312a, 312b, 314a, and 314b) from surrounding conductors, and to decouple (e.g., lower the capacitance of) these ends 312a, 312b, 314a, 314b with respect to surrounding conductors.

The antenna configuration described with reference to FIG. 3B provides good separation between the portions of the first and second housing segments 112a, 112b that resonate within the mid wireless frequency band. FIG. 3C shows alternative locations of feed and ground connectors 320, 322 for the second housing segment 112b. The alternative feed and ground connectors 320, 322 are located approximately in the middle of the lower edge of the sidewall 114 (and in some cases, somewhat closer to the first corner 108a, as shown). The feed connector 320 may be located closer to the second corner 108b, and the ground connector 322 may be located closer to the first corner 108a. This alternative configuration for feed and ground connectors 320, 322 of the second housing segment 112b may provide good or better low and high wireless frequency band efficiency, but may increase the likelihood of coupling between the portions of the housing segments 112a, 112b that resonate in the mid wireless frequency band, absent good electrical insulation between the adjacent ends 312b, 314a of the first and second housing segments 112a, 112b. In some embodiments, wireless communication circuitry may switchably connect the second housing segment 112b to the feed and ground connectors 316, 318 described with reference to FIG. 3B, or to the feed and ground connectors 320, 322 described with reference to FIG. 3C. One or the other set of connectors may be used as necessary in response to particular trigger conditions to improve antenna efficiency or other parameters.

Figure 4:
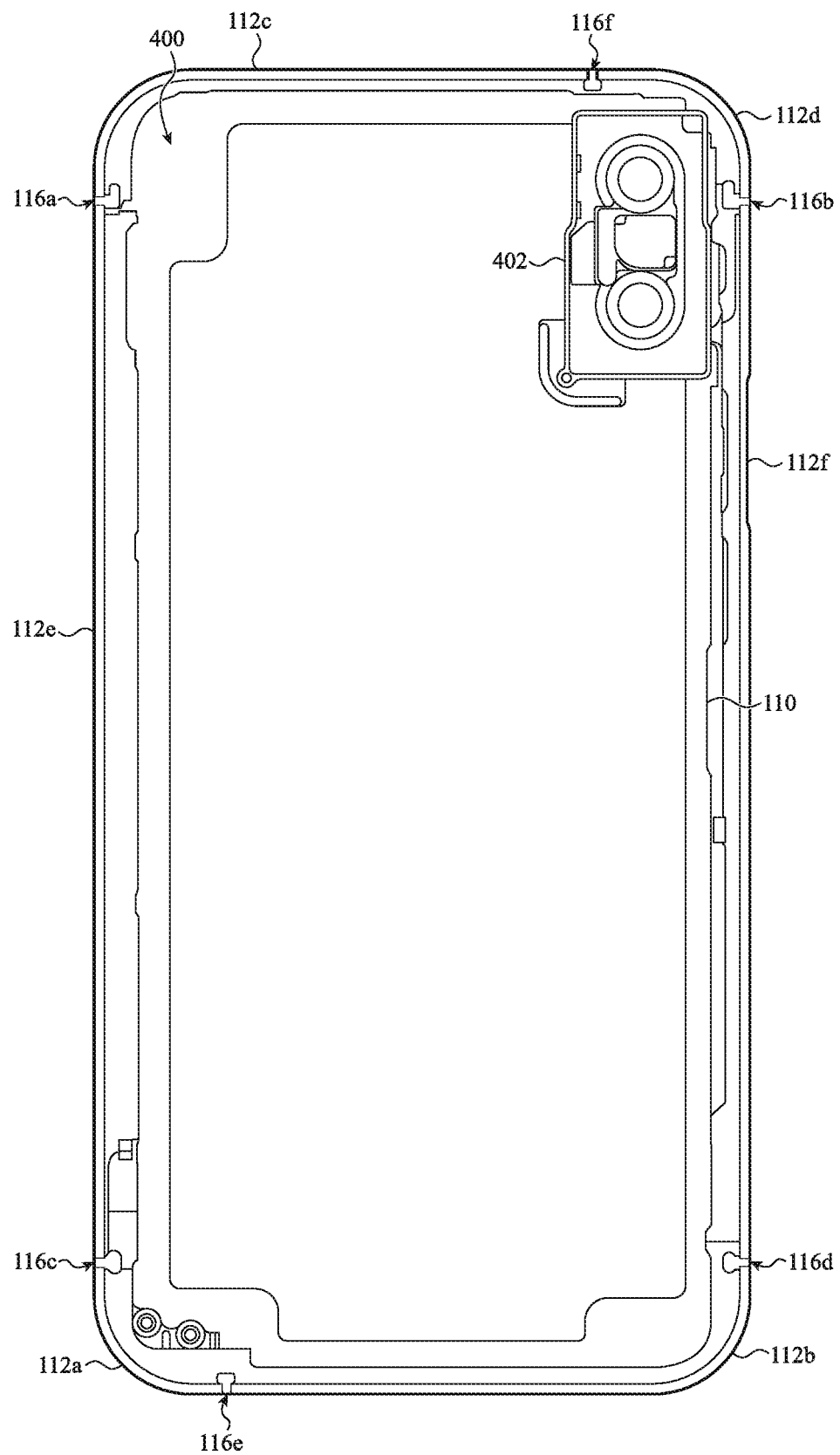
FIG. 4 shows each of the first, second, third, fourth, fifth, and sixth housing segments described with reference to FIGS. 1A-1C & 2A in relation to the support plate described with reference to FIGS. 3A-3C, and a non-conductive housing component that structurally couples the housing segments to each other and/or the support plate.

FIG. 4 shows each of the first, second, third, fourth, fifth, and sixth housing segments 112a, 112b, 112c, 112d, 112e, and 112f described with reference to FIGS. 1A-1C, 2A, & 3A-3C in relation to the support plate 110 described with reference to FIGS. 1C & 3A-3C. FIG. 4 also shows an example non-conductive housing component including a portion 400 that structurally couples the housing segments 112 to each other and/or the support plate 110. By way of example, the non-conductive housing component may include a first portion 400 (e.g., a fiber-filled polymer material) that structurally couples the housing segments 112 to each other and the support plate 110, and second portions 116 (e.g., a polymer material without fiber fill), that fills the outer portions of gaps between the housing segments 112 and forms portions of a smooth exterior surface of the sidewall 114. In some embodiments, the first portion 400 may at least partially encapsulate portions of the support plate 110. The second portions 116 of the non-conductive housing component may be color-matched (or not color-matched) to the exterior surfaces of the housing segments 112. Alternatively, the non-conductive housing component may include a single portion that both structurally couples the housing segments 112 to each other and the support plate 110, and forms portions of the exterior surface of the sidewall 114.

FIG. 4 also shows a camera brace 402 that is structurally coupled to the upper right corner of the support plate 110. When the support plate 110 and camera brace 402 are metallic, the camera brace 402 may be welded to the support plate 110 for strength and to provide an electrical coupling between the support plate 110 and camera brace 402. The electrical coupling may enable the support plate 110 and camera brace 402 to be coupled to a common ground, which may improve the performance of the housing segments 112 when the housing segments 112 are operated as antennas. The camera brace 402 may provide a housing for one or more camera modules, such as one or more rear-facing camera modules (i.e., cameras with a field of view extending from the rear or non-display side of a device).

Turning now to FIGS. 5A-10C, there are shown several interior views of example implementations of the housing segments 112 described with reference to FIGS. 1A-1C, 2A, 3A-3C, & 4. The various views show example details of interlock features defined by the housing segments 112. In particular, the various views show example details of the interlock features that extend from adjacent ends of respective adjacent housing segments 112 around the sidewall 114 (e.g., details of the interlock features that extend from adjacent ends of respective adjacent conductive housing segments, which adjacent conductive housing segments are separated by a non-conductive housing component). As shown in the figures, the interlock features may extend into an interior volume of a device. The "A" views in FIGS. 5A-10C provide isometric views of the interlock features that extend from adjacent ends of adjacent housing segments 112. The "B" and "C" views illustrate respective cross-sections of the two different interlock features shown in the corresponding "A" view, with various holes in the interlock features filled by a non-conductive housing component that structurally couples the two adjacent housing segments 112 shown in the "A" view. The various housing segments 112, interlock features, sub-features thereof, and techniques for forming the housing segments 112, interlock features, and sub-features thereof, as described in FIGS. 5A-10C, may be applied to join various of the housing segments described with reference to FIGS. 1A-4, as will be understood by a person of ordinary skill in the art after reading this disclosure.

Figure 5A:
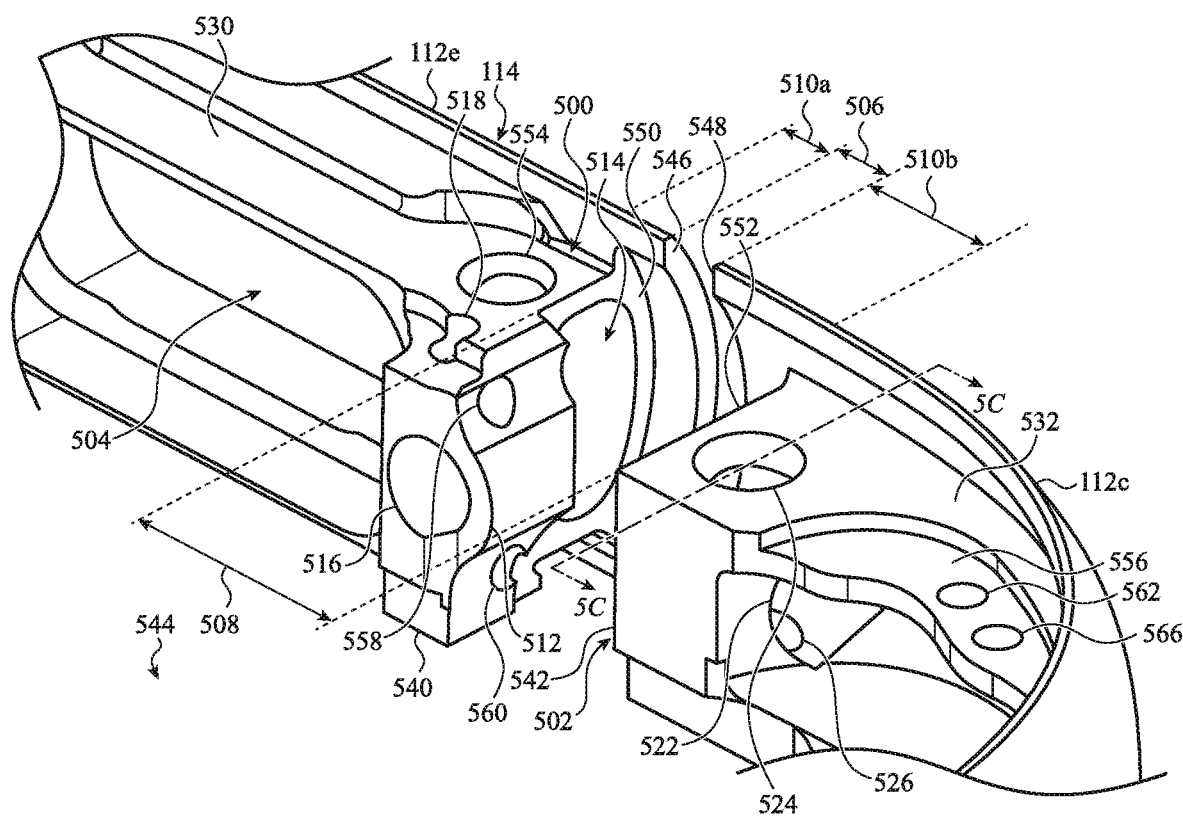
FIGS. 5A-10C show several interior views of example implementations of the housing segments described with reference to FIGS. 2A, 3A-3C, & 4.
Figure 5B:
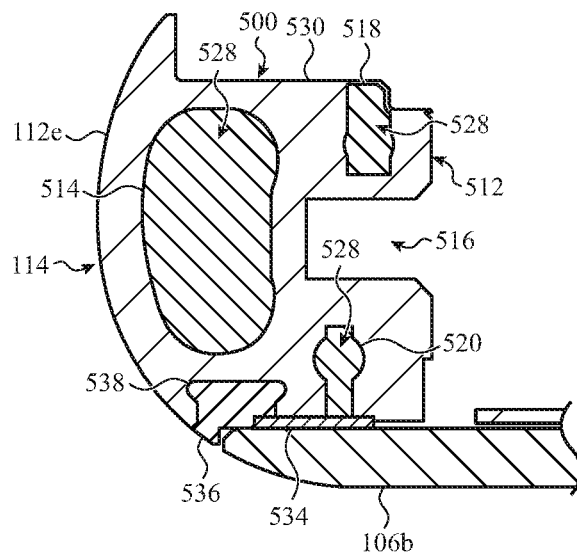
Figure 5C:
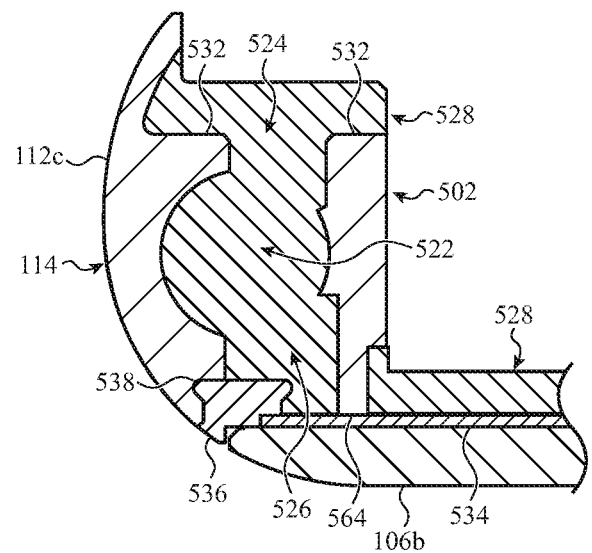

FIGS. 5A-5C show examples of interlock features 500, 502 that extend into an interior volume 544 defined at least partly by the sidewall 114. The interlock features 500, 502 may extend inward, into the interior volume 544, from adjacent ends of the fifth and third housing segments 112e, 112c described with reference to FIGS. 1A-1C, 2A, 3A-3C, & 4. A portion of the fifth housing segment 112e is shown on the left, and a portion of the third housing segment 112c is shown on the right. As previously described, the fifth and third housing segments 112e, 112c may be separated by a gap along the sidewall 114 that is filled by a non-conductive housing component. In some embodiments, each of the gaps defined between adjacent ends of adjacent housing segments 112 about the sidewall 114 may have the same dimensions. In other embodiments, the gaps may have different dimensions. To provide good structural rigidity, the gaps may have a relatively small width about the sidewall 114. However, when the housing segments 112 are configured to be operated as antennas, and where possible, it may be desirable to increase the widths of the gaps interior to an exterior surface of the sidewall 114. The increased separation may decrease the capacitance between adjacent housing segments 112 and reduce the likelihood that the adjacent housing segments 112 couple to one another and interfere with the resonance of, or decrease the efficiency of, the housing segments 112 (e.g., when the housing segments 112 are operated as antennas).

A first interlock feature 500 may include a first protrusion 540 that extends inward from an end of the fifth housing segment 112e, into the interior volume 544. A second interlock feature 502 may include a second protrusion 542 that extends inward from an end of the third housing segment 112b, into the interior volume 544. The first interlock feature 500 feature may be located near a button that protrudes through a cavity 504 in the fifth housing segment 112e and is operable from the exterior of a device including the fifth and third housing segments 112e, 112c. Because of the button, the first interlock feature 500 may be somewhat thinner than the second interlock feature 502.

As shown, the interlock features 500, 502 and their protrusions 540, 542 may be integrally defined by (e.g., molded with or machined into) the fifth and third housing segments 112e, 112c respectively. Alternatively, the interlock features 500, 502 and their protrusions 540, 542 may be structurally coupled to the fifth and third housing segments 112e, 112c in other ways, such as by welds or fasteners. Each of the interlock features 500, 502 and protrusions 540, 542 may be set slightly back from a gap along the sidewall (i.e., an exterior or sidewall gap 506) to form an interior gap 508 between the housing segments 112e, 112c that has a greater width than the exterior gap 506. For example, a first end surface 546 of the fifth housing segment 112e may be positioned opposite a second end surface 548 of the third housing segment 112c to define the exterior gap 506. The first interlock feature 500 may have a first interlock surface 550 positioned opposite a second interlock surface 552 of the second interlock feature 502 to define the interior gap 508. The first interlock surface 550 may be defined by the first protrusion 540, and the second interlock surface 552 may be defined by the second protrusion 542. The exterior gap 506 may have a first gap width, and the interior gap 508 may have a second gap width. In some embodiments, and as shown in FIG. 5A, the second gap width may be greater than the first gap width. By way of example, the entirety of the second interlock feature 502 may be set back from the exterior gap 506 by an offset 510b, whereas an outermost portion of the first interlock feature 500 may be set back from the exterior gap 506 by an offset 510a, and an innermost portion of the first interlock feature 500 may widen into the interior gap 508 (e.g., part of the first interlock feature 500 may overlap the offset 510a). This widening can increase the structural rigidity of the first interlock feature 500 given its overall narrow width, and/or can provide material for forming a boss protrusion 512 (e.g., a screw boss).

A number of through holes or blind holes (also referred to as openings or recesses at times herein) may be formed in each of the interlock features 500, 502 to enable a non-conductive housing component to extend into, through, or around the interlock features 500, 502 (thereby increasing the strength of the structural coupling between the fifth housing segment 112e, the non-conductive housing component, and the third housing segment 112c). With reference to FIGS. 5A & 5B, a first hole 514 (e.g., a blind hole) may extend into the first interlock surface 550 of the first interlock feature 500. In some embodiments, the first hole 514 may be end-milled or drilled into the first interlock surface 550. In some embodiments, the first hole 514 may be a blind hole so that a metal wall extends from the exterior surface of the sidewall 114 to the innermost point of the first interlock feature 500 (i.e., to the innermost point of the first interlock feature 500 with respect to the interior volume 544). Making the first hole 514 a blind hole can maintain separation between the first hole 514 and the button cavity 504, which in some cases may be open to the exterior of a device. This can enable the button cavity 504 to be sealed separately from the first hole 514 and tends to decrease the likelihood that moisture or contaminants will enter into the gap between the fifth and third housing segments 112e, 112c via the cavity 504.

In some embodiments, the first hole 514 may have a portion with a shape or contour that corresponds to a shape or contour of the exterior surface of the sidewall 114, thereby defining a wall or wall portion between the first hole 514 and the exterior surface of the sidewall 114 that has a substantially uniform thickness (see FIG. 5C). This can enable more non-conductive material to extend into the first interlock feature 500 while maintaining the structural rigidity of the sidewall 114. In some embodiments, all portions of the wall surrounding the first hole 514 may have a substantially uniform thickness. When the exterior surface of the sidewall 114 has a curved contour, the first hole 514 may in some cases be kidney-shaped.

The first hole 514 may be end-milled so that it has a smooth wall. This can be important when a device is dropped, in that a drop of a device can cause sharp features to function as knives or chisels that tend to crack non-conductive housing components such as the non-conductive housing component that extends into the first interlock feature 500. Interlock features that are thinner (such as the first interlock feature 500) may be more susceptible to such cracking. In alternative embodiments, the first hole 514 may be drilled, or may not be kidney-shaped, or may be a through hole.

With further reference to FIG. 5A, a second hole 554 may extend into an upper surface 530 of the first interlock feature 500 or first protrusion 540. In some embodiments, the second hole 554 may be end-milled or drilled into the upper surface 530. The second hole 554 may be transverse to the first hole 514 and intersect the first hole 514 (i.e., the second hole 554 may be a transverse hole with respect to the first hole 514). The non-conductive housing component that structurally couples the fifth and third housing segments 112e, 112c may be insert molded into the first and second holes 514, 554, and in some cases may enter one of the holes and exit the other of the holes, thereby extending into the first interlock feature 500 in at least two orthogonal directions.

A boss protrusion 512 (e.g., a screw boss) for mounting a button assembly to the fifth housing segment 112e may be integrated with (e.g., molded or machined into) the first interlock feature 500 or first protrusion 540. However, the boss protrusion 512 may require extending the extent of the first interlock feature 500 into the gap 508 between the fifth and third housing segments 112e, 112c (e.g., the boss protrusion 512 may be offset from the first interlock surface 550 toward the first end surface 546). A threaded hole 516 may be tapped into or defined by the boss protrusion 512 as a blind hole, thereby increasing the structural rigidity of the first interlock feature 500 and boss protrusion 512 and enabling a separation of moisture sealing issues pertaining to the threaded hole 516 and other holes formed in the first interlock feature 500. Alternatively, the threaded hole 516 may be a through hole.

In addition to the first and second holes 514, 554, additional holes 518, 520, 558, 560 may be formed in the first interlock feature 500 or first protrusion 540, as shown in FIGS. 5A & 5B. The additional holes 518, 520, 558, 560 may provide additional surface area for the non-conductive housing component to hold or grab onto, retain, or conform to, thereby improving the strength of the structural coupling between the fifth and third housing segments 112e, 112c. In some embodiments, the additional holes 518, 520, 558, 560 may be drilled. In some embodiments, some of the additional holes 518, 520, 558, 560 may be blind holes and/or intersect. For example, the holes 518 and 558 may intersect, and the holes 520 and 560 may intersect. The intersecting holes may provide paths through which the material(s) of the non-conductive housing component may be molded. Forming the holes 518 and 520 as blind holes again enables a separation of moisture sealing issues, and may increase the structural rigidity of the first interlock feature 500. In alternative embodiments, one or more of the additional holes 518, 520, 558, 560 may be a through hole.

With reference to FIGS. 5A & 5C, a first hole 522 (e.g., a round through hole) may extend into the second interlock surface 552 of the second interlock feature 502. In some embodiments, the first hole 522 may be drilled or otherwise cut into the second interlock feature 502. The first hole 522 may be opposite to or substantially aligned with the first hole 514 in the first interlock feature 500 or protrusion 540. As defined herein substantially aligned holes or components are disposed along a common axis and may be fully aligned or partly aligned. In some embodiments, partly aligned holes or components may have cross-sections that overlap by at least 25%, or 50%, or even 75%. A second hole 524 (e.g., a round hole) may extend into an upper surface 562 of the second interlock feature 502 or second protrusion 542, and may be drilled into or otherwise cut into the upper surface 562. The second hole 524 may be transverse to the first hole 522 (e.g., the second hole 524 may be a first transverse hole that intersects the first hole 522 (e.g., perpendicularly)). A third hole 526 (e.g., a round hole) may extend into a lower surface 564 of the second interlock feature 502 or second protrusion 542 (see FIG. 5C), and may be drilled or otherwise cut into the lower surface 564. The third hole 526 may also be transverse to the first hole 522 (e.g., the third hole 526 may be a second transverse hole that intersects the first hole 522 (e.g., perpendicularly)). The second and third holes 524, 526 may have the same diameter or different diameters, and in some cases may be formed as a single through hole. In contrast to the first interlock feature 500, which extends into the interior gap 508, the second interlock feature 502 may not extend past the second interlock surface 552.

As shown in FIGS. 5B & 5C, a non-conductive housing component 528 may at least partially fill the first, second, and other holes formed in the first and second interlock features 500, 502, thereby structurally coupling the fifth housing segment 112e and the third housing segment 112c. In some cases, the non-conductive component 528 may at least partially fill each of the first, second, and additional holes 514, 554, 518, 520, 558, 560 in the first interlock feature 500, and the first, second, and third holes 522, 524, 526 in the second interlock feature 502. The non-conductive housing component 528 may not extend over the upper surface 530 of the first interlock feature 500, but may extend over the upper surface 532 of the second interlock feature 502. Surrounding as many surfaces of the interlock features 500, 502 as possible with the material(s) of the non-conductive housing component 528 may tend to increase the strength of the structural coupling between the interlock features 500, 502 and the non-conductive housing component 528. In some embodiments, a shelf or shelves may be cut into the upper surfaces of the fifth and third housing segments 112e, 112c or first and second interlock features 500, 502. For example, a shelf 556 may be cute into the upper surface 532 of the second interlock feature. The shelves, including the shelf 556 may serve various purposes. For example, the shelves may reduce the capacitive coupling between a housing component 112 and another component, or the shelves may increase the surface area over which the non-conductive component 528 may adhere to a housing segment 112. In some embodiments, holes may be formed in an upper surface or shelf of a housing segment 112 to enable the non-conductive component 528 to extend into and through portions of a housing segment 112 away from an interlock feature. For example, holes 562, 566 may be cut into the shelf 556.

In some embodiments, a front cover (e.g., the front cover 106a described with reference to FIGS. 1A-1C) may be bonded to upper surfaces of the first and second interlock features 500, 502 or housing segments 112e, 112c, or upper surfaces of the non-conductive housing component 528 (e.g., as shown in FIG. 5C, where the non-conductive housing component 528 extends over the upper surface 532 of the second interlock feature 502). In some embodiments, a rear cover (e.g., the rear cover 106b described with reference to FIGS. 1A-1C) may be bonded to lower surfaces of the first and second interlock features 500, 502 or housing segments 112e, 112c by an adhesive 534 (see FIGS. 5B & 5C). A seal 536 may be inserted into a groove 538 formed in a lower surface of each housing segment 112e, 112c and extending along the sidewall 114. The seal 536 and adhesive 534 may help prevent moisture from entering a device between the housing segments 112e, 112c and rear cover 106b.

In some embodiments, the non-conductive housing component 528 may be formed by a polymer material having a fiber fill, and the polymer material may at least partially fill various holes in the first and second interlock features in addition to forming an exterior surface of the sidewall 114 (e.g., a portion of the sidewall 114 that bridges or fills the exterior gap 506). In other embodiments, the non-conductive housing component 528 may include a first portion formed from a first polymer material and a second portion formed from a second polymer material. The first polymer material may have a fiber fill and at least partially fill various holes in the first and second interlock features. The second polymer material may be different from the first polymer material and form an exterior surface of the sidewall 114 (e.g., a portion of the sidewall 114 that bridges or fills the exterior gap 506). Each polymer having a fiber fill may have a fiber fill including glass or other types of fibers. In some embodiments, the second polymer material may also have a fiber fill, but have a fiber fill that differs from the fiber fill of the first polymer material.

The structures of the first and second interlock features 500, 502, and more generally all of the interlock features described herein, may be configured to reduce strain on the housing segments 112 and non-conductive housing component in bending modes induced by a device drop.

Figure 6A:
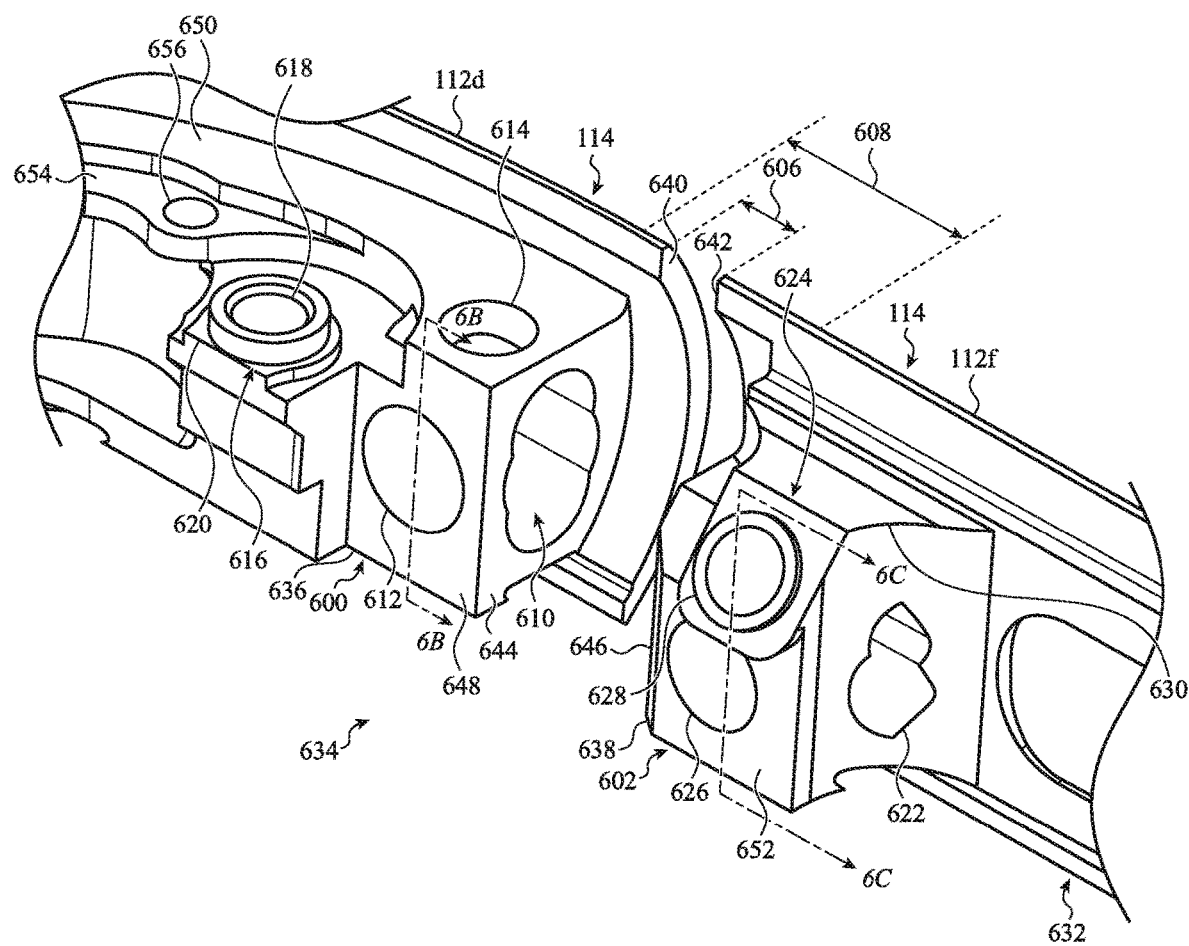
Figure 6B:
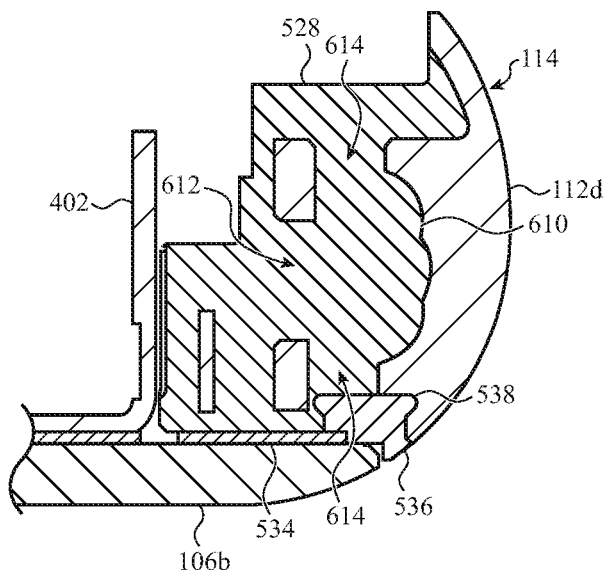
Figure 6C:
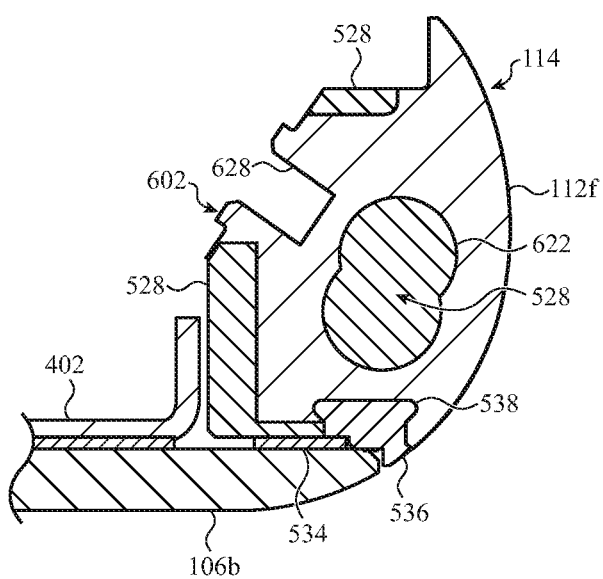

FIGS. 6A-6C show examples of the interlock features 600, 602 that extend into an interior volume 634 defined at least partly by the sidewall 114. The interlock features 600, 602 may extend inward, into the interior volume 634, from adjacent ends of the fourth and sixth housing segments 112d, 112f described with reference to FIGS. 1A-1C, 2A, 3A-3C, & 4. A portion of the fourth housing segment 112d is shown on the left, and a portion of the sixth housing segment 112f is shown on the right. As previously described, the fourth and sixth housing segments 112d, 112f may be separated by a gap along the sidewall 114 that is filled by a non-conductive housing component. The non-conductive housing component may be part of the same non-conductive housing component that structurally couples the housing segments 112 described with reference to FIGS. 5A-5C, or a different non-conductive housing component.

A first interlock feature 600 may include a first protrusion 636 that extends inward from an end of the fourth housing segment 112d, into the interior volume 634. A second interlock feature 602 may include a second protrusion 638 that extends inward from an end of the sixth housing segment 112f, into the interior volume 634. Each of the first and second interlock features 600, 602 may be located between the camera brace 402 described with reference to FIG. 4 and the sidewall 114 formed by the fourth and sixth housing segments 112d, 112f. Because of the camera brace 402 (or other components), the first and second interlock features 600, 602 may be somewhat shallower than other interlock features (i.e., they may extend inward from the sidewall 114 to a lesser extent).

As shown, the interlock features 600, 602 and their protrusions 636, 638 may be integrally defined by (e.g., molded with or machined into) the fourth and sixth housing segments 112d, 112f respectively. Alternatively, the interlock features 600, 602 and their protrusions 636, 638 may be structurally coupled to the fourth and sixth housing segments 112d, 112f in other ways, such as by welds or fasteners. Each of the interlock features 600, 602 and protrusions 636, 638 may be set slightly back from a gap along the sidewall 114 (i.e., an exterior or sidewall gap 606) to form an interior gap 608 between the housing segments 112d, 112f that has a greater width than the exterior gap 606. For example, a first end surface 640 of the fourth housing segment 112d may be positioned opposite a second end surface 642 of the sixth housing segment 112f to define the exterior gap 606. The first interlock feature 600 may have a first interlock surface 644 positioned opposite a second interlock surface 646 of the second interlock feature 602 to define the interior gap 608. The first interlock surface 644 may be defined by the first protrusion 636, and the second interlock surface 646 may be defined by the second protrusion 638. The exterior gap 606 may have a first gap width, and the interior gap 608 may have a second gap width. In some embodiments, and as shown in FIG. 6A, the second gap width may be greater than the first gap width. By way of example, the first interlock feature 600 may be set back from the exterior gap 606 by a first offset, and the second interlock feature 602 may be set back from the exterior gap 606 by a second offset.

A number of holes may be formed in each of the interlock features 600, 602 to enable a non-conductive housing component to extend into, through, or around the interlock features 600, 602 (thereby increasing the strength of the structural coupling between the fourth housing segment 112d, the non-conductive housing component, and the sixth housing segment 112f). With reference to FIGS. 6A & 6B, a first hole 610 (e.g., a blind hole) may extend into the first interlock surface 644 of the first interlock feature 600. In some embodiments, the first hole 610 may be formed by a set of multiple partially overlapping drill holes. Drilling multiple partially overlapping holes may save cost over forming the first hole 610 using an end mill. In some embodiments, the partially overlapping holes may be drilled close enough to reduce the ridges where holes overlap and thereby reduce the tendency of the ridges to operate as knives or chisels when a device is dropped. In alternative embodiments, the first hole 610 may be formed by an end mill or other means. The first hole 610 may have an out-of-round shape that enables it to have a greater diameter perpendicular to the front (display) and rear surfaces of a device while having a smaller diameter extending transverse to the sidewall 114. The importance of a smooth wall, as discussed with reference to the first hole 514 shown in FIGS. 5A & 5B, may be less important given the increased width of the first interlock feature 600 shown in FIGS. 6A & 6B.

Additional holes 612, 614 may also be formed in the first interlock feature 600 or protrusion 636. The additional holes 612, 614 may be transverse to the first hole 610, and in some cases, first, second, and third intersecting holes 610, 612, and 614 may be oriented along respective x, y, and z axes. This may enable a non-conductive housing component to extend into and through the first interlock feature 600 along three axes, which can strengthen the structural coupling between the non-conductive housing component and the first interlock feature 600. The second hole 612 may extend into an interior surface 648 of the first interlock feature 600 or protrusion 636, and may be a blind hole given that it extends toward the sidewall 114. The third hole 614 may extend into an upper surface 650 of the first interlock feature 600 or protrusion 636, and may be a through hole extending perpendicular to the front and rear surfaces of a device. As shown, the first interlock surface 644, interior surface 648, and upper surface 650 may be orthogonal surfaces.

A boss protrusion 616 (e.g., a screw boss), which in some cases may serve as an antenna feed connector to which a flex circuit may be coupled, may be machined into or structurally coupled to the fourth antenna segment 112d adjacent the first interlock feature 600. The boss protrusion 616 may be tapped with or otherwise define a threaded hole 618 that extends perpendicular to the front and rear surfaces of a device. In some embodiments, the boss protrusion 616, or boss protrusion 616 in combination with the threaded hole 618, may be formed using a hole cutter (e.g., a computer numerical control (CNC) hole cutter). The hole cutter may form the boss protrusion 616, as well as a trough, lip, or ledge 620 surrounding and recessed from an upper surface of the boss protrusion 616. The ledge 620 may enable non-conducive material(s) such as those of the non-conductive housing component that is used to structurally couple the first and second interlock features 600, 602, and/or a polyurethane applied as a seal between plastic and metal portions of the housing that includes the first and second interlock features 600, 602 and non-conductive housing component, to be applied around the boss protrusion 616 without extending over an upper surface of the boss protrusion 616. Stated differently, the ledge 620 enables non-conductive material(s) to be disposed around the boss protrusion 616 without compromising good electrical contact between a flex circuit or other element and the boss protrusion 616. In some cases, a non-conductive material may be applied around the boss protrusion 616, and then an upper portion of the boss protrusion 616 may be removed, or the upper surface of the boss protrusion 616 may be planed, to ensure that the upper surface of the boss protrusion 616 is free of any non-conductive material.

With reference to FIGS. 6A & 6C, a first hole 622 may extend into the second interlock surface 646 of the second interlock feature 602. The first hole 622 may be drilled or otherwise cut into the second interlock feature 602. The first hole 622 may be a conical hole (e.g., a hole formed using a conical drill bit). A conical drill bit enables the size of the hole 622 to have a larger diameter toward the second interlock surface 646, but a smaller diameter where the hole extends behind a boss protrusion 624. Similarly to how the first hole 610 in the first interlock feature 600 is formed, the first hole 622 in the second interlock feature 602 may be formed by drilling multiple partially overlapping holes with the conical drill bit. Alternatively, the first hole 622 may be formed by drilling a single conical hole, or multiple holes using a uniform diameter drill bit, or multiple holes using different drill bits (e.g., a conical drill bit in combination with a uniform diameter drill bit, or a set of drill bits having different uniform diameters). In some embodiments, the partially overlapping holes may be drilled close enough to reduce the ridges where holes overlap, thereby reducing the tendency of the ridges to operate as knives or chisels when a device is dropped. The first hole 622 may be a through hole, as shown, or a blind hole. A second hole 626 (e.g., a round hole) may extend into an inner surface 652 of the second interlock feature 602 or protrusion 638. The second hole 626 may be drilled or otherwise cut into the second interlock feature 602, and may be transverse to the first hole 622 (e.g., the second hole 626 may be a transverse hole that intersects the first hole 622 (e.g., perpendicularly)).

A boss protrusion 624, which in some cases may serve as a flex circuit connection point, may be machined in or structurally coupled to the sixth antenna segment 112f, and may be integrated with the second interlock feature 602 or protrusion 638. The boss protrusion 624 may have a surface that is angled (e.g., at a 30 degree angle, ±10%) with respect to an imaginary line extending perpendicular to the front and rear surfaces of a device. In alternative embodiments, the surface may be angled between 25 and 35 degrees, between 20 and 40 degrees, or between 0 and 90 degrees. The boss protrusion 624 may be angled so that a screw may be threaded into a threaded hole 628 within the boss protrusion 624 after the sixth housing segment 112f has been attached to a support plate 220 adjacent a camera brace 402, or so that the threaded hole 628 may be tapped after the sixth housing segment 112f is structurally coupled to the support plate 110 adjacent the camera brace 402. Examples of the support plate 110 and camera brace 402 are described with reference to FIG. 4. The boss protrusion 624 may also be angled to reduce the inward extension of the second interlock feature 602 or protrusion 638 from the sidewall 114, while also maintaining an upper surface 630 (of the second interlock feature 602) to which a device cover or other element may be mated or sealed. The angle of the angled surface of the boss protrusion 624 may be selected to balance inward extension of the second interlock feature 602 or protrusion 638 (or inward extension of the boss protrusion 624) and the area of the sealing surface 630. The boss protrusion 624 may be formed similarly to the boss protrusion 616 formed in the first interlock feature 600, but in some cases may have or define a threaded hole 628 with a shallower thread depth, so that the threaded hole 628 does not intersect the first hole 622 formed in the second interlock feature 602.

The second interlock feature 602 may form part of (or abut) an antenna tuning feature (e.g., a slot antenna feature 632 formed between the sixth housing segment 112f and a support plate to which the fourth and sixth housing segments 112d, 112f are structurally coupled). In some embodiments, the antenna tuning feature may be defined by a variable thickness of the sixth housing segment 112f along the sidewall 114. For example, the slot antenna feature 632 may extend from the second interlock feature 602 along the sixth housing segment 112f, and may be defined by a thinned portion of the sixth housing segment 112f. The wider portions of the sixth housing segment 112f, adjacent each end of the thinned portion, may taper into the thinned portion (e.g., with an arc or other profile), as shown, or there may be an abrupt transition (e.g., a step) from each wider portion to the thinned portion.

As shown in FIGS. 6B & 6C, a non-conductive housing component 528 may at least partially fill or extend into the first and second interlock features 600, 602. Surrounding as many surfaces of the interlock features 600, 602 as possible with the non-conductive material(s) of a non-conductive housing component 528 may tend to increase the strength of the structural coupling between the interlock features 600, 602 and the non-conductive housing component 528. In some embodiments, the non-conductive housing component 528 may extend into holes 610, 612, 614, 622, and 626.

In some embodiments, a shelf or shelves may be cut into the upper surfaces of the fourth and sixth housing segments 112d, 112f or first and second interlock features 600, 602. For example, a shelf 654 may be cut into the upper surface 650 of the first interlock feature 600. In some embodiments, holes may be formed in an upper surface or shelf of a housing segment 112 to enable the non-conductive component 528 to extend into and through portions of a housing segment 112 away from an interlock feature. For example, hole 656 may be cut into the shelf 654.

In some embodiments, a front cover (e.g., the front cover 106a described with reference to FIGS. 1A-1C) may be bonded to upper surfaces of the first and second interlock features 600, 602 or housing segments 112d, 112f, or upper surfaces of the non-conductive housing component 528 (e.g., as shown in FIGS. 6B & 6C, where the non-conductive housing component 528 extends over the upper surfaces of the first and second interlock features 600, 602). In some embodiments, a rear cover (e.g., the rear cover 106b described with reference to FIGS. 1A-1C) may be bonded to lower surfaces of the first and second interlock features 600, 602 by an adhesive 534. A seal 536 may be inserted into a groove 538 formed in a lower surface of each housing segment 112d, 112f and extending parallel to the sidewall 114. The seal 536 and adhesive 534 may help prevent moisture from entering a device between the housing segments 112d, 112f and rear cover 106b.

Figure 7A:
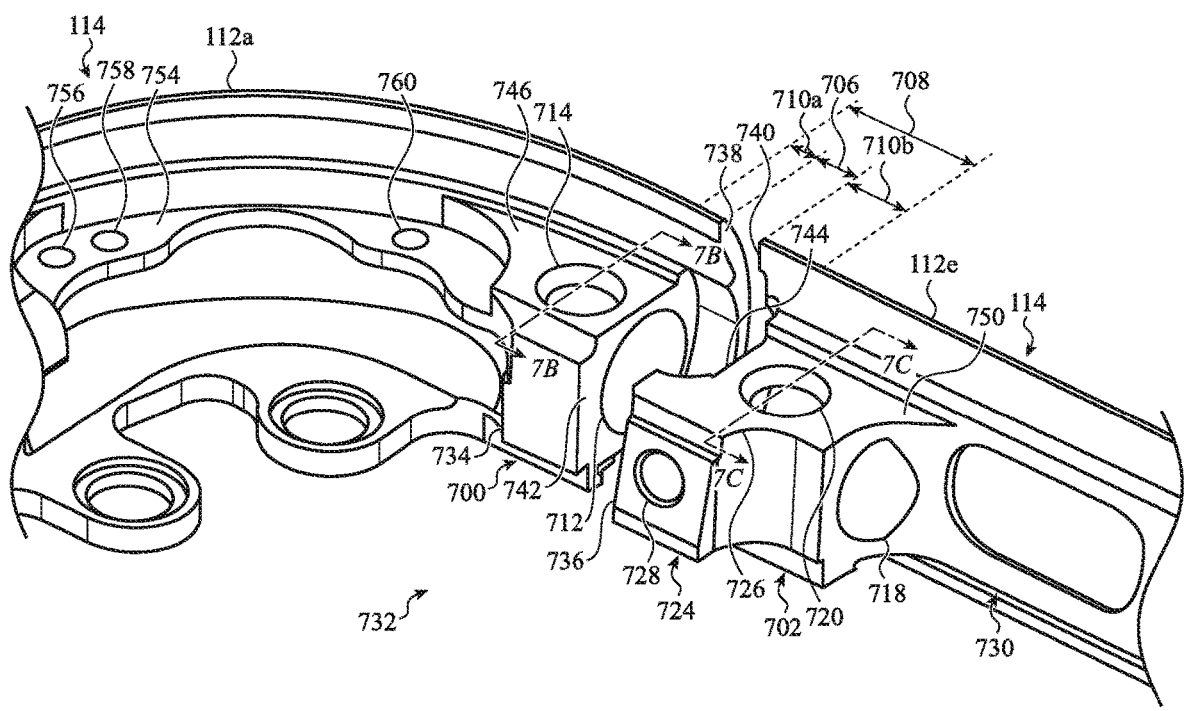
Figure 7B:
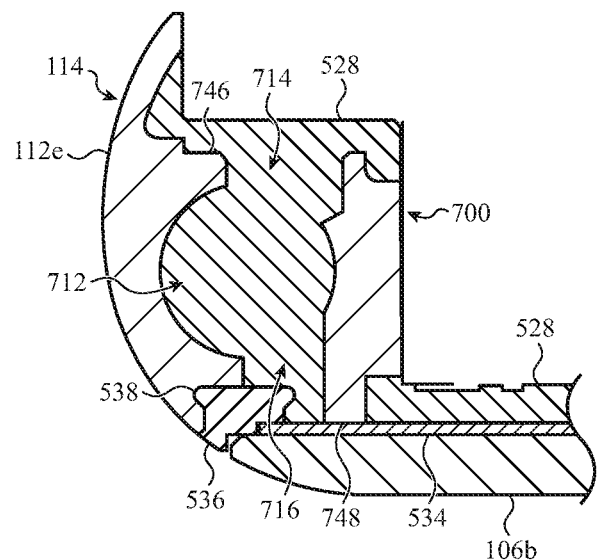
Figure 7C:
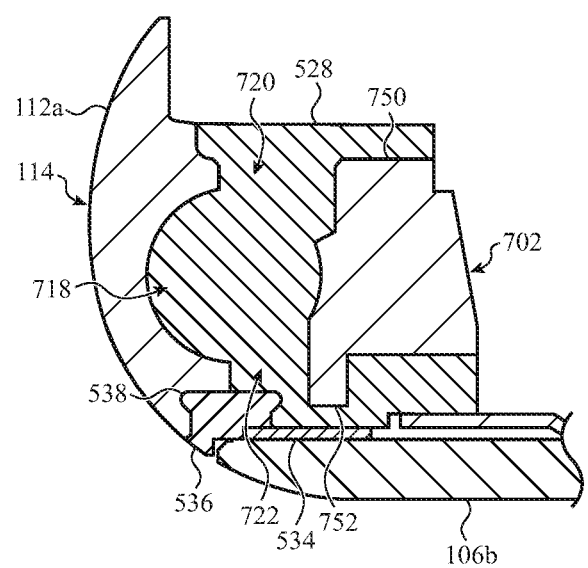

FIGS. 7A-7C show examples of the interlock features 700, 702 that extend into an interior volume 732 defined at least partly by the sidewall 114. The interlock features 700, 702 may extend inward, into the interior volume 732, from adjacent ends of the first and fifth housing segments 112a, 112e described with reference to FIGS. 1A-1C, 2A, 3A-3C, & 4. A portion of the first housing segment 112a is shown on the left, and a portion of the fifth housing segment 112e is shown on the right. As previously described, the first and fifth housing 112a, 112e segments may be separated by a gap along the sidewall 114 that is filled by a non-conductive housing component. The non-conductive housing component may be part of the same non-conductive housing component that structurally couples the housing segments 112 described with reference to FIGS. 5A-5C and/or 6A-6C, or a different non-conductive housing component.

A first interlock feature 700 may include a first protrusion 734 that extends inward from an end of the first housing segment 112a, into the interior volume 732. A second interlock feature 702 may include a second protrusion 736 that extends inward from an end of the fifth housing segment 112e, into the interior volume 732. As shown, the interlock features 700, 702 and their protrusions 734, 736 may be integrally defined by (e.g., molded with or machined into) the first and fifth housing segments 112a, 112e respectively. Alternatively, the interlock features 700, 702 and their protrusions 734, 736 may be structurally coupled to the first and fifth housing segments 112a, 112e in other ways, such as by welds or fasteners. Each of the interlock features 700, 702 and protrusions 734, 736 may be set slightly back from a gap along the sidewall 114 (i.e., an exterior or sidewall gap 706) to form an interior gap 708 between the housing segments 112a, 112e that has a greater width than the exterior gap 706. For example, a first end surface 738 of the first housing segment 112a may be positioned opposite a second end surface 740 of the fifth housing segment 112e to define the exterior gap 706. The first interlock feature 700 may have a first interlock surface 742 positioned opposite a second interlock surface 744 of the second interlock feature 702 to define the interior gap 708. The first interlock surface 742 may be defined by the first protrusion 734, and the second interlock surface 744 may be defined by the second protrusion 736. The exterior gap 706 may have a first gap width, and the interior gap 708 may have a second gap width. In some embodiments, and as shown in FIG. 7A, the second gap width may be greater than the first gap width.

By way of example, the entirety of the first interlock feature 700 may be set back from the exterior gap 706 by an offset 710a, whereas an outermost portion of the second interlock feature 702 may be set back from the exterior gap 706 by an offset 710b, and an innermost portion of the second interlock feature 702 may widen into the interior gap 708 (e.g., part of the second interlock feature 702 may overlap the offset 710b).

A number of holes may be formed in each of the interlock features 700, 702 to enable a non-conductive housing component to extend into, through, or around the interlock features 700, 702 (thereby increasing the strength of the structural coupling between the first housing segment 112a, the non-conductive housing component, and the fifth housing segment 112e). With reference to FIGS. 7A & 7B, a first hole 712 (e.g., a round through hole) may extend into the first interlock surface 742 of the first interlock feature 700. In some embodiments, the first hole 712 may be formed by drilling a single hole into the first interlock feature 700. Additional holes 714, 716 may also be formed in the first interlock feature 700, as shown in FIG. 7B. The additional holes 714, 716 may provide additional surface area for the non-conductive housing component to hold or grab onto, retain, or conform to, thereby improving the strength of the structural coupling between the first and fifth housing segments 112a, 112e. As an example, a second hole 714 (e.g., a round hole) may extend into an upper surface 746 of the first interlock feature 700 or protrusion 734. The second hole 714 may be drilled or otherwise cut into the first interlock feature 700, and may be transverse to (e.g., perpendicularly intersect) the first hole 712. A third hole 716 (e.g., a round hole) may extend into a lower surface 748 of the first interlock feature 700 or protrusion 734. The third hole 716 may be drilled or otherwise cut into the first interlock feature 700, and may be transverse to (e.g., perpendicularly intersect) the first hole 712. The second and third holes 714, 716 may have the same diameter or different diameters, and in some cases may be formed as a single through hole. The first interlock surface 742 of the first interlock feature 700 may be flat.

With reference to FIGS. 7A & 7C, a first hole 718 may extend into the second interlock surface 744 of the second interlock feature 702. In some embodiments, the first hole 718 may be drilled or otherwise cut into the second interlock feature 702. The first hole 718 may be formed as a through hole using a uniform diameter drill bit. A second hole 720 (e.g., a round hole) may extend into an upper surface 726 of the second interlock feature 702 or protrusion 734. In some embodiments, the second hole 720 may be drilled or otherwise cut into the second interlock feature 702, and may be transverse to (e.g., perpendicularly intersect) the first hole 718. A third hole 722 (e.g., a round hole) may extend into a lower surface 752 of the second interlock feature 702 or protrusion 736. In some embodiments, the third hole 722 may be drilled or otherwise cut into the second interlock feature 702, and may be transverse to (e.g., perpendicularly intersect) the first hole 718. The second and third holes 720, 722 may have the same diameter or different diameters, and in some cases may be formed as a single through hole.

A boss protrusion 724 (e.g., a screw boss), which in some cases may serve as a flex circuit connection point, may be machined into or structurally coupled to the fifth antenna segment 112e, and may be integrated with the second interlock feature 702. The boss protrusion 724 may have a surface that is angled (e.g., at a 10 degree angle, ±10%) with respect to an imaginary line extending perpendicular to the front and rear surfaces of a device. In alternative embodiments, the surface may be angled between 5 and 15 degrees, or between 0 (aligned with the imaginary line) and 20 degrees, or between 0 and 90 degrees. The boss protrusion 724 may be angled to reduce the inward extension of the second interlock feature 702 from the sidewall 114, while also maintaining an upper surface 726 (of the second interlock feature 702) to which a device cover or other element may be mated or sealed. The boss protrusion 724 may be formed similarly to the boss protrusions 616, 624 formed in the first and second interlock features 600, 602 described with reference to FIGS. 6A-6C. Alternatively, the boss protrusion 724 may be formed by a protruding piece of metal that is CNC'd off after non-conductive material(s) have been deposited into and around the first and second interlock features 700, 702. A threaded hole 728 may be tapped into the boss protrusion 724 after the protruding piece of metal is CNC'd off. CNC'ing off the piece of protruding metal after the non-conductive material(s) have been deposited may prevent the boss protrusion 724 from becoming buried in the non-conductive material(s). Similarly to the boss protrusion 624, the boss protrusion 724 may have a threaded hole 728 with a shallower thread depth, so that the threaded hole 728 does not intersect the first hole 718 formed in the second interlock feature 702.

The second interlock feature 702 may form part of (or abut) an antenna tuning feature (e.g., a slot antenna feature 730 formed between the fifth housing segment 112e and a support plate to which the first and fifth housing segments 112a, 112e are structurally coupled). In some embodiments, the antenna tuning feature may be defined by a variable thickness of the fifth housing segment 112e along the sidewall 114. For example, the slot antenna feature 730 may extend from the second interlock feature 702 along the fifth housing segment 112e, and may be defined by a thinned portion of the fifth housing segment 112e. The wider portions of the fifth housing segment 112e, adjacent each end of the thinned portion, may taper into the thinned portion (e.g., with an arc or other profile), as shown, or there may be an abrupt transition (e.g., a step) from each wider portion to the thinned portion.

As shown in FIGS. 7B & 7C, a non-conductive housing component 528 may at least partially fill or extend into the first and second interlock features 700, 702. Surrounding as many surfaces of the interlock features 700, 702 as possible with the non-conductive material(s) of a non-conductive housing component 528 may tend to increase the strength of the structural coupling between the interlock features 700, 702 and the non-conductive housing component 528. In some embodiments, the non-conductive housing component 528 may extend into holes 712, 714, 716, 718, 720, and 722.

In some embodiments, a shelf or shelves may be cut into the upper surfaces of the first and fifth housing segments 112a, 112e or first and second interlock features 700, 702. For example, a shelf 754 may be cut into the upper surface 746 of the first interlock feature 700. In some embodiments, holes may be formed in an upper surface or shelf of a housing segment 112 to enable the non-conductive component 528 to extend into and through portions of a housing segment 112 away from an interlock feature. For example, holes 756, 758, and 760 may be cut into the shelf 754.

In some embodiments, a front cover (e.g., the front cover 106a described with reference to FIGS. 1A-1C) may be bonded to upper surfaces of the first and second interlock features 700, 702 or housing segments 112a, 112e, or upper surfaces of the non-conductive housing component 528 (e.g., as shown in FIGS. 7B & 7C, where the non-conductive housing component 528 extends over the upper surfaces of the first and second interlock features 700, 702). In some embodiments, a rear cover (e.g., the rear cover 106b described with reference to FIGS. 1A-1C) may be bonded to lower surfaces of the first and second interlock features 700, 702 by an adhesive 534. A seal 536 may be inserted into a groove 538 formed in a lower surface of each housing segment 112a, 112e and extending parallel to the sidewall 114. The seal 536 and adhesive 534 may help prevent moisture from entering a device between the housing segments 112a, 112e and rear cover 106b.

Figure 8A:
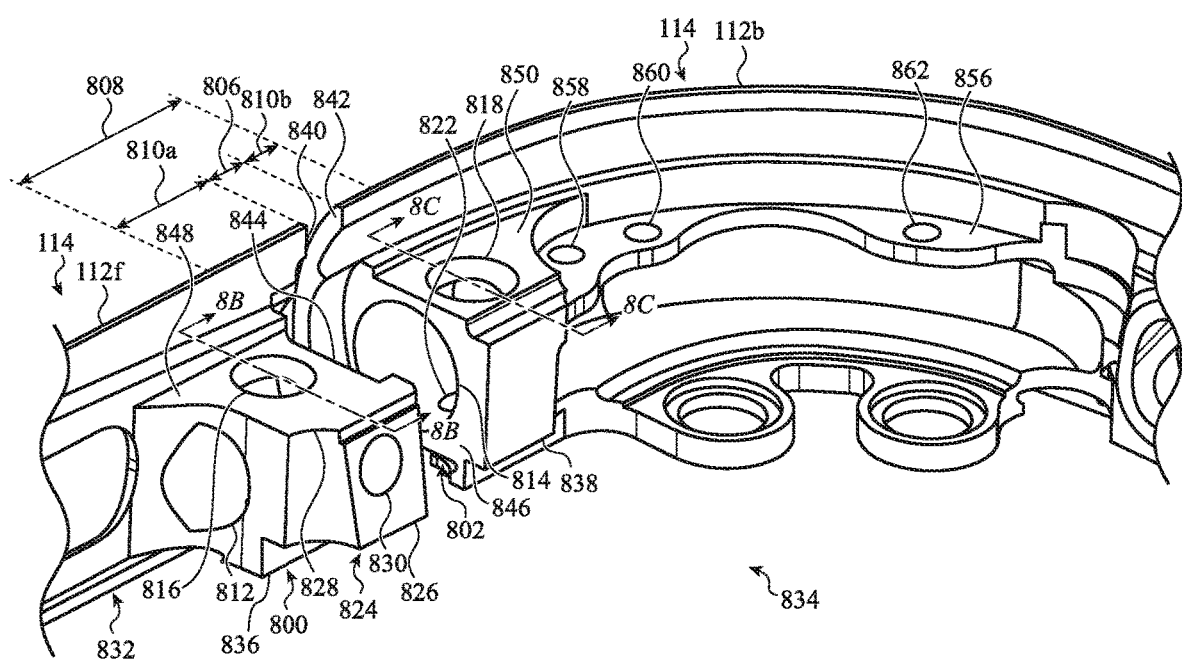
Figure 8B:
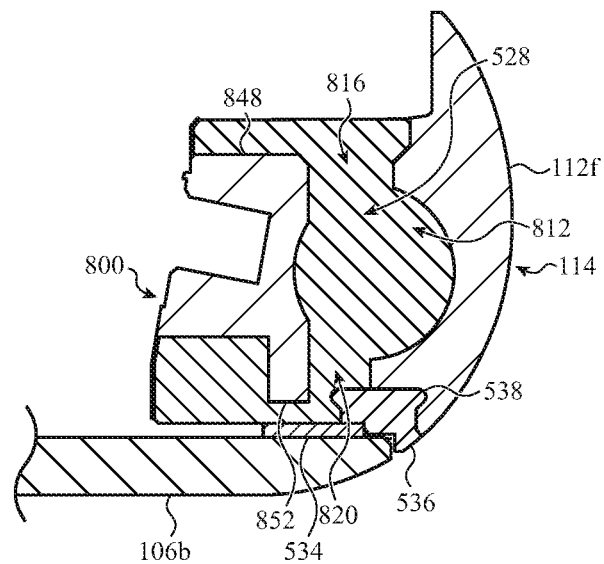
Figure 8C:
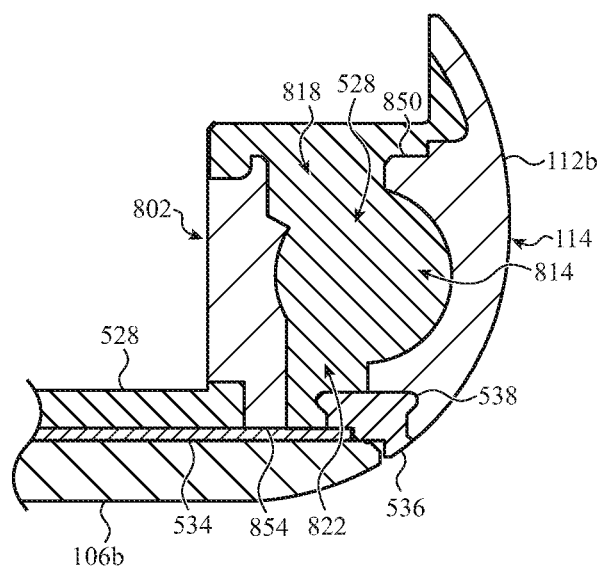

FIGS. 8A-8C show examples of the interlock features 800, 802 that extend into an interior volume 834 defined at least partly by the sidewall 114. The interlock features 800, 802 may extend inward, into the interior volume 834, from adjacent ends of the sixth and second housing segments 112f, 112b described with reference to FIGS. 1A-1C, 2A, 3A-3C, & 4. A portion of the sixth housing segment 112f is shown on the left, and a portion of the second housing segment 112b is shown on the right. As previously described, the sixth and second housing segments 112f, 112b may be separated by a gap along the sidewall 114 that is filled by a non-conductive housing component. The non-conductive housing component may be part of the same non-conductive housing component that structurally couples the housing segments 112 described with reference to FIGS. 5A-7C, or a different non-conductive housing component.

A first interlock feature 800 may include a first protrusion 836 that extends inward from an end of the sixth housing segment 112f, into the interior volume 834. A second interlock feature 802 may include a second protrusion 838 that extends inward from an end of the second housing segment 112b. As shown, the interlock features 800, 802 and their protrusions may be integrally defined by (e.g., molded with or machined into) the sixth and second housing segments 112f, 112b respectively. Alternatively, the interlock features 800, 802 and their protrusions 836, 838 may be structurally coupled to the sixth and second housing segments 112f, 112b in other ways, such as by welds or fasteners. Each of the interlock features 800, 802 and protrusions 836, 838 may be set slightly back from a gap along the sidewall 114 (i.e., an exterior or sidewall gap 806) to form an interior gap 808 between the housing segments 112f, 112b that has a greater width than the exterior gap 806. For example, a first end surface 840 of the sixth housing segment 112f may be positioned opposite a second end surface 842 of the second housing segment 112b to define the exterior gap 806. The first interlock feature 800 may have a first interlock surface 844 positioned opposite a second interlock surface 846 of the second interlock feature 802 to define the interior gap 808. The first interlock surface 844 may be defined by the first protrusion 836, and the second interlock surface 846 may be defined by the second protrusion 838. The exterior gap 806 may have a first gap width, and the interior gap 808 may have a second gap width. In some embodiments, and as shown in FIG. 8A, the second gap width may be greater than the first gap width.

By way of example, the entirety of the second interlock feature 802 may be set back from the exterior gap 806 by an offset 810b, whereas an outermost portion of the first interlock feature 800 may be set back from the exterior gap 806 by an offset 810a, and an innermost portion of the first interlock feature 800 may widen into the interior gap 808 (e.g., part of the first interlock feature 800 may overlap the offset 810a).

A number of holes may be formed in each of the interlock features 800, 802 to enable a non-conductive housing component to extend into, through, or around the interlock features 800, 802 (thereby increasing the strength of the structural coupling between the fifth housing segment 112e, the non-conductive housing component, and the second housing segment 112b). For example, each of the interlock features 800, 802 may include a first hole 812 or 814 (e.g., a through hole) that extends into the first interlock surface 844 or the second interlock surface 846. The first hole 812 or 814 may be formed by drilling a single hole into each interlock feature 800, 802 or protrusion 836, 838. Additional holes may also be formed in each interlock feature 800, 802 or protrusion 836, 838, as shown in FIGS. 7B & 7C. The additional holes may provide additional surface area for non-conductive housing component(s) to hold or grab onto, retain, or conform to, thereby improving the strength of the structural coupling between the sixth and second housing segments 112f, 112b. As an example, a second hole 816 or 818 (e.g., a round hole) may extend into an upper surface 848 or 850 of each interlock feature 800, 802 or protrusion 836, 838. The second holes 816, 818 may be drilled or otherwise cut into each interlock feature 800, 802, and may be transverse to (e.g., perpendicularly intersect) the first hole 812 or 814. A third hole 820 or 822 (e.g., a round hole) may extend into a lower surface 852 or 854 of each interlock feature 800, 802 or protrusion 836, 838. The third holes 820, 822 may be drilled or otherwise cut into each interlock feature 800, 802, and may be transverse to (e.g., perpendicularly intersect) the first hole 812 or 814. The second and third holes 816-822 may have the same diameter or different diameters, and in some cases may be formed as respective single through holes. The formation of all three holes 812-822 by means of drilling (e.g., instead of by end milling) may save cost and reduce cycle time without sacrificing the integrity of the structural coupling between the sixth and second housing segments 112f, 112b.

A boss protrusion 824 (e.g., a screw boss), which in some cases may serve as a flex circuit connection point (e.g., an antenna tuning connector point), may be machined in or structurally coupled to the sixth antenna segment 112f, and may be integrated with the first interlock feature 802. The boss protrusion 824 may have a surface 826 that is angled (e.g., at a 10 degree angle, ±10%) with respect to an imaginary line extending perpendicular to a front and rear surfaces of a device. In alternative embodiments, the surface may be angled between 5 and 15 degrees, between 0 (aligned with the imaginary line) and 20 degrees, or between 0 and 90 degrees. The boss protrusion 824 may be angled to reduce the inward extension of the first interlock feature 800 from the sidewall 114, while also maintaining an upper surface 828 (of the first interlock feature 800) to which a device cover or other element may be mated or sealed. The boss protrusion 824 may be formed similarly to the boss protrusion 724 described with reference to FIGS. 7A & 7C. Similarly to the boss protrusion 724, the boss protrusion 824 may have a threaded hole 830 with a shallower thread depth, so that the threaded hole 830 does not intersect the first hole 812 formed in the first interlock feature 800.

The first interlock feature 800 may form part of (or abut) an antenna tuning feature (e.g., a slot antenna feature 832 formed between the sixth housing segment 112f and a support plate to which the sixth and second housing segments 112f, 112b are structurally coupled). In some embodiments, the antenna tuning feature may be defined by a variable thickness of the sixth housing segment 112f along the sidewall 114. For example, the slot antenna feature 832 may extend from the first interlock feature 800 along the sixth housing segment 112f, and may be defined by a thinned portion of the sixth housing segment 112f. The wider portions of the sixth housing segment 112f, adjacent each end of the thinned portion, may taper into the thinned portion (e.g., with an arc or other profile), as shown, or there may be an abrupt transition (e.g., a step) from each wider portion to the thinned portion.

As shown in FIGS. 8B & 8C, a non-conductive housing component 528 may at least partially fill or extend into the first and second interlock features 800, 802. Surrounding as many surfaces of the interlock features 800, 802 as possible with the non-conductive material(s) of a non-conductive housing component 528 may tend to increase the strength of the structural coupling between the interlock features 800, 802 and the non-conductive housing component 528. In some embodiments, the non-conductive housing component 528 may extend into holes 812, 814, 816, 818, 820, and 822.

In some embodiments, a shelf or shelves may be cut into the upper surfaces of the sixth and second housing segments 112f, 112b or first and second interlock features 800, 802. For example, a shelf 856 may be cut into the upper surface 850 of the second interlock feature 802. In some embodiments, holes may be formed in an upper surface or shelf of a housing segment 112 to enable the non-conductive component 528 to extend into and through portions of a housing segment 112 away from an interlock feature. For example, holes 858, 860, and 862 may be cut into the shelf 856.

In some embodiments, a front cover (e.g., the front cover 106a described with reference to FIGS. 1A-1C) may be bonded to upper surfaces of the first and second interlock features 800, 802 or housing segments 112f, 112b, or upper surfaces of the non-conductive housing component 528 (e.g., as shown in FIGS. 8B & 8C, where the non-conductive housing component 528 extends over the upper surfaces of the first and second interlock features 800, 802). In some embodiments, a rear cover (e.g., the rear cover 106b described with reference to FIGS. 1A-1C) may be bonded to lower surfaces of the first and second interlock features 800, 802 by an adhesive 534. A seal 536 may be inserted into a groove 538 formed in a lower surface of each housing segment 112f, 112b and extending parallel to the sidewall 114. The seal 536 and adhesive 534 may help prevent moisture from entering a device between the housing segments 112f, 112b and rear cover 106b.

Figure 9A:
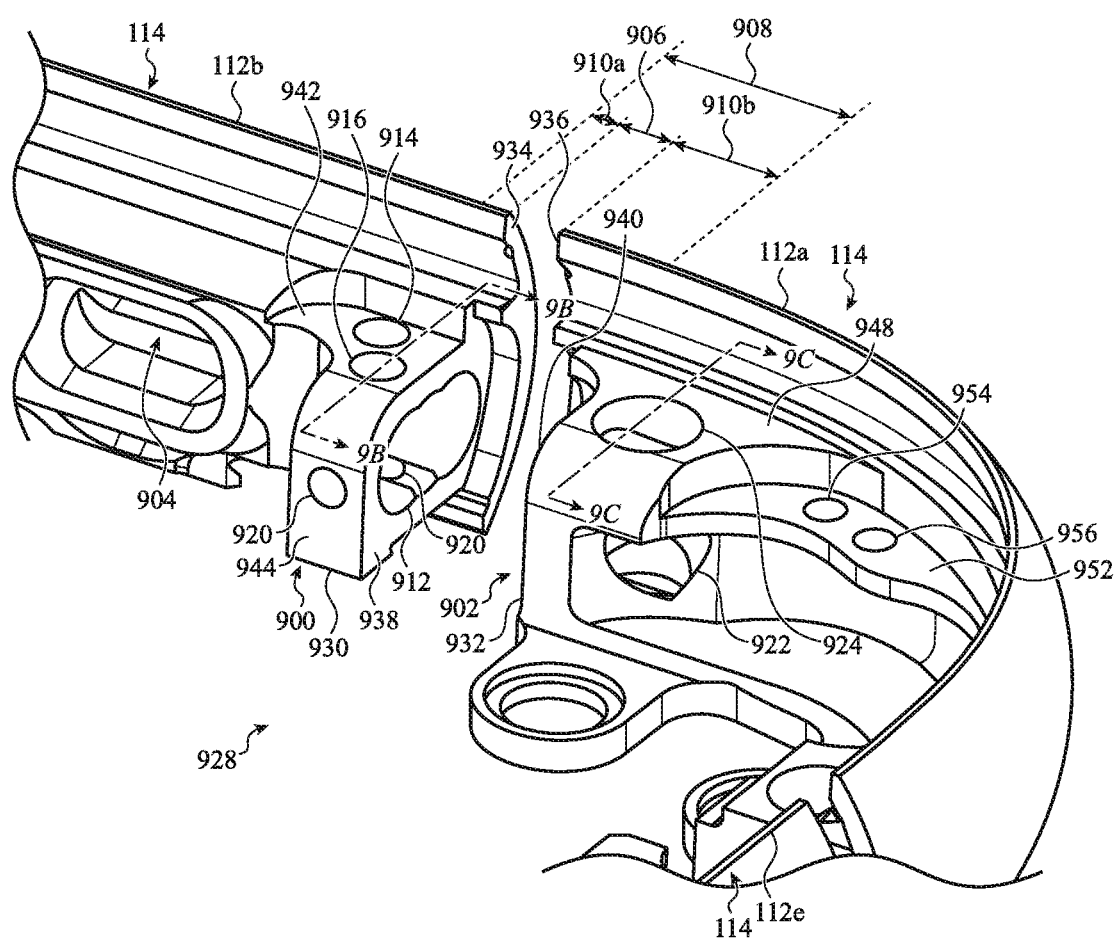
Figure 9B:
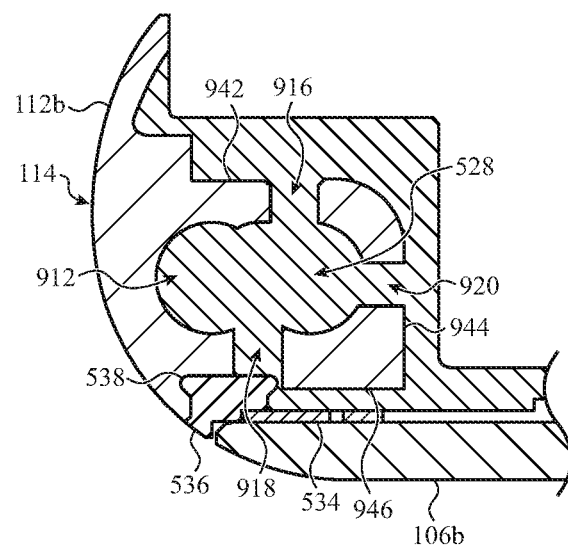
Figure 9C:
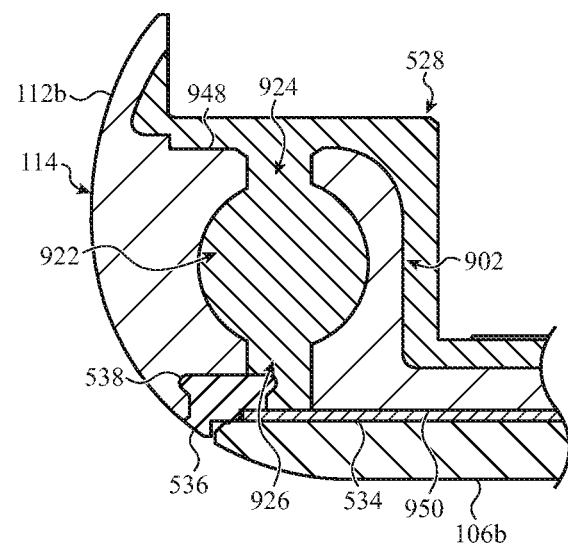

FIGS. 9A-9C show examples of the interlock features 900, 902 that extend into an interior volume 928 defined at least partly by the sidewall 114. The interlock features 900, 902 may extend inward, into the interior volume 928, from adjacent ends of the second and first housing segments 112b, 112a described with reference to FIGS. 1A-1C, 2A, 3A-3C, & 4. A portion of the second housing segment 112b is shown on the left, and a portion of the first housing segment 112a is shown on the right. As previously described, the second and first housing segments 112b, 112a may be separated by a gap along the sidewall 114 that is filled by a non-conductive housing component. The non-conductive housing component may be part of the same non-conductive housing component that structurally couples the housing segments 112 described with reference to FIGS. 5A-8C, or a different non-conductive housing component.

A first interlock feature 900 may include a first protrusion 930 that extends inward from an end of the second housing segment 112b, into the interior volume 928. A second interlock feature 902 may include a second protrusion 932 that extends inward from an end of the first housing segment 112a, into the interior volume 928. The first interlock feature 900 may be located near a port 904 formed through the second housing segment 112b (e.g., a pressure port, a speaker port, etc.). Because of the port 904, the first interlock feature 900 may be somewhat thinner than the second interlock feature 902. To compensate for the thinness of the first interlock feature 900 and improve its performance in a crushing mode, the first interlock feature 900 may protrude farther inward from the sidewall 114 than other interlock features (e.g., farther inward than the second interlock feature 902). In some embodiments, the second interlock feature 902 may also extend farther inward from the sidewall 114, similarly to the first interlock feature 900.

As shown, the interlock features 900, 902 may be integrally defined by (e.g., molded with or machined into) the second and first housing segments 112b, 112a respectively. Alternatively, the interlock features 900, 902 may be structurally coupled to the second and first housing segments 112b, 112a in other ways, such as by welds or fasteners. Each of the interlock features 900, 902 and protrusions 930, 932 may be set slightly back from a gap along the interior of the sidewall (i.e., an exterior or sidewall gap 906) to form an interior gap 908 between the housing segments 112b, 112a that has a greater width than the exterior gap 906. For example, a first end surface 934 of the second housing segment 112b may be positioned opposite a second end surface 936 of the first housing segment 112a to define the exterior gap 906. The first interlock feature 900 may have a first interlock surface 938 positioned opposite a second interlock surface 940 of the second interlock feature 902 to define the interior gap 908. The first interlock surface 938 may be defined by the first protrusion 930, and the second interlock surface 940 may be defined by the second protrusion 932. The exterior gap 906 may have a first gap width, and the interior gap 908 may have a second gap width. In some embodiments, and as shown in FIG. 9A, the second gap width may be greater than the first gap width.

A number of holes may be formed in each of the interlock features 900, 902 to enable a non-conductive housing component to extend into, through, or around the interlock features 900, 902 (thereby increasing the strength of the structural coupling between the second housing segment 112b, the non-conductive housing component, and the first housing segment 112a). With reference to FIGS. 9A & 9B, a first hole 912 (e.g., a through hole) may extend into the first interlock surface 938 of the first interlock feature 900. In some embodiments, the first hole 912 may be formed by a set of multiple partially overlapping drill holes. Drilling multiple partially overlapping holes may save cost over forming the first hole 912 using an end mill. In some embodiments, the partially overlapping holes may be drilled close enough to reduce the ridges where holes overlap and thereby reduce the tendency of the ridges to operate as knives or chisels when a device is dropped. In alternative embodiments, the first hole 912 may be formed by an end mill or other means.

In addition to the first hole 912, additional holes 914, 916, 918, 920 may extend into additional surfaces of the first interlock feature 900 or protrusion 930, as shown in FIGS. 9A & 9B. The additional holes 914-920 may provide additional surface area for the non-conductive housing component(s) to hold or grab onto, retain, or conform to, thereby improving the strength of the structural coupling between the second and first housing segments 112b, 112a. In some embodiments, the additional holes 914-920 may be drilled. The additional holes 914-920 may include second and third holes 914, 916 drilled into an upper surface 942 of the first interlock feature 900, transverse to (e.g., perpendicularly intersecting) the first hole 912; a fourth hole 918 hole drilled into an inner surface 944 of the first interlock feature 900, transverse to (e.g., perpendicularly intersecting) the first hole 912; and a fifth hole 920 drilled into a lower surface 946 of the first interlock feature 900, transverse to the sidewall 114 and perpendicularly intersecting the first hole 912. A non-conductive housing component may extend into, and through each of the holes 912-920, and around various portions of the first interlock feature 900.

A non-conductive housing component may extend through the first interlock 900 in five directions of an x/y/z coordinate space (e.g., in all directions but through the sidewall 114). This can increase the structural rigidity of the first interlock feature 900, which can be useful given its thinner width.

With reference to FIGS. 9A & 9C, a first hole 922 (e.g., a round through hole) may extend into the second interlock surface 940 of the second interlock feature 90s or protrusion 932. In some embodiments, the first hole 922 may be drilled or otherwise cut into the second interlock feature 902. A second hole 924 (e.g., a round hole) may extend into an upper surface 948 of the second interlock feature 902 or protrusion 932. The second hole 924 may also be drilled, and may be transverse to (e.g., perpendicularly intersect) the first hole 922. A third hole 926 (e.g., a round hole) may extend into a lower surface 950 of the second interlock feature 902 or protrusion 932. The third hole 926 may be drilled or otherwise cut into the second interlock feature 902 and be transverse to (e.g., perpendicularly intersect) the first hole 922. The second and third holes 924, 926 may have the same diameter or different diameters, and in some cases may be formed as a single through hole.

As shown in FIGS. 9B & 9C, a non-conductive housing component 528 may at least partially fill or extend into the first and second interlock features 900, 902. Surrounding as many surfaces of the interlock features 900, 902 as possible with the non-conductive material(s) of a non-conductive housing component 528 may tend to increase the strength of the structural coupling between the interlock features 900, 902 and the non-conductive housing component 528. In some embodiments, the non-conductive housing component 528 may extend into holes 912, 914, 916, 918, 920, 922, 924, and 926.

In some embodiments, a shelf or shelves may be cut into the upper surfaces of the second and first housing segments 112b, 112a or first and second interlock features 900, 902. For example, a shelf 952 may be cut into the upper surface 948 of the second interlock feature 902. In some embodiments, holes may be formed in an upper surface or shelf of a housing segment 112 to enable the non-conductive component 528 to extend into and through portions of a housing segment 112 away from an interlock feature. For example, holes 954 and 956 may be cut into the shelf 952.

In some embodiments, a front cover (e.g., the front cover 106a described with reference to FIGS. 1A-1C) may be bonded to upper surfaces of the first and second interlock features 900, 902 or housing segments 112b, 112a, or upper surfaces of the non-conductive housing component 528 (e.g., as shown in FIGS. 9B & 9C, where the non-conductive housing component 528 extends over the upper surfaces of the first and second interlock features 900, 902). In some embodiments, a rear cover (e.g., the rear cover 106b described with reference to FIGS. 1A-1C) may be bonded to lower surfaces of the first and second interlock features 900, 902 by an adhesive 534. A seal 536 may be inserted into a groove 538 formed in a lower surface of each housing segment 112b, 112a and extending parallel to the sidewall 114. The seal 536 and adhesive 534 may help prevent moisture from entering a device between the housing segments 112b, 112a and rear cover 106b.

Figure 10A:
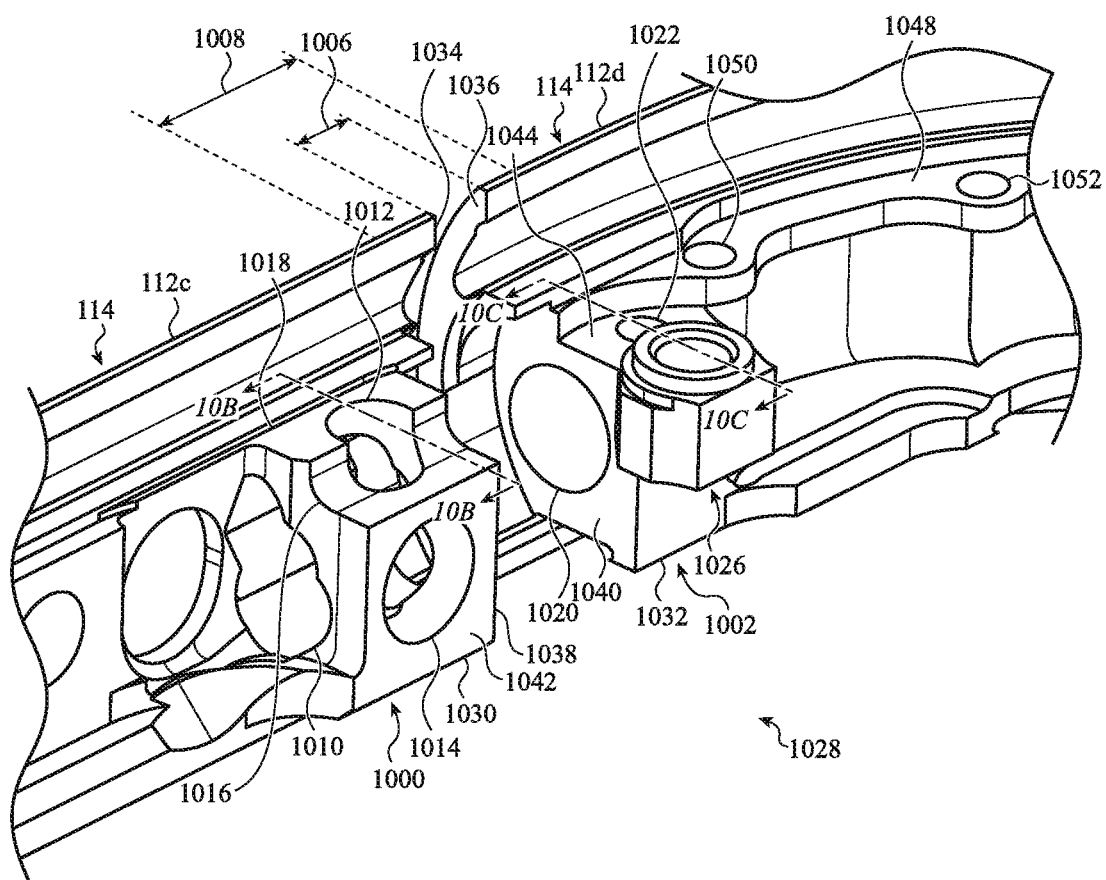
Figure 10B:
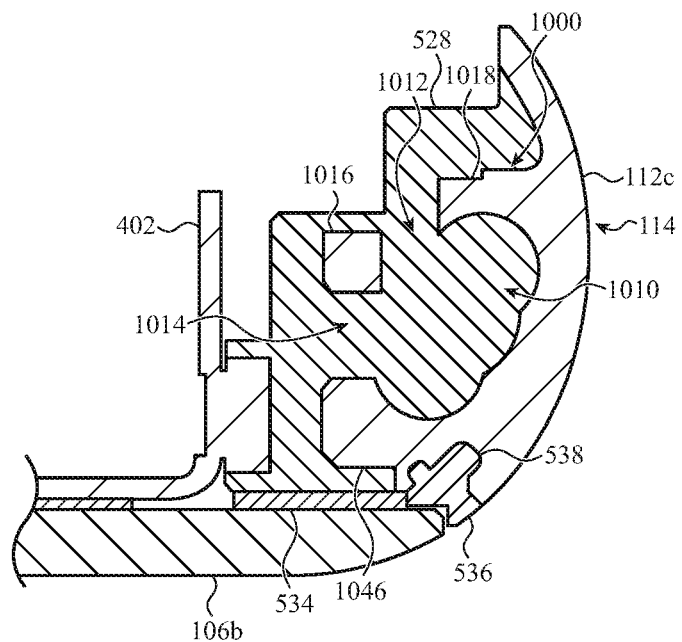
Figure 10C:
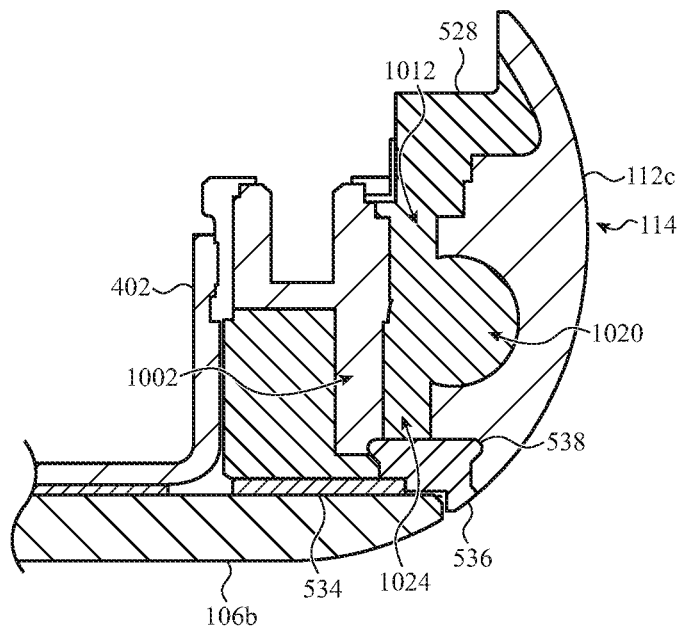

FIGS. 10A-10C show examples of the interlock features 1000, 1002 that extend into an interior volume 1028 defined at least partly by the sidewall 114. The interlock features 1000, 1002 may extend inward, into the interior volume 1028, from adjacent ends of the third and fourth housing segments 112c, 112d described with reference to FIGS. 1A-1C, 2A, 3A-3C, & 4. A portion of the third housing segment 112c is shown on the left, and a portion of the fourth housing segment 112d is shown on the right. As previously described, the third and fourth housing segments 112c, 112d may be separated by a gap along the sidewall 114 that is filled by a non-conductive housing component. The non-conductive housing component may be part of the same non-conductive housing component that structurally couples the housing segments 112 described with reference to FIGS. 5A-9C, or a different non-conductive housing component. Similarly, the interior volumes described with reference to FIGS. 5A, 6A, 7A, 8A, 9A, & 10A may be the same or different interior volumes.

A first interlock feature 1000 may include a first protrusion 1030 that extends inward from an end of the third housing segment 112c, into the interior volume 1028. A second interlock feature 1002 may include a second protrusion 1032 that extends inward from an end of the fourth housing segment 112d, into the interior volume 1028. As shown, the interlock features 1000, 1002 and their protrusions 1030, 1032 may be integrally defined by (e.g., molded with or machined into) the third and fourth housing segments 112c, 112d respectively. Alternatively, the interlock features 1000, 1002 may be structurally coupled to the third and fourth housing segments 112c, 112d in other ways, such as by welds or fasteners.

Each of the interlock features 1000, 1002 may be set slightly back from a gap along the interior of the sidewall 114 (i.e., an exterior or sidewall gap 1006) to form an interior gap 1008 between housing segments 112c, 112d that has a greater width than the exterior gap 1006. For example, a first end surface 1034 of the third housing segment 112c may be positioned opposite a second end surface 1036 of the fourth housing segment 112d to define the exterior gap 1006. The first interlock feature 1000 may have a first interlock surface 1038 positioned opposite a second interlock surface 1040 of the second interlock feature 1002 to define the interior gap 1008. The first interlock surface 1038 may be defined by the first protrusion 1030, and the second interlock surface 1040 may be defined by the second protrusion 1032. The exterior gap 1006 may have a first gap width, and the interior gap 1008 may have a second gap width. In some embodiments, and as shown in FIG. 10A, the second gap width may be greater than the first gap width.

A number of holes may be formed in each of the interlock features 1000, 1002 to enable a non-conductive housing component to extend into, through, or around the interlock features 1000, 1002 (thereby increasing the strength of the structural coupling between the third housing segment 112c, the non-conductive housing component, and the fourth housing segment 112d). With reference to FIGS. 10A & 10B, a first hole 1010 (e.g., a through hole) may extend into the first interlock surface 1038 of the first interlock feature 1000 or protrusion 1030. The first hole 1010 may be formed by a set of multiple partially overlapping drill holes. In some embodiments, the partially overlapping holes may be drilled close enough to reduce the ridges where holes overlap and thereby reduce the tendency of the ridges to operate as knives or chisels when a device is dropped. In alternative embodiments, the first hole 1010 may be formed by an end mill or other means.

In addition to the first hole 1010, additional holes 1012, 1014 may be formed in the first interlock feature 1000 or protrusion 1030. The additional holes 1012, 1014 may provide additional surface area for the non-conductive housing component(s) to hold or grab onto, retain, or conform to, thereby improving the strength of the structural coupling between the third and fourth housing segments 112c, 112d. In some embodiments, the additional holes 1012, 1014 may be drilled. The additional holes 1012, 1014 may include a second hole 1012 that extends into an upper surface 1018 of the first interlock feature 1000 or protrusion 1030, transverse to (e.g., perpendicularly intersecting) the first hole 1010, and a third hole 1014 that extends into an inner surface 1042 of the first interlock feature 1000 or protrusion 1030, transverse to the sidewall 114 and first hole 1010 (e.g., perpendicularly intersecting the first hole 1010). A non-conductive housing component may extend into and through each of the holes 1010-1014, and around various portions of the first interlock feature 1000. A shelf 1016 may be cut into the upper surface 1018 of the first interlock feature 1000. In some cases, the shelf 1016 may be curved. In some cases, the shelf 1016 may intersect the second hole 1012. As shown, the shelf 1016 may intersect the second hole 1012 perpendicularly. The shelf 1016 may increase the separation or reduce the capacitance between the third housing segment 112c and a conductive component(s) that are routed near the third housing segment 112c. In some embodiments, the shelf 116 may be covered by a non-conductive housing component 528, as shown in FIG. 10B.

With reference to FIGS. 10A & 10C, a first hole 1020 (e.g., a round through hole) may extend into the second interlock surface 1040 of the second interlock feature 1002 or protrusion 1032. In some embodiments, the first hole 1020 may be drilled or otherwise cut into the second interlock feature 1002. A second hole 1022 (e.g., a round hole) may extend into an upper surface 1044 of the second interlock feature 1002 or protrusion 1032, and may also be drilled or otherwise cut into the second interlock feature 1002. The second hole 1022 may be transverse to (e.g., perpendicularly intersect) the first hole 1020. A third hole 1024 (e.g., a round hole) may extend into a lower surface 1046 of the second interlock feature 1002 or protrusion 1032. In some embodiments, the third hole 1024 may be drilled or otherwise cut into the second interlock feature 1002, transverse to (e.g., perpendicularly intersecting) the first hole 1020. The second and third holes 1022, 1024 may have the same diameter or different diameters, and in some cases may be formed as a single through hole.

As shown in FIG. 10A, a boss protrusion 1026 (e.g., a screw boss) may be integrated with the second interlock feature 1002 or protrusion 1032. In some embodiments, the boss protrusion 1026 may be formed as described with reference to FIG. 6A.

As shown in FIGS. 10B & 10C, a non-conductive housing component 528 may at least partially fill or extend into the first and second interlock features 1000, 1002. Surrounding as many surfaces of the interlock features 1000, 1002 as possible with the non-conductive material(s) of a non-conductive housing component 528 may tend to increase the strength of the structural coupling between the interlock features 1000, 1002 and the non-conductive housing component 528. In some embodiments, the non-conductive housing component 528 may extend into holes 1010, 1012, 1014, 1020, 1022, and 1024.

In some embodiments, a shelf or shelves may be cut into a housing segment 112 (e.g., into the fourth housing segment 112d). For example, a shelf 1048 may be cut into the fourth housing segment 112d above the upper surface 1044 of the second interlock feature 802. In some embodiments, holes may be formed in the shelf 1048 to enable the non-conductive component 528 to extend into and through the shelf 1048. For example, holes 1050 and 152 may be cut into the shelf 1048.

In some embodiments, a front cover (e.g., the front cover 106a described with reference to FIGS. 1A-1C) may be bonded to upper surfaces of the first and second interlock features 1000, 1002 or housing segments 112c, 112d, or upper surfaces of the non-conductive housing component 528 (e.g., as shown in FIGS. 10B & 10C, where the non-conductive housing component 528 extends over the upper surfaces of the first and second interlock features 1000, 1002). In some embodiments, a rear cover (e.g., the rear cover 106b described with reference to FIGS. 1A-1C) may be bonded to lower surfaces of the first and second interlock features 1000, 1002 by an adhesive 534. A seal 536 may be inserted into a groove 538 formed in a lower surface of each housing segment 112c, 112d and extending parallel to the sidewall 114. The seal 536 and adhesive 534 may help prevent moisture from entering a device between the housing segments 112c, 112d and rear cover 106b.

In some embodiments, one or more surfaces of the interlock features described with reference to FIGS. 5A-10C may be etched, machined, or treated to make the surface textured or porous. For example, in some embodiments, some surfaces of the interlock features may be etched to form pores that are 2-3 microns deep and 2-3 microns wide. Such pores provide additional blind holes for non-conductive housing components to flow into, thereby increasing the structural bond between interlock features and non-conductive housing components. In areas where a wall of an interlock feature is thin, the surface of the wall may not be etched, or etching may be controlled to ensure that pores do not break through the wall (e.g., to avoid sealing issues for different holes or cavities).

Figure 11A:
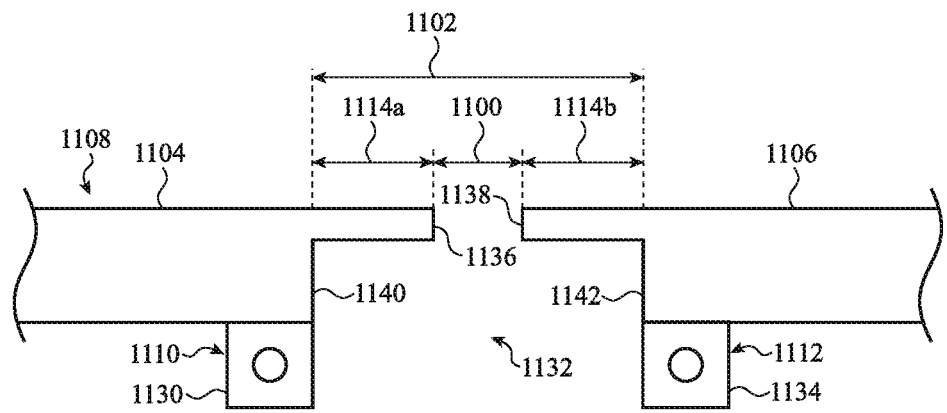
FIGS. 11A & 11B illustrate how exterior (sidewall) and interior gaps between housing segments disposed along a sidewall of a device may be aligned symmetrically or asymmetrically.
Figure 11B:
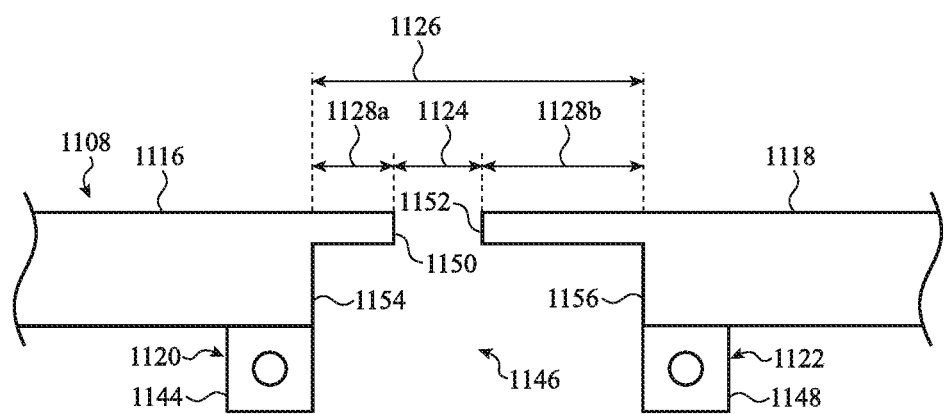

FIGS. 11A & 11B illustrate how exterior (sidewall) and interior gaps between the housing segments 112 described with reference to FIGS. 2A, 3A-3C, 4, 5A, 6A, 7A, 8A, 9A, & 10A may be aligned symmetrically or asymmetrically. FIG. 11A shows corresponding exterior and interior gaps 1100, 1102 that are aligned symmetrically. FIG. 11B shows corresponding exterior and interior gaps 1124, 1126 that are aligned asymmetrically.

By way of example, FIG. 11A shows a generic representation of two adjacent housing segments 1104, 1106 that may form part of a sidewall 1108 of a housing. A first interlock feature 1110 may have a protrusion 1130 that extends inward from an end of the first housing segment 1104, into an interior volume 1132 defined at least partly by the sidewall 1108. A second interlock feature 1112 may have a protrusion 1134 that extends inward from an end of the second housing segment 1106, into the interior volume 1132. An exterior gap 1100 may be defined between the first and second housing segments 1104, 1106. The interlock features 1110, 1112 may be set back from the exterior gap 1100 to from an interior gap 1102 that has a greater width than the exterior gap 1100. For example, a first end surface 1136 of the first housing segment 1104 may be positioned opposite a second end surface 1138 of the second housing segment 1106 to define the exterior gap 1100. The first interlock feature 1110 may have a first interlock surface 1140 positioned opposite a second interlock surface 1142 of the second interlock feature 1112 to define the interior gap 1102. The first interlock surface 1140 may be defined by the first protrusion 1130, and the second interlock surface 1142 may be defined by the second protrusion 1134. The exterior gap 1100 may have a first gap width, and the interior gap 1102 may have a second gap width. In some embodiments, and as shown in FIG. 11A, the second gap width may be greater than the first gap width.

The first interlock surface 1140 may be offset from the first end surface 1136 by a first offset 1114a, and the second interlock surface 1142 may be offset from the second end surface 1138 by a second offset 1114b, which offsets 1114a, 1114b may be the same such that the exterior and interior gaps 1100, 1102 are aligned symmetrically. A non-conductive housing component may overlap interior surfaces of the housing segments 1104, 1106 along the sidewall 1108 (i.e., extend along the offsets 1114a, 1114b) and fill the exterior and interior gaps 1100, 1102.

In some embodiments, the non-conductive housing component may be formed by a polymer material having a fiber fill, and the polymer material may at least partially fill various holes in the first and second interlock features 1110, 1112 in addition to forming an exterior surface of the sidewall 1108 (e.g., a portion of the sidewall 1108 that bridges or fills the exterior gap 1100). In other embodiments, the non-conductive housing component may include a first portion formed from a first polymer material and a second portion formed from a second polymer material. The first polymer material may have a fiber fill and at least partially fill various holes in the first and second interlock features. The second polymer material may be different from the first polymer material and form an exterior surface of the sidewall 1108 (e.g., a portion of the sidewall 1108 that bridges or fills the exterior gap 1100). Each polymer having a fiber fill may have a fiber fill including glass or other types of fibers. In some embodiments, the second polymer material may also have a fiber fill, but have a fiber fill that differs from the fiber fill of the first polymer material.

Also by way of example, FIG. 11B shows a generic representation of two adjacent housing segments 1116, 1118 that may form part of a sidewall 1108 of a housing. A first interlock feature 1120 may have a protrusion 1144 that extends inward from an end of the first housing segment 1116, into an interior volume 1146 defined at least partly by the sidewall 1108. A second interlock feature 1122 may have a protrusion 1148 that extends inward from an end of the second housing segment 1118, into the interior volume 1146. An exterior gap 1124 may be defined between the first and second housing segments 1116, 1118. The interlock features 1120, 1122 may be set back from the exterior gap 1124 to from an interior gap 1126 that has a greater width than the exterior gap 1124. For example, a first end surface 1150 of the first housing segment 1116 may be positioned opposite a second end surface 1152 of the second housing segment 1118 to define the exterior gap 1124. The first interlock feature 1120 may have a first interlock surface 1154 positioned opposite a second interlock surface 1156 of the second interlock feature 1122 to define the interior gap 1126. The first interlock surface 1154 may be defined by the first protrusion 1144, and the second interlock surface 1156 may be defined by the second protrusion 1148. The exterior gap 1124 may have a first gap width, and the interior gap 1126 may have a second gap width. In some embodiments, and as shown in FIG. 11B, the second gap width may be greater than the first gap width.

The first interlock surface 1154 may be offset from the first end surface 1150 by a first offset 1128a, and the second interlock surface 1156 may be offset from the second end surface 1152 by a second offset 1128b, which offsets 1128a, 1128b may differ such that the exterior and interior gaps 1124, 1126 are aligned asymmetrically. A non-conductive housing component may overlap interior surfaces of the housing segments 1116, 1118 along the sidewall 1108 (i.e., extend along the offsets 1128a, 1128b) and fill the exterior and interior gaps 1124, 1126.

Asymmetrically aligned exterior and interior gaps 1124, 1126 may enable adjacent interlock features 1120, 1122 to be shifted in position along a housing sidewall 1108 while still providing sufficient separation between conductive housing segments 1116, 1118 that may be operated as antennas. Sufficient separation may be needed to mitigate the likelihood that the housing segments 1116, 1118 couple to one another (thereby enabling the conductive housing segments to resonate independently) and/or to reduce the capacitance between the conductive housing segments.

In some embodiments, the thickness of a housing segment at a boundary of an exterior gap may be defined as a function of the width of the exterior gap, or conversely, the width of the exterior gap may be defined as a function of the thickness of the housing segment at the boundary of the exterior gap. For example, the thickness of the housing segment 1104 or 1116 at the boundary of the exterior gap 1100 (see FIGS. 11A & 11B) may be defined as a function of the width of the exterior gap 1100 or 1124.

In some embodiments, the thickness of a housing segment at a boundary of an interior gap may be defined as a function of the width of the interior gap, or conversely, the width of the exterior gap may be defined as a function of the thickness of the housing segment at the boundary of the interior gap. For example, the width of the interior gap 1102 or 1126 may be defined as a function of the thickness of the housing segment 1104 or 1116 at the boundary of the interior gap 1102 or 1126 (see FIGS. 11A & 11B).

In some embodiments, the width of the exterior or interior gaps described with reference to FIGS. 11A & 11B may be otherwise defined to reduce capacitance or coupling between the ends of adjacent conductive housing segments while also maintaining good structural rigidity of the sidewall 1108.

Figure 12:
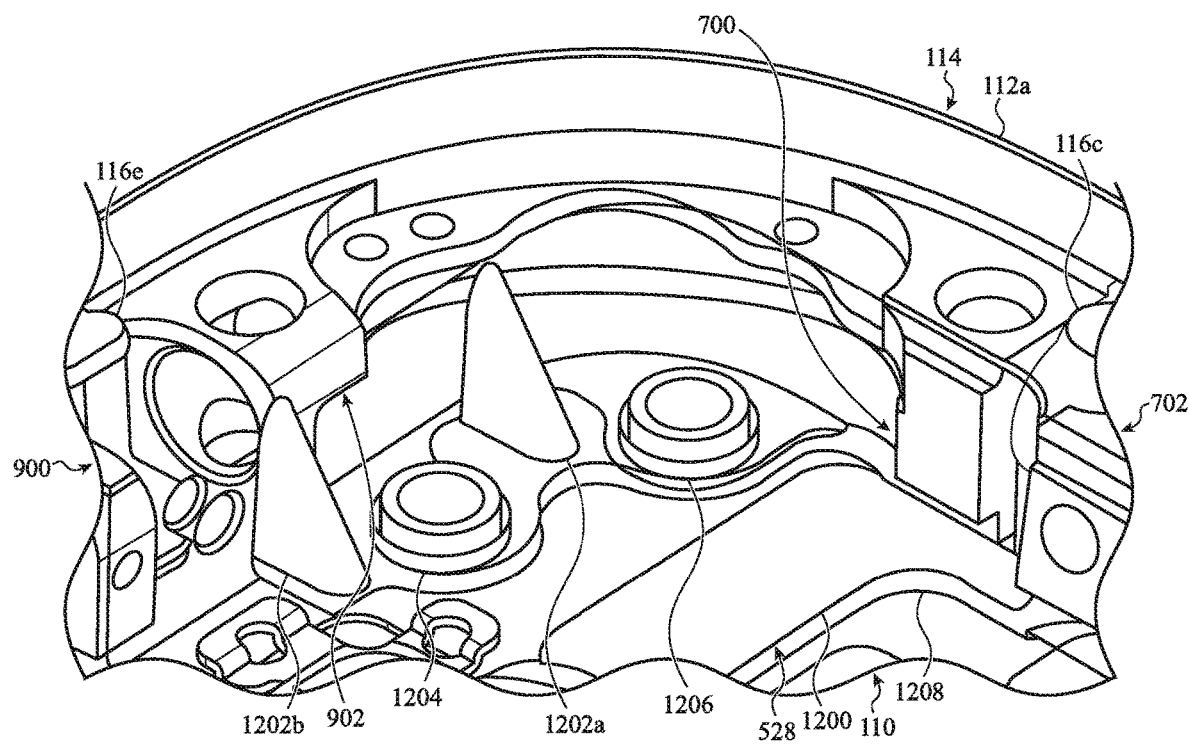
FIG. 12 shows an isometric view of the first housing segment described with reference to FIGS. 1A-1C, 2A, 3A-3C, 4, 7A, 7B, 9A, & 9C, with some of the non-conductive housing component(s) that abut, fill, and surround the interlock features and other interior surfaces of the first housing segment.

Turning to FIG. 12, there is shown an isometric view of the first housing segment 112a described with reference to FIGS. 1A-1C, 2A, 3A-3C, 4, 7A-7B, 9A, & 9C and portions 116a, 116c, 1204 of the non-conductive housing component 528 that abut, fill, and surround the interlock features 902, 700 and other interior surfaces of the first housing segment 112a. As shown, a first portion 1204 of the non-conductive housing component 528 may form a gusset 1200 that extends from under the lower surfaces of the first housing segment 112a (including lower surfaces of its interlock features 902, 700) to over, under, or onto a support plate (e.g., over, under, onto, or encapsulating the support plate 110 described with reference to FIG. 4). The first portion 1204 of the non-conductive housing component 528 may also extend at least partially into the interlock features 902, 700, into other features of the first housing segment 112a, and along an interior surface of the sidewall 114. The first portion 1204 of the non-conductive housing component 528 may also extend into the interlock features 900, 702 extending from adjacent ends of other housing segments (e.g., the second housing segment and the fifth housing segment 112b, 112e described with reference to other figures). A strengthening rib or buttress 1202a may be formed between the gusset 1200 and portions of the non-conductive housing component 528 that extend along the interior surface of the sidewall 114. The gusset 1200 and/or buttress 1202a may improve the rigidity of the first housing segment 112a and its structural couplings to adjacent housing segments, and in some cases may span that portion of a corner that lies between an interlock feature 900 at an end of the second housing segment to an interlock feature 702 at an end of the fifth housing segment. Other buttresses, such as buttress 1202b, may also be formed by the first portion 1204 of the non-conductive housing component 528. In some embodiments, an adhesive may bond the first portion 1204 of the non-conductive housing component (e.g., the gusset 1200) to the support plate 110. The gusset 1200 and buttresses 1202a, 1202b may be replicated in other corners of the sidewall 114, and may provide extra structural support for a housing segment mounted at the corner of a device (and in particular, a housing segment that wraps just around a corner of a device).

As also shown in FIG. 12, second portions 116e, 116c of the non-conducive housing component 528 may fill portions of the gaps between housing segments 112 and form exterior surface portions of the sidewall 114. In some embodiments, the first portion 1204 of the non-conductive housing component 528 may provide more structural rigidity, and the second portions 116e, 116c of the non-conductive housing component 528 may have a more uniform consistency than the first portion 1204 and provide a smoother exterior surface along the sidewall 114.

In some embodiments, the entirety of the non-conductive housing component 528 may be formed by a polymer material having a fiber fill, and the polymer material may at least partially fill various holes in the interlock features 900, 902, 700, 702, in addition to forming exterior surface portions of the sidewall 114. In other embodiments, the non-conductive housing component 528 may include the first portion 1204, which may be formed from a first polymer material, and the second portions 116e, 116c, which may be formed from a second polymer material. The first polymer material may have a fiber fill and at least partially fill various holes in the first and second interlock features. The second polymer material may be different from the first polymer material and form an exterior surface of the sidewall 114. Each polymer having a fiber fill may have a fiber fill including glass or other types of fibers. In some embodiments, the second polymer material may also have a fiber fill, but have a fiber fill that differs from the fiber fill of the first polymer material.

Boss protrusions 1204, 1206 (e.g., screw bosses) may be formed (e.g., machined into) portions of the first housing segment 112a that extend inward from a lower surface of the first housing segment 112a (i.e., into a surface of the first housing segment 112a that is oriented toward the rear of a device). In some embodiments, the boss protrusions 1204, 1206 may be formed using the previously-described hole cutter. The boss protrusions 1204, 1206 may be tapped to receive screws that attach a flex circuit to each of the boss protrusions 1204, 1206, thereby attaching the flex circuit to the first housing segment 112a. The boss protrusion 1204 to the left in FIG. 12 may provide a ground connector, and the boss protrusion 1206 to the right may provide an antenna feed connector (alternatively referred to as just a "feed connector"). The boss protrusions 1204, 1206 may be formed on separate inward extensions of the first housing segment 112a, to increase the length of the conductive path (or increase the length of the resonant portion of the first housing segment 112a) therebetween.

FIGS. 13A-13D show various details of a device forehead (e.g., the portion of a device extending under, over, or above a top edge of a device display), and FIGS. 14A-14G show various details of a device chin (e.g., the portion of a device extending under, over, or below a bottom edge of a device display).

Figure 13A:
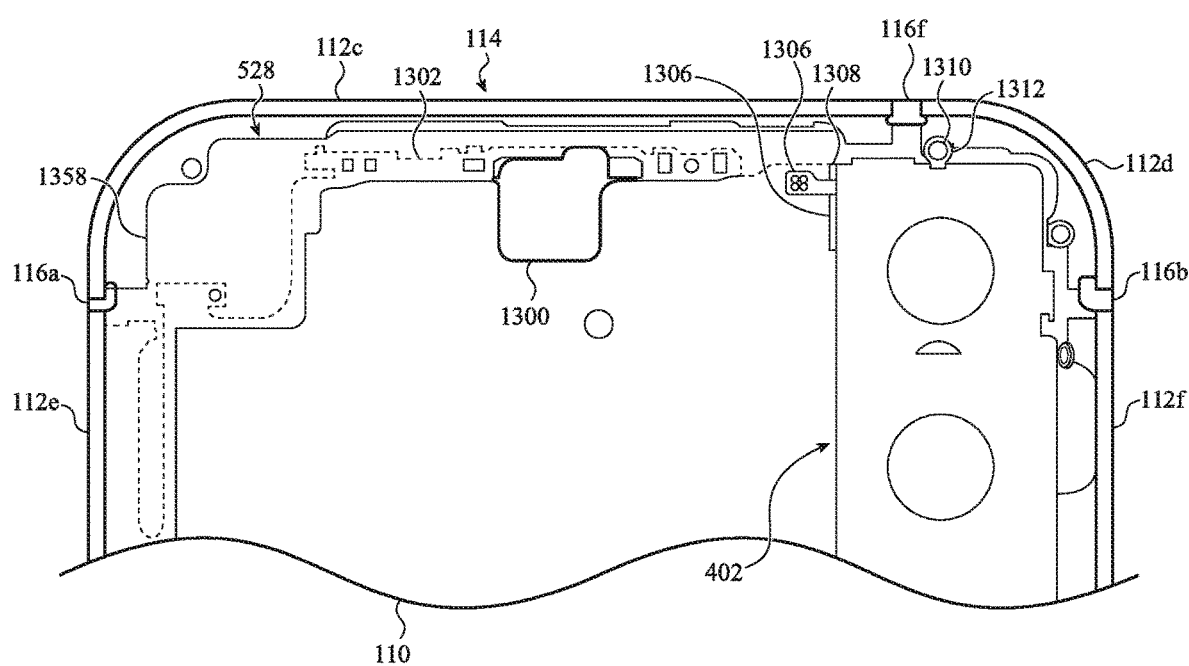
FIGS. 13A-13D show various details of a device forehead.

FIG. 13A shows a plan view of the third and fourth housing segments 112c, 112d described with reference to FIGS. 1A-1C, 2A, 3A, 4, 5A, 5C, 6A, 6B, & 10A-10C, and portions of the fifth and sixth housing segments 112e, 112f. FIG. 13A also shows a non-conductive housing component 528 that structurally couples all of these components, including portions 116a, 116b, 116f of the non-conductive housing component 528 that differ from another portion 1354 (e.g., a more rigid portion) of the non-conductive housing component 528 and form non-conductive segments or portions of the sidewall 114.

As shown, the support plate 110 may have a deep recess 1300 extending inward from an edge 1302 of the support plate 110 that is closer to the sidewall 114. The recess 1300 may accommodate the positioning of components attached to a flex circuit, and may enable the flex circuit to be positioned very close to the sidewall 114.

When the housing segments 112 are conductive and used as antennas, slots in the support plate 110 (e.g., slot 1304) may couple to the housing segments 112 and undesirably alter antenna operation or decrease antenna efficiency. In some embodiments, a parasitic slot in the support plate 110 (e.g., slot 1304) may be electrically closed or shorted (e.g., by welding a conductive component 1306 such as a strap between opposite edges of the slot 1304, at or near an open end 1308 of the slot 1304, or at other points between opposite edges of the slot 1304). Parasitic slots are slots that detract from antenna performance, and differ from slot antenna features that can be used to tune antenna performance.

FIG. 13A shows the camera brace 402 described with reference to FIG. 4. In some embodiments, the camera brace 402 may be grounded, and a ground connector 1310 of the fourth housing segment 112d may be coupled to ground via the grounded camera brace 402. Electrically coupling the ground connector 1310 of the fourth housing segment 112d to ground via the camera brace 402 may be easier than coupling the ground connector 1310 to a ground on a flex circuit given the small clearances between the camera brace 402 and adjacent housing segments 112c, 112d, 112f. However, because a device may be dropped on the corner including the fourth housing segment 112d, a welded or other rigid connection between the camera brace 402 and ground connector 1310 may have a tendency to break when the device is dropped. To mitigate the likelihood of the ground between the camera brace 402 and the ground connector 1310 being disrupted, the ground connector 1310 may be electrically coupled to the camera brace 402 using a compliant conductive component 1312, such as a compliant conductive tab or strap that extends from one of the camera brace 402 or ground connector 1310 and is welded to the other of the ground connector 1310 or camera brace 402. Alternatively, the compliant conductive component 1312 (e.g., a wire, strap, or thin metal plate) may be welded or otherwise electrically coupled to each of the camera brace 402 and ground connector 1310.

Figure 13B:
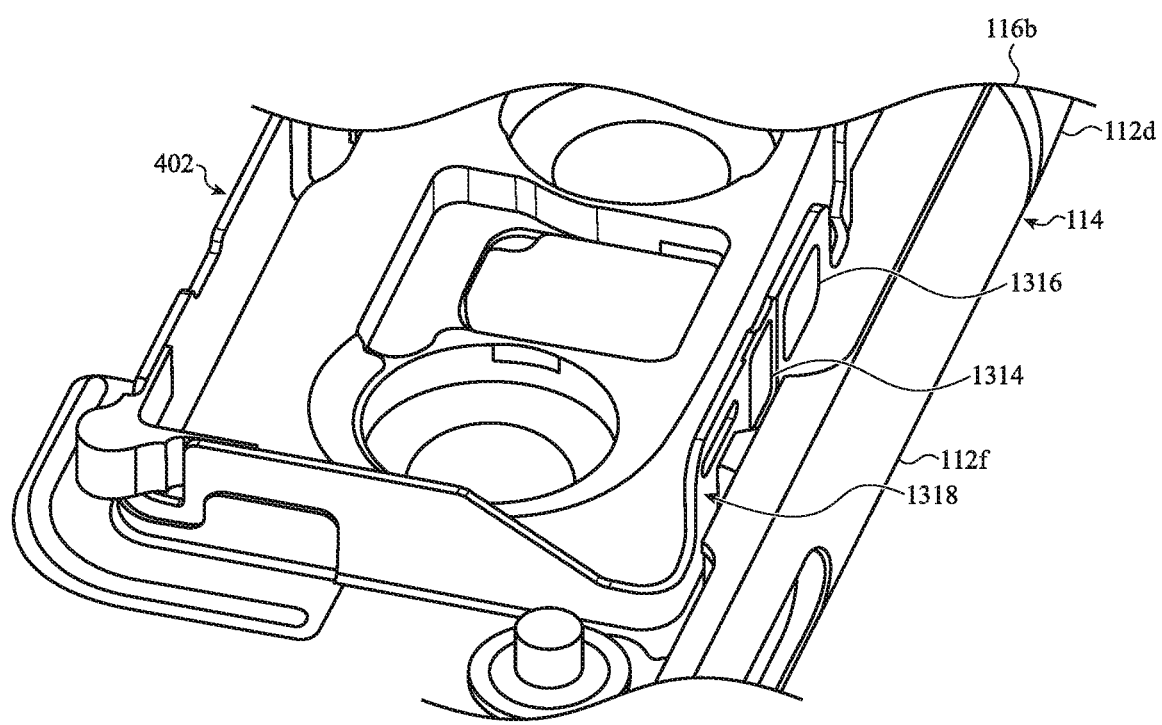

As shown in FIG. 13B, a ground pad 1314, to which a ground spring may be mated, may be formed on the camera brace 402. In some embodiments, the ground pad 1314 may be formed on a side 1316 of the camera brace 402 facing the sixth housing segment 112f (e.g., in a channel 1318 between the side 1316 of the camera brace 402 and the sixth housing segment 1120. To improve the electrically continuity of the ground connection and reduce ground noise, the ground pad 1314 may include a gold plate (or gold-plated plate) that is welded to the stainless steel or other conductive material that forms the camera brace 402. The ground spring that is mated to the ground pad 1314 may be formed on a flex circuit, which flex circuit is disposed in the channel 1318 with the ground spring facing and contacting the ground pad 1314 (the ground spring is not shown in FIG. 13B, but is shown in FIG. 17B). Gold-on-gold contact (e.g., a gold or gold-plated ground pad 1314 and ground spring) may be useful here and in other locations where spring contacts, and especially low-force spring contacts, are electrically coupled to a conductive pad. When an RF signal passes through a spring junction, the spring junction can introduce harmonics that interfere with wireless communication (e.g., particular wireless frequency bands). Gold-on-gold contact can reduce the likelihood or amplitude of such harmonics.

Figure 13C:
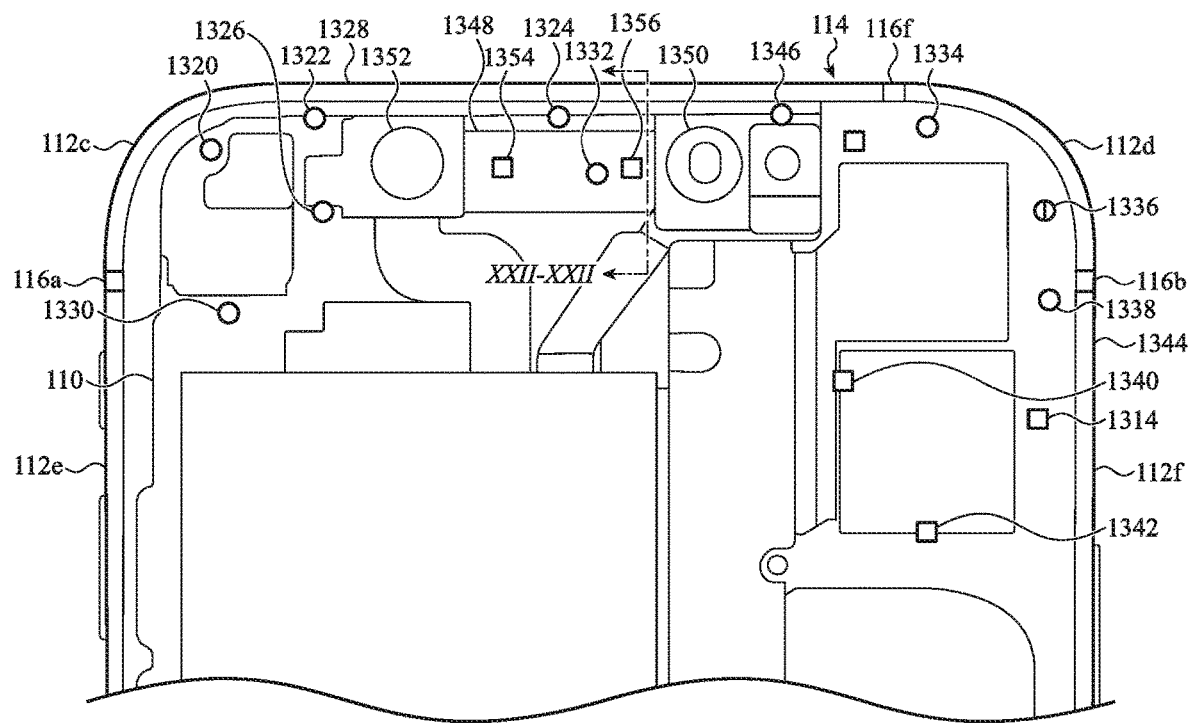

FIG. 13C shows internal structures and connections of the device forehead, as viewed while looking from the front of the device toward the rear of the device. The connections include various antenna connections made between the third, fourth, and fifth housing segments 112c, 112d, 112e and one or more antenna flex circuits. Examples of the antenna flex circuits are described in more detail with reference to FIGS. 17A & 17B. The antenna flex circuits may extend grounds to the ground connections of the housing segments 112c, 112d, 112e, carry signals to and from antenna feed connectors, and/or carry antenna tuning components (e.g., components that may be used to tune the resonance, frequency, or bandwidth of a housing segment that is operated as an antenna).

As shown in FIG. 13C, the third housing segment 112c may include a ground connector 1320, a feed connector 1322, and a tuning connector 1324. The ground connector 1320 may be electrically coupled to the support plate 110 (and thereby to ground) by a flex circuit that connects to both the ground connector 1320 and a ground connector 1326 on the support plate 110. In some embodiments, the ground connector 1320 may be positioned at the corner defined by the third housing segment 112c. The feed connector 1322 may be positioned in from the corner, along a top edge 1328 of a device. The tuning connector 1324 may be positioned near the center of the top edge 1328. Both the feed connector 1322 and the tuning connector 1324 may be electrically coupled to a flex circuit. In some embodiments, each of the ground connector 1320, the feed connector 1322, the tuning connector 1324, and the support plate ground connector 1326 may be electrically coupled to a common flex circuit, such as the flex circuit described with reference to FIG. 17B. The same flex circuit may also provide electrical connectors for grounding the fifth housing segment 112e (e.g., at a ground connector 1330), and tuning components that connect to the tuner ground connector 1332.

As also shown in FIG. 13C, the fourth housing segment 112d may also include a ground connector 1334, a feed connector 1336, and a tuning connector 1338. The ground connector 1334 may be electrically coupled to the camera brace 402 (e.g., using the compliant conductive component 1312 described with reference to FIG. 13A). A flex circuit, such as the flex circuit described with reference to FIG. 17B, may carry a ground spring that is mated to a ground pad on the camera brace 402 (e.g., the ground pad 1314 described with reference to FIG. 13B). The ground potentials of the flex circuit and the fourth housing segment 112d may therefore be electrically coupled through the camera brace 402. Other ground connections for the camera brace 402 may be made, for example, through the support plate 110 or camera module bias springs 1340, 1342 disposed at points along the perimeter of the camera brace 402. The ground and feed connectors 1334, 1336 for the fourth housing segment 112d may be disposed near opposite ends of the fourth housing segment 112d, and in some embodiments, the ground connector 1334 may be positioned more toward the top edge 1328 of the device, and the feed connector 1336 may be positioned more toward a side edge 1344 of the device. The tuning connector 1338 for the fourth housing segment 112d may be on the sixth housing segment 112f and may take the form of the boss protrusion described with reference to FIG. 6A. The tuning connector 1338 may be coupled to the flex circuit described with reference to FIG. 17B, which flex circuit may carry tuning components such as a circuit including a switch that may be operated to connect or disconnect the slot antenna feature 302d (see, FIG. 3A) defined between the sixth housing segment 112f and the support plate 110 to the fourth housing segment 112d.

The third housing segment 112c may in some cases have a Fargo feed connector 1346. The Fargo feed connector 1346 may be located along the top edge 1328 of the device, near the end of the third housing segment 112c that is adjacent the fourth housing segment 112d. The Fargo feed connector 1346 may alternatively be located in other places along the third housing segment 112c.

FIG. 13C shows example positions of a speaker 1348, camera 1350, and bio-authentication sensor 1352 (e.g., an infrared camera) that may be mounted in the device forehead. Ground connections 1354, 1356 for these components, or other components located in the device forehead, may be provided near the top edge 1328 of the device as shown.

Figure 13D:
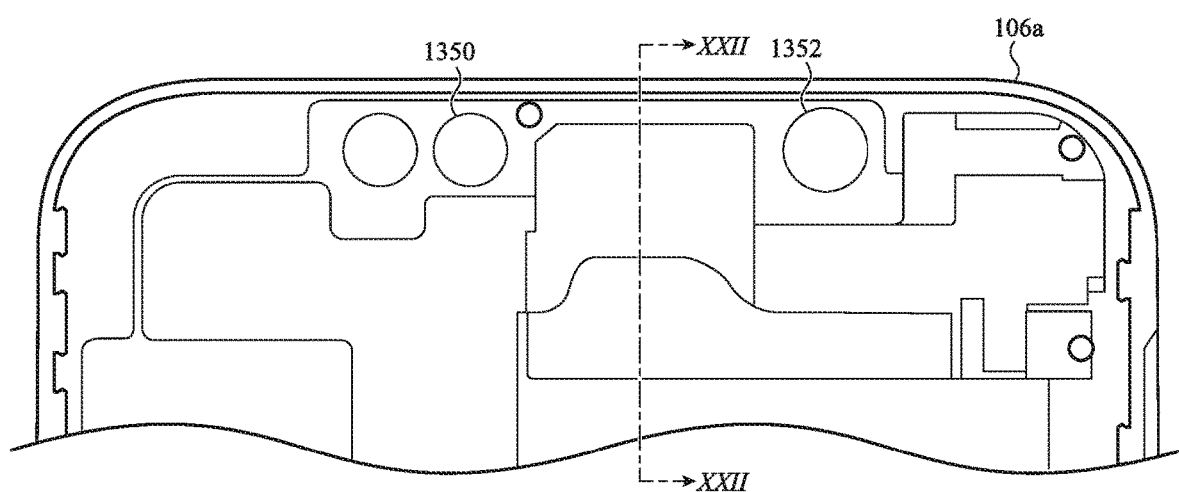
Figure 22:
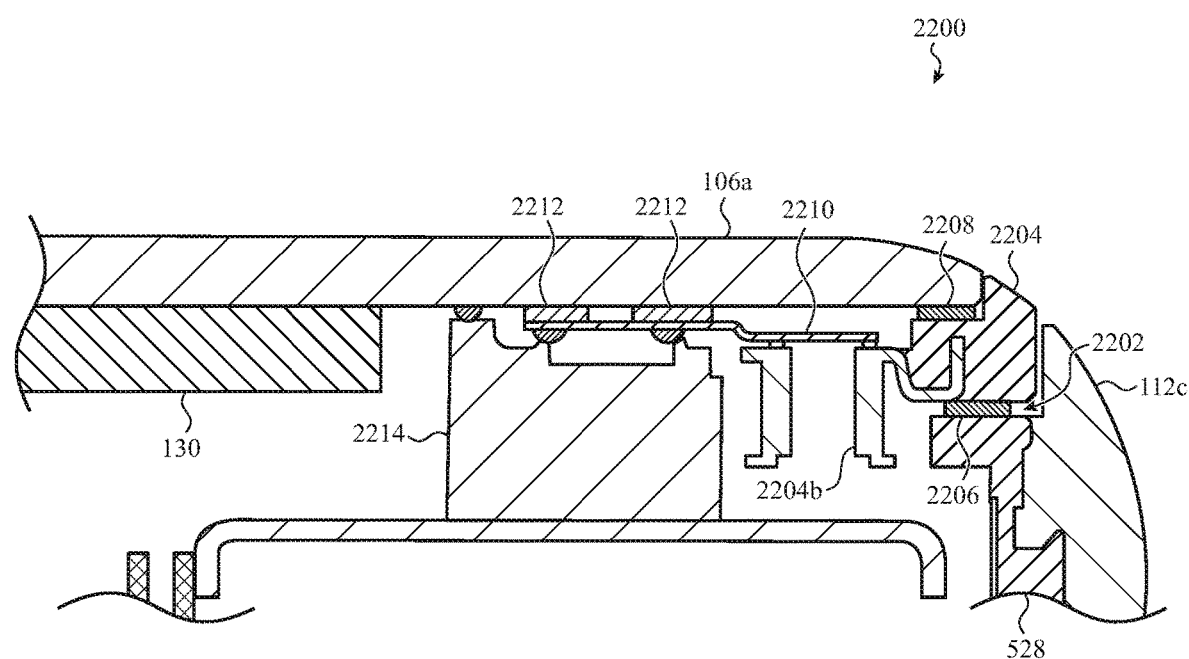
FIG. 22 shows a cross-section of the device forehead shown in FIG. 13D.

FIG. 13D shows additional internal structures and connections of the device forehead, as viewed while looking from the rear of a device toward the front cover 106a of the device. The structures include the camera 1350 and bio-authentication sensor 1352 described with reference to FIG. 13C. A cross-section of the device forehead is shown in FIG. 22.

Figure 14A:
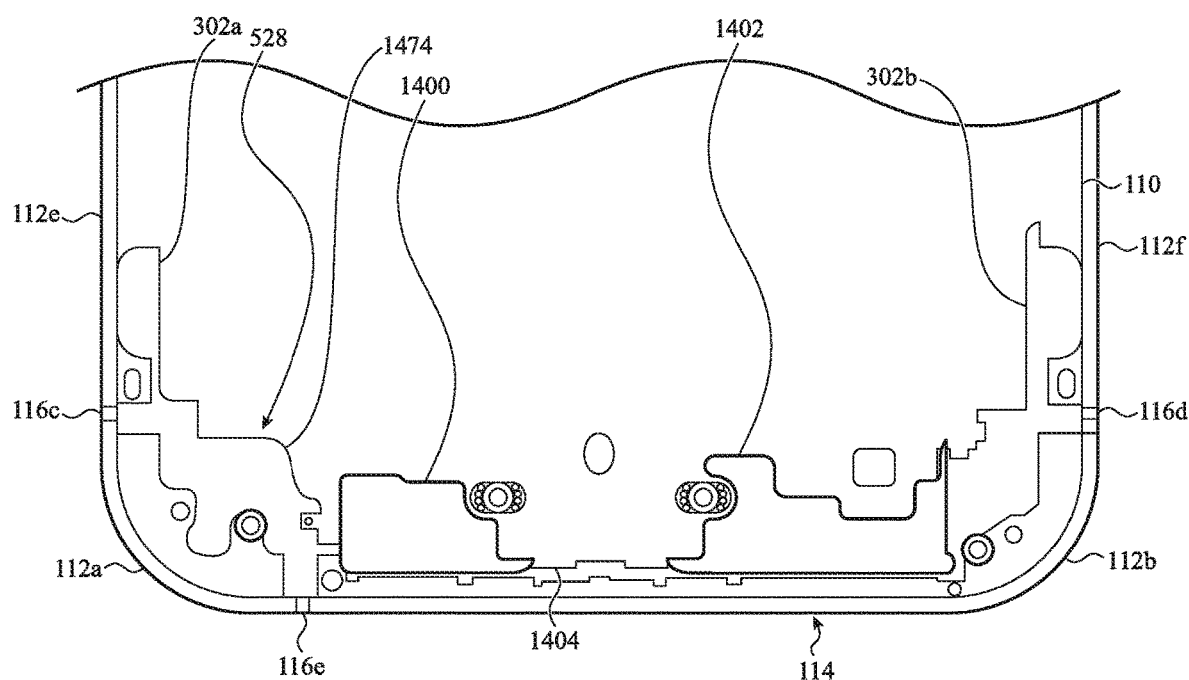
FIGS. 14A-14G show various details of a device chin.

Turning now to the device chin, FIG. 14A shows a plan view of the first and second housing segments 112a, 112b described with reference to FIGS. 1A-1C, 2A, 3A, 4, 7A, 7B, 8A, 8C, & 9A-9C, and portions of the fifth and sixth housing segments 112e, 112f. FIG. 14A also shows a non-conductive housing component 528 that structurally couples all of these components, including portions 116c, 116d, 116e of the non-conductive housing component 528 that differ from another portion 1474 of the non-conductive housing component and form non-conductive segments or portions of the sidewall 114.

As shown, the support plate 110 may have one or more deep recesses 1400, 1402 extending inward from an edge 1404 of the support plate 110 that is closer to the sidewall 114. The recesses 1400, 1402 may accommodate the positioning of components attached to a flex circuit, and may enable the flex circuit to be positioned very close to the sidewall 114.

A first slot antenna feature 302a may be formed between the fifth housing segment 112e and the support plate 110, and a second slot antenna feature 302b may be formed between the sixth housing segment 112f and the support plate.

Figure 14B:
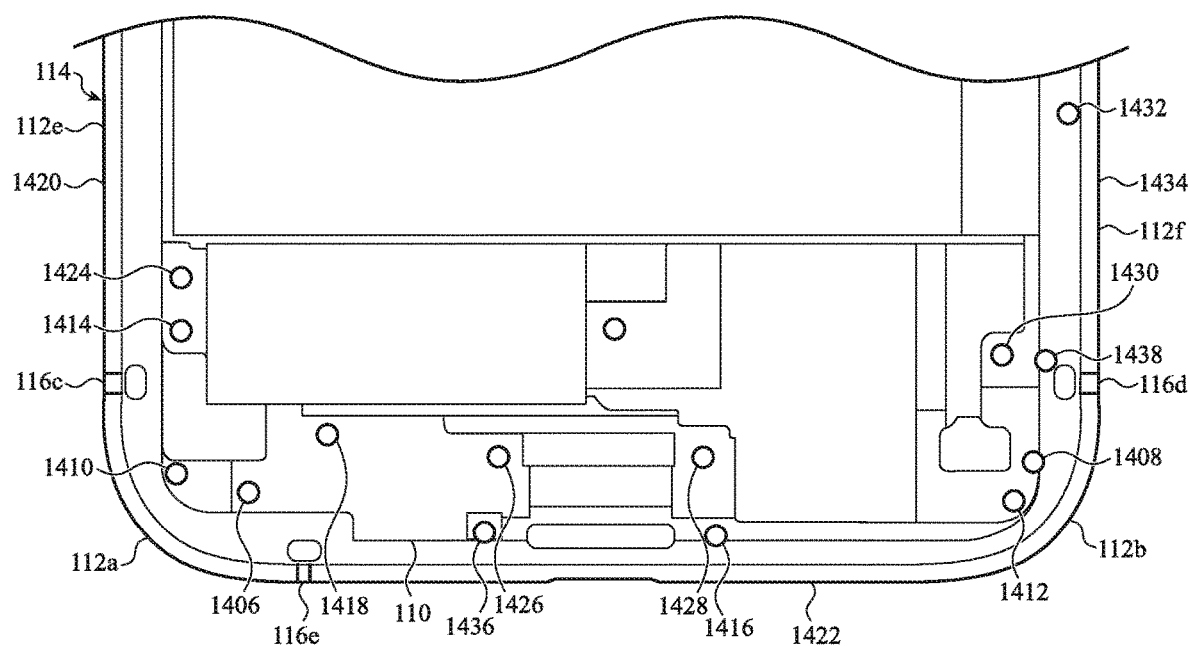

FIG. 14B shows internal structures and connections of the device chin, as viewed while looking from the front of a device toward the rear of the device. The connections include various antenna connections made between the first, second, fifth, and sixth housing segments 112a, 112b, 112e, 112f and one or more antenna flex circuits. Examples of the antenna flex circuits are described in more detail with reference to FIG. 17A. The antenna flex circuits may extend grounds to the ground connectors 1406, 1408 of the housing segments 112a, 112b, carry signals to and from the antenna feed connectors 1410, 1412, and carry antenna tuning components that are coupled to the tuning connectors 1414, 1416.

As shown in FIG. 14B, the first housing segment 112a may include a ground connector 1406, a feed connector 1410, and a tuning connector 1414. The ground connector 1406 may be electrically coupled to the support plate 110 (and thereby to ground) by a flex circuit that connects to both the ground connector 1406 and a ground connector 1418 on the support plate 110. In some embodiments, the ground connector 1406 may be positioned closer to the left edge 1420 of the device (away from the second housing segment 112*b*), and the feed connector 1410 may be positioned closer to the lower edge 1422 of the device. The tuning connector 1414 for the first housing segment 112*a* may be on the fifth housing segment 112*e* and take the form of the boss protrusion 724 described with reference to FIG. 7A. The tuning connector 1414 may be coupled to the flex circuit described with reference to FIG. 17A, which flex circuit may carry tuning components such as a circuit including a switch that may be operated to connect or disconnect the slot antenna feature 302*a* (see, FIG. 14A) defined between the fifth housing segment 112*e* and the support plate 110 to the first housing segment 112*a*. Points along the slot antenna feature 302*a* may be grounded to the support plate at connectors 1414 and 1424.

As also shown in FIG. 14B, the second housing segment 112*b* may also include a ground connector 1408, a feed connector 1412, and a tuning connector 1416. The ground connector 1408 may be electrically coupled to the support plate 110 (and thereby to ground) by a flex circuit that connects to the ground connector 1408 and one or more ground connectors 1426, 1428, 1430, 1432 on the support plate 110 or sixth housing segment 112*f*. In some embodiments, the ground connector 1408 may be positioned closer to the right edge 1434 of the device (away from the first housing segment 112*a*), and the feed connector 1412 may be positioned closer to the lower edge 1422 of the device. The tuning connector 1416 may be positioned near the center of the lower edge 1422. Both the feed connector 1412 and the tuning connector 1416 may be electrically coupled to a flex circuit. In some embodiments, each of the ground connector 1408, the feed connector 1412, the tuning connector 1416, and the support plate ground connectors 1426, 1428, 1430, 1432 may be electrically coupled to a common flex circuit, such as the flex circuit described with reference to FIG. 17A. The same flex circuit may also provide tuning components that connect to the tuning connector 1416.

The second housing segment 112*b* may in some cases include an alternative ground, feed, and/or tuning connector (e.g., the feed/tuning connector 1436). These alternative connectors may be coupled to the same flex circuit as the other ground, feed, and tuning connectors 1408, 1412, 1416, but may be positioned closer to the first housing segment 112*a* than the other ground, feed, and tuning connectors 1408, 1412, 1416. an additional tuning connector 1438 on the sixth housing segment 112*f*, which may take the form of the boss protrusion 824 described with reference to FIG. 8A. The tuning connector 1438 may be coupled to the flex circuit described with reference to FIG. 17A, which flex circuit may carry tuning components such as a circuit including a switch that may be operated to connect or disconnect the slot antenna feature 302*b* (see, FIG. 14A) defined between the sixth housing segment 112*f* and the support plate 110 to the second housing segment 112*b*.

Figure 14C:
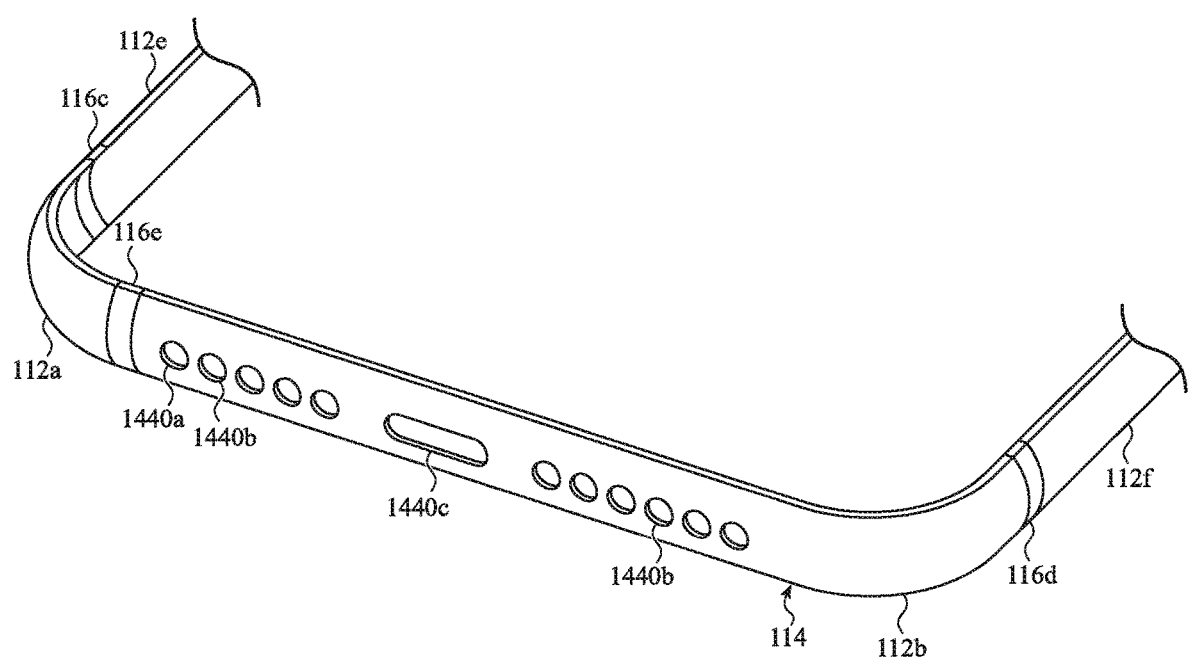

FIG. 14C shows an exterior isometric view of the second housing segment 112*b*. A number of ports 1440 (through holes) may be formed in the second housing segment 112*b*. The ports may include ports such as an ambient pressure sensing port 1440*a* (e.g., a barometric pressure sensing port) of the device, a second one or more ports 1440*b* that function as speaker or microphone ports, and a power port 1440*c* for receiving a power cord. Other ports may also be provided, or some of the ports 1440 shown may be repurposed. For example, the second housing segment 112*b* may include an audio jack, video port, or audio/visual (A/V) port. In some embodiments, one or more of the ports 1440 shown may not be provided or have a different shape. By way of example, all of the ports 1440 but the power port 1440*c* are shown to have a round shape along the exterior surface of the second housing segment 112*b*. The power port 1440*c* is shown to be oblong. FIG. 14C shows four speaker ports 1440*b* disposed to the left of the power port 1440*c* and six speaker ports 1440*b* disposed to the right of the power port 1440*c*. Alternatively, the same number of speaker ports 1440*b* may be provided on either side of the power port 1440*c*, or a different number of speaker ports 1440*b* may be provided.

Figure 14D:
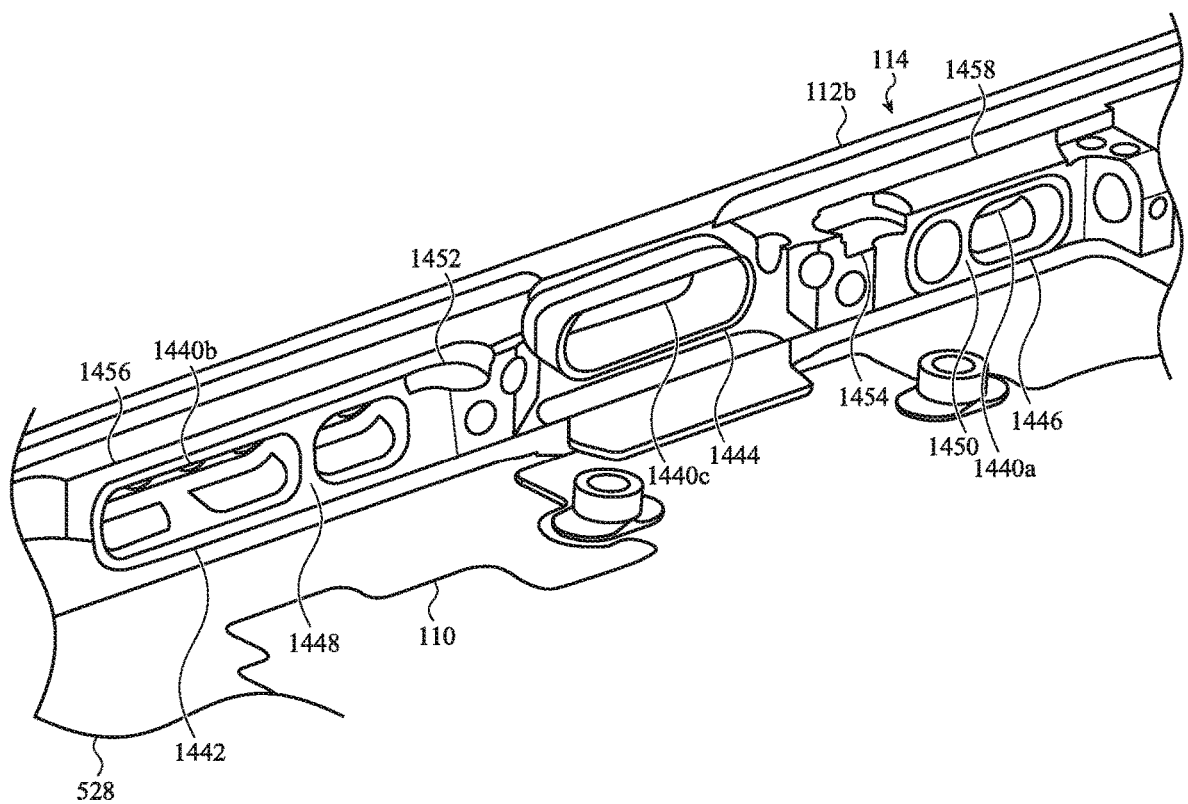

FIG. 14D shows an interior isometric view of the second housing segment 112*b*. As shown, walls 1442, 1444, 1446 may surround individual ones or sets of some of the ports 1440 formed in the second housing segment 112*b*. The walls 1442, 1444, 1446 may extend inward from the second housing segment 112*b* and provide a set of surfaces that may function as sealing surfaces. For example, gaskets or other components may be mated to a first sealing surface 1448 formed around the speaker ports 1440*b* located to the left of the power port 1440*c*, and to a second sealing surface 1450 formed around the speaker ports 1440*b* and ambient pressure sensing port 1440*a* located to the right of the power port 1440*c*. In some embodiments, portions 1452, 1454 of the second housing segment 112*b* may be removed to alter (e.g., reduce) the capacitance between the second housing segment 112*b* and other conductive structures in the chin area. For example, portions 1452, 1454 of the second housing segment 112*b* (e.g., portions 1452, 1454 on either side of the power port 1440*c*) may be removed to reduce the capacitance between the second housing segment 112*b* and a grounded element attached to a cover fitted to the housing segments 112 that form the sidewall 114. When portions 1452, 1454 of the upper surface of the second housing segment 112*b* are removed, other portions 1456, 1458 may remain to provide a support surface for the cover and retain the structural and sealing surface integrity of the second housing segment 112*b*.

Figure 14E:
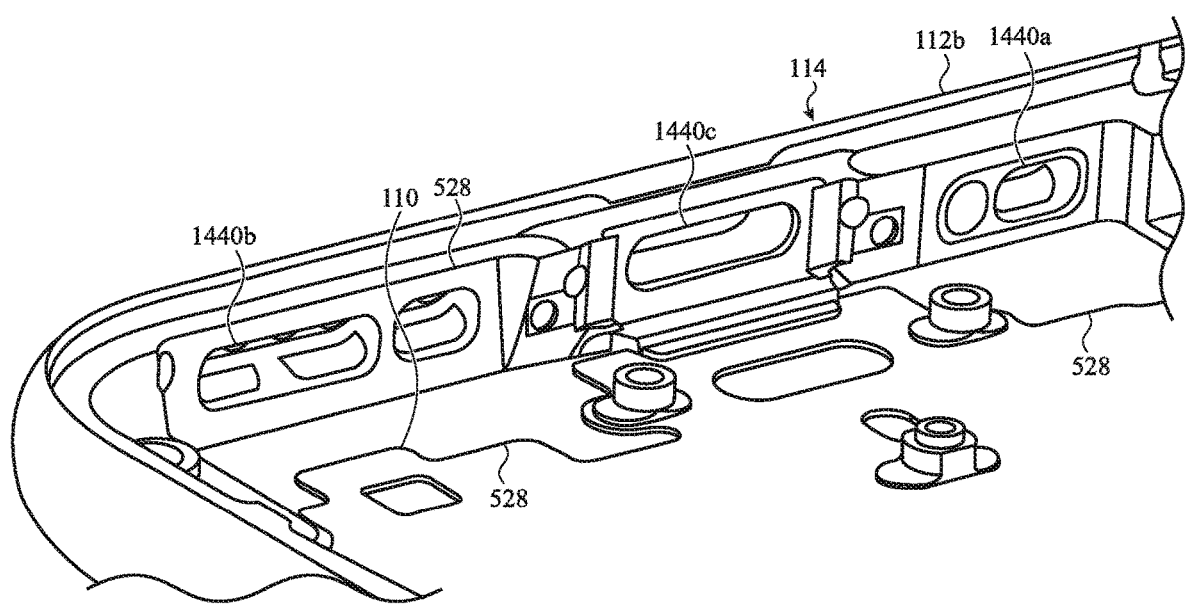

FIG. 14E shows the second housing segment 112*b* from the same angle as FIG. 14D, but additionally provides an example of how a conductive housing component (e.g., conductive housing components 528 and 116*e*) may be disposed around the sealing surfaces 1448, 1450 described with reference to FIG. 14D. In some embodiments, the same non-conductive housing component 528 used to structurally couple adjacent interlock features of adjacent housing segments 112 may also be disposed around the walls 1442, 1444, 1446 that provide the sealing surfaces 1448, 1450.

Figure 14F:
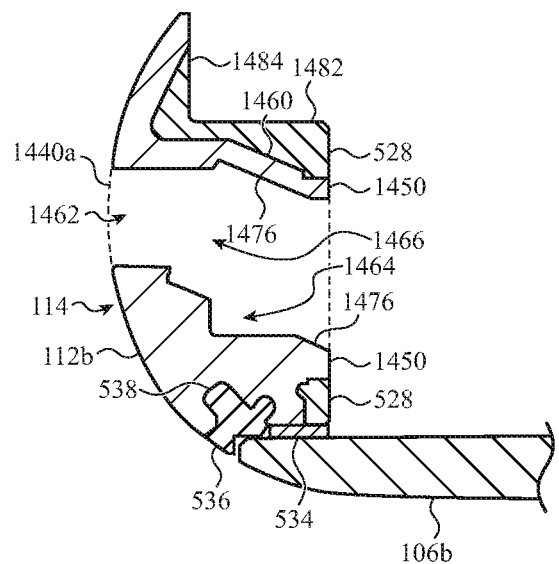
Figure 14G:
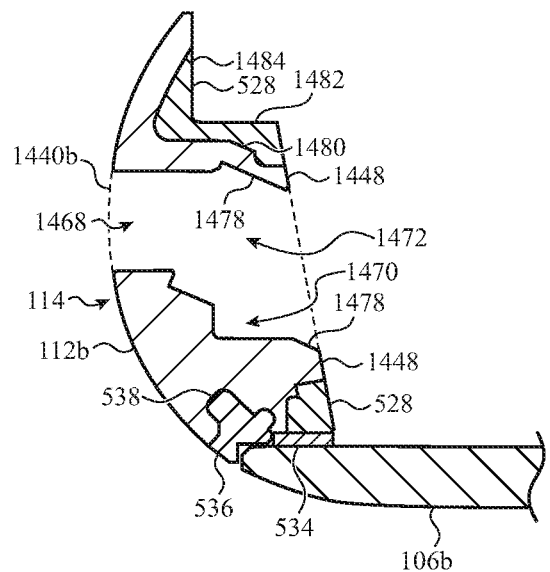

FIG. 14F shows a cross-section of the second housing segment 112*b*, taken through one of the ports (e.g., 1440*a* or 1440*b*) disposed to the right of the power port 1440*c* in FIG. 14E. FIG. 14G shows a cross-section of the second housing segment 112*b* taken through one of the ports 1440*b* disposed to the left of the power port 1440*c* in FIG. 14E. As shown in FIG. 14F, a portion of the ambient pressure sensing port 1440*a* (and similarly, all of the ports 1440 to the right of the power port 1440*c* in FIG. 14E) may have an inner surface 1476 or bore that extends toward a rear cover 106*b* of a device as the inner surface 1476 extends into the device. The upper wall 1460 of the port 1440*a* (i.e., that portion of the wall that faces the front cover of the device) may also extend toward the rear cover 106*b* as the upper wall 1460 extends into the device. The angled port 1440*a*, and in particular the angled upper wall 1460 of the port 1440*a*, may help to further reduce the capacitance between the second housing segment 112*b* and a conductive element attached to a front cover supported by the second housing segment 112a. The ambient pressure sensing port 1440a (and other ports 1440) may be angled downward (i.e., toward the rear cover 106b) at an angle that balances capacitance reduction with access to the port 1440a (e.g., assuming that one or more components need to be inserted into the port 1440a from interior to the device). In some embodiments, the sealing surface 1450 around the inner inlet to the port 1440a may extend perpendicular to an inner surface of the rear cover 106b.

In some embodiments, the entirety of a port 1440 may be angled toward the rear cover 106b. In other embodiments, and as shown in FIGS. 14F & 14G, only a portion of a port 1440 may be angled toward the rear cover 106b. In some cases, a port 1440 may be formed as a result of multiple drilling or end-milling operations. For example, the port shown in FIG. 14F may be formed by drilling a first hole 1462 perpendicular to the sidewall 114, from outside the sidewall 114. A second hole 1464 may be drilled perpendicular to the sidewall 114 from inside the sidewall 114. The first and second holes 1462, 1464 may be offset, and may or may not intersect. A third hole 1466 may be drilled from inside the sidewall 114, at an angle between perpendicular and parallel to the first and second holes 1462, 1464. In some embodiments, the third hole 1466 may be drilled at an angle of about 30 degrees (±10%) with reference to the first and second holes 1462, 1464. The third hole 1466 may intersect both the first hole 1462 and the second hole 1464, but may not extend through to the exterior surface of the second housing segment 112b. In alternative embodiments, the third hole 1466 may be drilled at an angle of between 15 degrees and 45 degrees, or at another angle.

As shown in FIG. 14G, a portion of a speaker port 1440b (and similarly, all of the ports 1440 to the left of the power port 1440c in FIG. 14E) may have an inner surface 1478 or bore that extends toward a rear cover 106b of a device as the inner surface 1478 extends into the device. The upper wall 1480 of the port 1440b may also extend toward the rear cover 106b as the upper wall 1480 extends into the device. In general, the speaker port 1440b may be angled similarly to the ambient pressure sensing port 1440a described with reference to FIG. 14F. However, in contrast to the sealing surface 1450 around the inner inlet of the ambient pressure sensing port 1440a, the sealing surface 1448 around the speaker port 1440b may be sloped with respect to the rear cover 106b of the device. The configuration shown in FIG. 14G may also reduce the capacitance between the second housing segment 112b and other conductive structures in the chin area. The slope of the sealing surface 1448 may be sloped to different degrees, or not sloped, to balance capacitance reduction and maintenance of structural rigidity (e.g., the port cross-section shown in FIG. 14F may have greater structural rigidity than the port cross-section shown in FIG. 14G, but the port cross-section shown in FIG. 14G may provide further capacitance reduction over the port cross-section shown in FIG. 14F).

In some embodiments, the port shown in FIG. 14G may be formed by drilling a first hole 1468 perpendicular to the sidewall 114, from outside the sidewall 114. A second hole 1470 may be drilled perpendicular to the sidewall 114 from inside the sidewall 114. The first and second holes 1468, 1470 may be offset, and may or may not intersect. A third hole 1472 may be drilled from inside the sidewall 114, at an angle between perpendicular and parallel to the first and second holes 1468, 1470. In some embodiments, the third hole 1472 may be drilled at an angle of about 30 degrees (±10%) with reference to the first and second holes 1468, 1470. The third hole 1472 may intersect both the first hole 1468 and the second hole 1470, but may not extend through to the exterior surface of the second housing segment 112b. In alternative embodiments, the third hole 1472 may be drilled at an angle of between 15 degrees and 45 degrees, or at another angle.

In each of FIGS. 14F & 14G, a non-conductive housing component 528 extends along an inner, upper surface of the sidewall 114 and forms a ledge 1482 and border 1484 that may support and surround a display (e.g., the display 104 described with reference to FIGS. 1A-1C). The portions of the non-conductive housing component 528 that extend along the inner, upper surface of the sidewall 114 (e.g., border 1484) can help absorb crushing loads on the sidewall 114 and/or transfer crushing loads upward along the sidewall—away from a display.

Figure 15A:
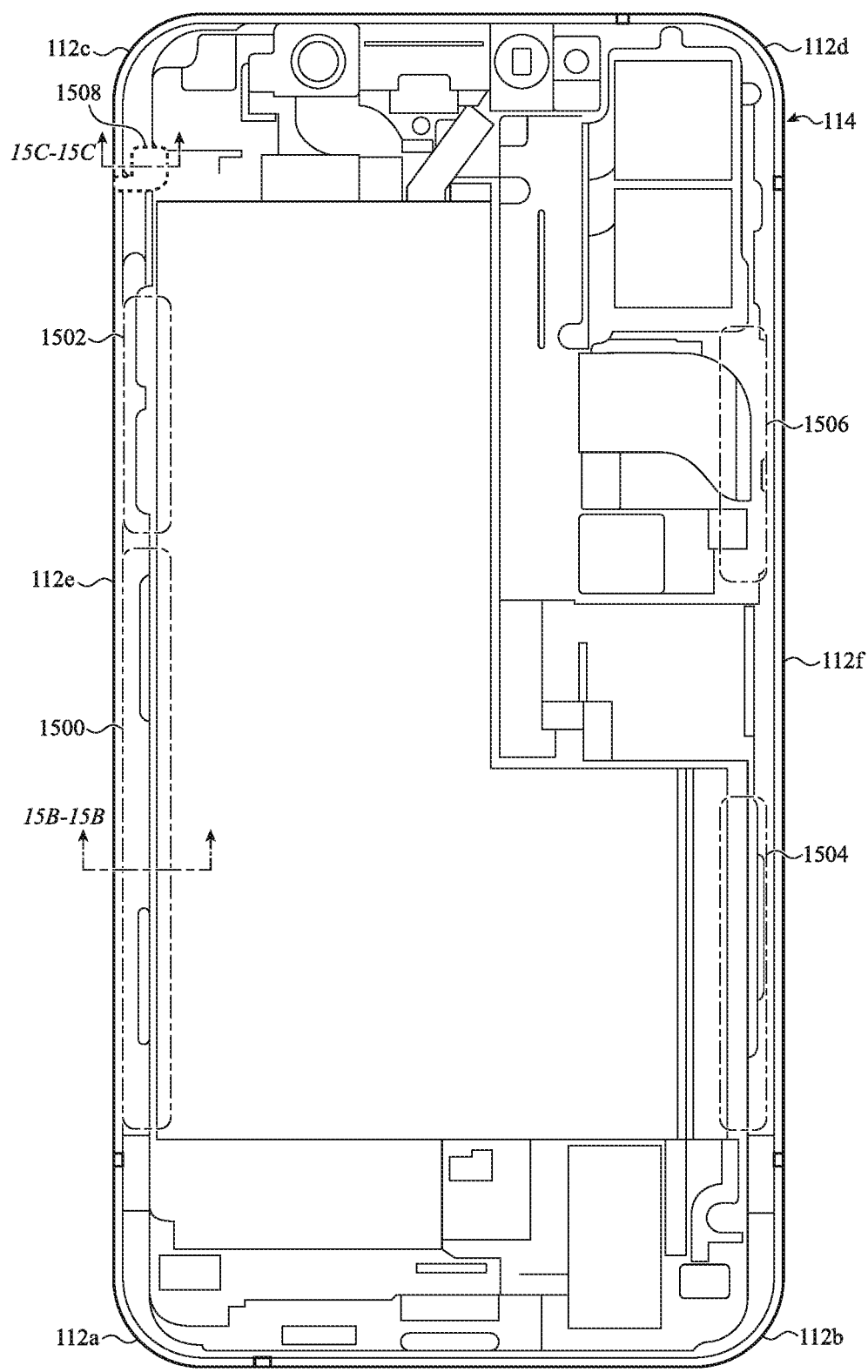
FIGS. 15A-15C show example areas where the fifth and sixth housing segments described with reference to FIGS. 1A-1C, 2A, 3A-3C, 4, 5A, 5B, 6A, 6C, 7A, 7C, 8A, & 8B may be structurally coupled to a support plate.
Figure 15B:
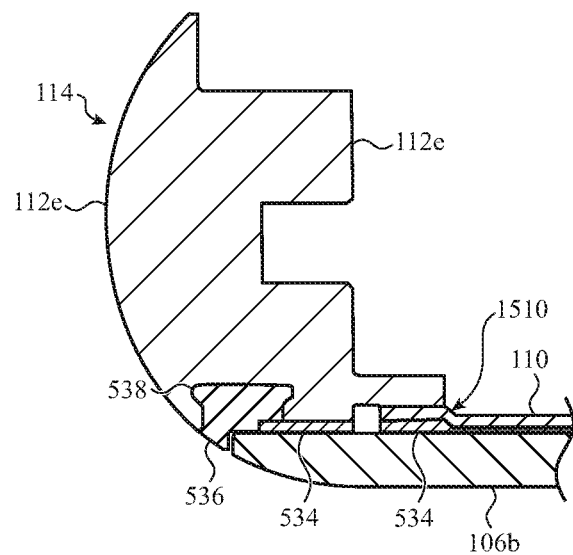
Figure 15C:
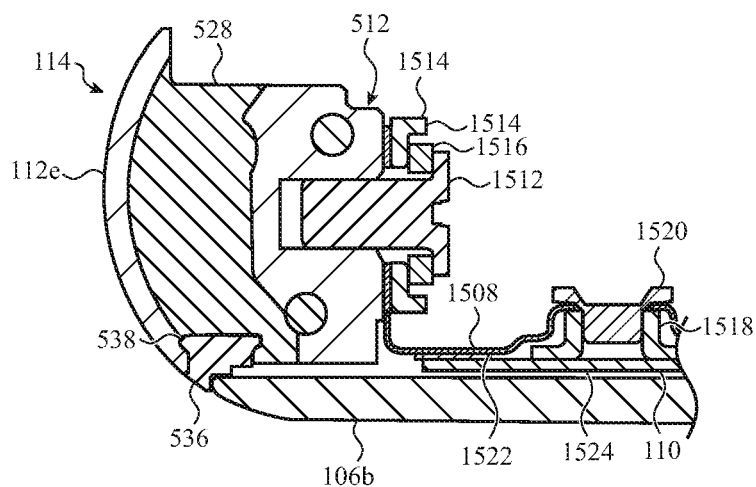

Referring now to FIGS. 15A-15C, there are shown example areas 1500, 1502, 1504, 1506 where the fifth and sixth housing segments 112e, 112f described with reference to FIGS. 1A-1C, 2A, 3A-3C, 4, 5A, 5B, 6A, 6C, 7A, 7C, 8A, & 8B may be structurally coupled to the support plate 110 described with reference to FIGS. 4, 13A, & 14A. As shown in FIG. 15A, the fifth housing segment 115e may be structurally and electrically coupled to the support plate 110 by a pair of welds at areas 1500, 1502 along the left edge of the support plate 110, and the sixth housing segment 112f may be structurally and electrically coupled to the support plate 110 by a pair of welds at areas 1504, 1506 along the right edge of the support plate 110. In some embodiments, the welds may be laser welds. In some embodiments, the welds may be longitudinal welds, as shown. In some embodiments, the longitudinal welds may be replaced by, or supplemented with, spot welds.

The fifth housing segment 112e may have an aperture in which a button assembly may be mounted, as discussed with reference to FIG. 6A. At the end of the fifth housing segment 112e adjacent the third housing segment 112c, there may be little room for a weld and the fifth housing segment 112e may be structurally and electrically coupled to the support plate 110 by a clip 1508. Example cross-sections of the welds and clip 1508 shown in FIG. 15A are shown in FIGS. 15B & 15C respectively.

FIG. 15B shows an example cross-section of one of the welds 1510 described with reference to FIG. 15A. The weld 1510 may be a weld that directly welds the fifth or sixth housing segment 112e or 112f to the support plate 110. In some embodiments, a rear cover (e.g., the rear cover 106b described with reference to FIGS. 1A-1C) may be bonded to a lower surface of the fifth or sixth housing segment 112e or 112f by an adhesive 534. A seal 536 may be inserted into a groove 538 formed in a lower surface of each housing segment 112e, 112f and extend parallel to the sidewall 114. The seal 536 and adhesive 534 may help prevent moisture from entering a device between the housing segments 112e, 112f and rear cover 106b.

FIG. 15C shows an example cross-section of the clip 1508 described with reference to FIG. 15A. By way of example, the clip 1508 may be aligned with and surround a threaded hole in the boss protrusion 512 described with reference to FIG. 5A, and may be electrically coupled to the fifth housing segment 112e by a screw 1512 that is inserted through a hole in the clip 1508 and threaded into the boss protrusion 512. The screw 1512 may also retain a bracket 1514 for a button assembly and a washer 1516. The clip 1508 may extend toward the rear cover 106b of the device and bend one or more times to extend over a portion of the support plate 110 and over and around a boss protrusion 1518 formed in or mechanically coupled to the support plate 110. The clip 1508 may be retained to the boss protrusion 1518 by a screw 1520 that is inserted through a hole in the clip 1508 and threaded into the boss protrusion 1518. A portion of the clip 1508 that extends over the support plate 110 may be welded to the support plate 110 (e.g., by weld 1522) to provide extra rigidity for the structural coupling of the fifth housing segment 112e to the support plate 110.

In some embodiments, a rear cover (e.g., the rear cover 106b described with reference to FIGS. 1A-1C) may be bonded to a lower surface of the support plate 110 by an adhesive 1524. A seal 536 may be inserted into a groove 538 formed in a lower surface of each housing segment 112e, 112f and extend parallel to the sidewall 114. The seal 536 and adhesive 1524 may help prevent moisture from entering a device between the housing segments 112e, 112f and rear cover 106b.

Figure 16A:
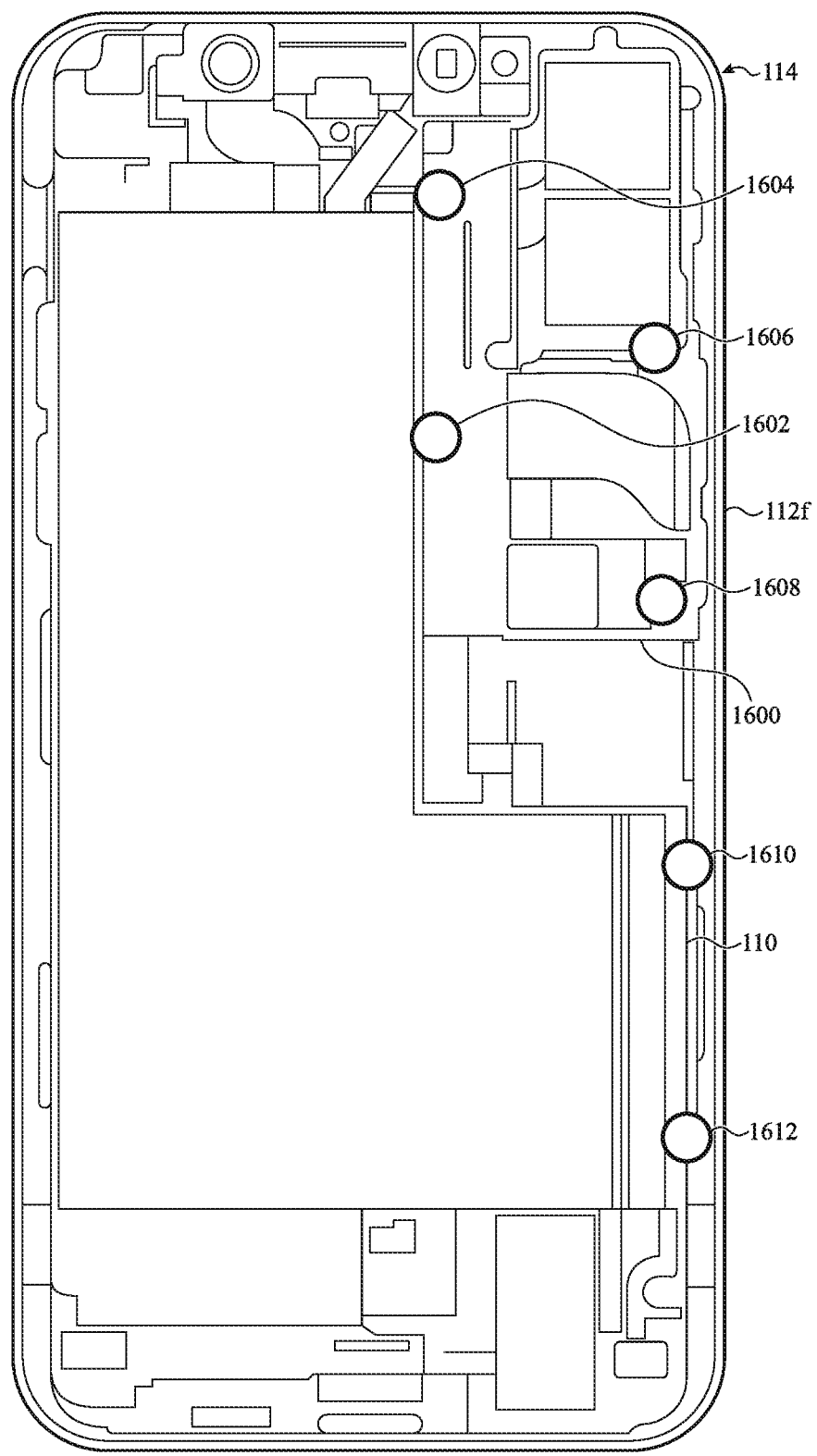
FIGS. 16A-16D illustrate various example ground connections between a support plate and a printed circuit board or logic board.

FIGS. 16A-16D illustrate various example ground connections between the support plate 110 described with reference to FIGS. 3A-3C, 4, 13A, 14A, & 15A and a printed circuit board or logic board 1600. As shown in FIG. 16A, the ground connections may include a first ground connection 1602, which may be configured as a single ground connection between the support plate 110 and the logic board 1600; a second ground connection 1604, which may be configured as a double ground connection between the support plate 110 and the logic board 1600; a third ground connection 1606, which may be configured as a single Stockholm ground connection between the support plate 110 and the logic board 1600; and a fourth ground connection 1608, which may be configured as a single ground connection between the support plate 110 and the logic board 1600, and may be coupled to the sixth housing segment 112f. In some embodiments, the antenna flex circuit described with reference to FIG. 17B may be coupled to each of the second ground connection 1604 and the third ground connection 1606. The antenna flex circuit described with reference to FIG. 17A may be coupled to first and second ground connections 1610, 1612 along the lower part of the sixth housing segment 112f.

Figure 16B:
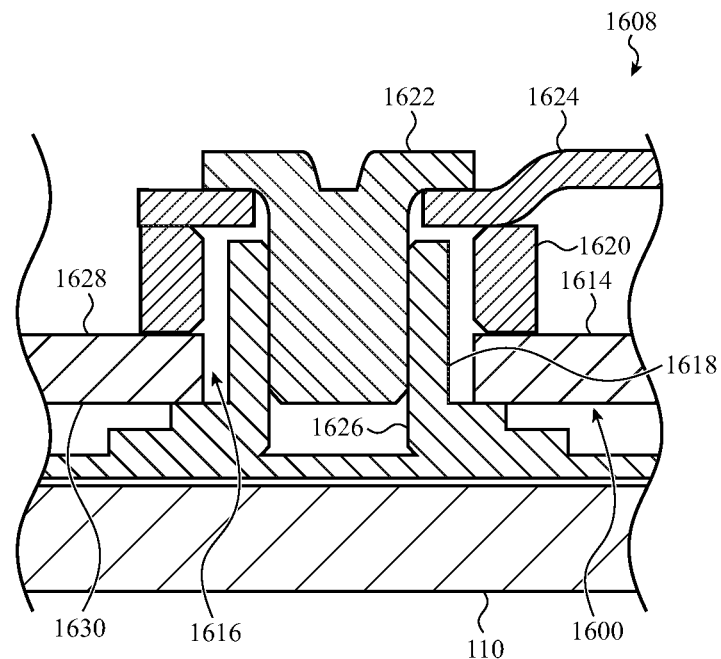

FIG. 16B shows an example of the single ground connection 1608 between the support plate 110 and the logic board 1600. As shown, the logic board 1600 may include a single layer 1614 having a hole 1616 that receives a boss protrusion 1618. The boss protrusion 1618 may be mechanically and electrically coupled to the support plate 110. The logic board 1600 may abut the periphery of the boss protrusion 1618. A spacer 1620 may be placed around the boss protrusion 1618 and rest on the logic board 1600. A screw 1622 may be inserted through a ground connection eye 1624 on the flex circuit shown in FIG. 17B and screwed into a hole 1626 in the boss protrusion 1618, slightly compressing the ground connection eye 1624 against the spacer 1620, compressing the spacer 1620 against the logic board 1600, and compressing the logic board 1600 against the periphery of the boss protrusion 1618. The single ground connection 1608 may ground conductive traces on the major surfaces 1628, 1630 of the logic board 1600 to the support plate 110.

Figure 16C:
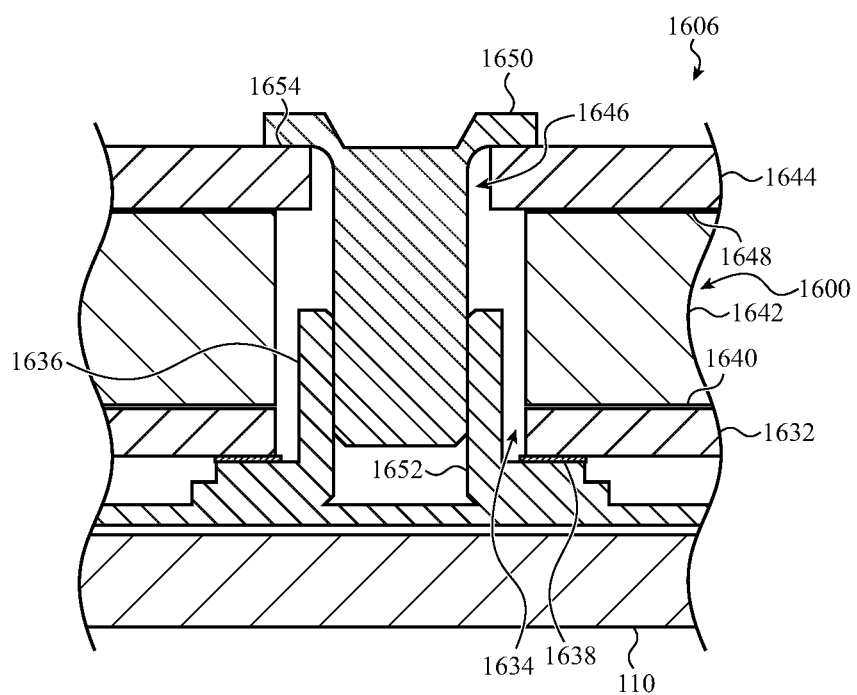

FIG. 16C shows an example of the single Stockholm ground connection 1606 between the support plate 110 and the logic board 1600. As shown, the logic board 1600 may include a first layer 1632 or logic board having a hole 1634 that receives a boss protrusion 1636. The boss protrusion 1636 may be mechanically and electrically coupled to the support plate 110. The first layer 1632 or logic board may abut the periphery of the boss protrusion 1636 and have a dielectric 1638 on its lower surface, and a layer 1640 (e.g., a conductive layer or a dielectric layer) on its upper surface. The dielectric 1638 may electrically insulate the first layer 1632 or logic board from the support plate 110. A logic board interposer 1642 (e.g., a conductive or dielectric interposer) may be placed around the boss protrusion 1636 and rest on the layer 1640 on the upper surface of the first layer 1632 or logic board. The logic board 1600 may further include a second layer 1644 or logic board having a hole 1646 aligned with the boss protrusion 1636. The second layer 1644 or logic board may have a layer 1648 (e.g., a conductive or dielectric layer) on its lower surface. The layer 1648 may rest on the logic board interposer 1642. A screw 1650 may be inserted through aligned holes in the second layer 1644 or logic board, the logic board interposer 1642, and the first layer 1632 or logic board, and may be screwed into a hole 1652 in the boss protrusion 1636, slightly compressing the first layer 1632 or logic board against the logic board interposer 1642, compressing the logic board interposer 1642 against the first layer 1632 or logic board, and compressing the first layer 1632 or logic board against the periphery of the boss protrusion 1636. The Stockholm ground connector 1606 may ground conductive traces 1654 (e.g., copper traces) on the upper surface of the second layer 1644 or logic board to the support plate 110, but electrically insulate the first layer 1632 or logic board from the support plate 110 (or only electrically connect the first layer 1632 or logic board to ground through the logic board interposer 1642 and second layer 1644 or logic board).

Figure 16D:
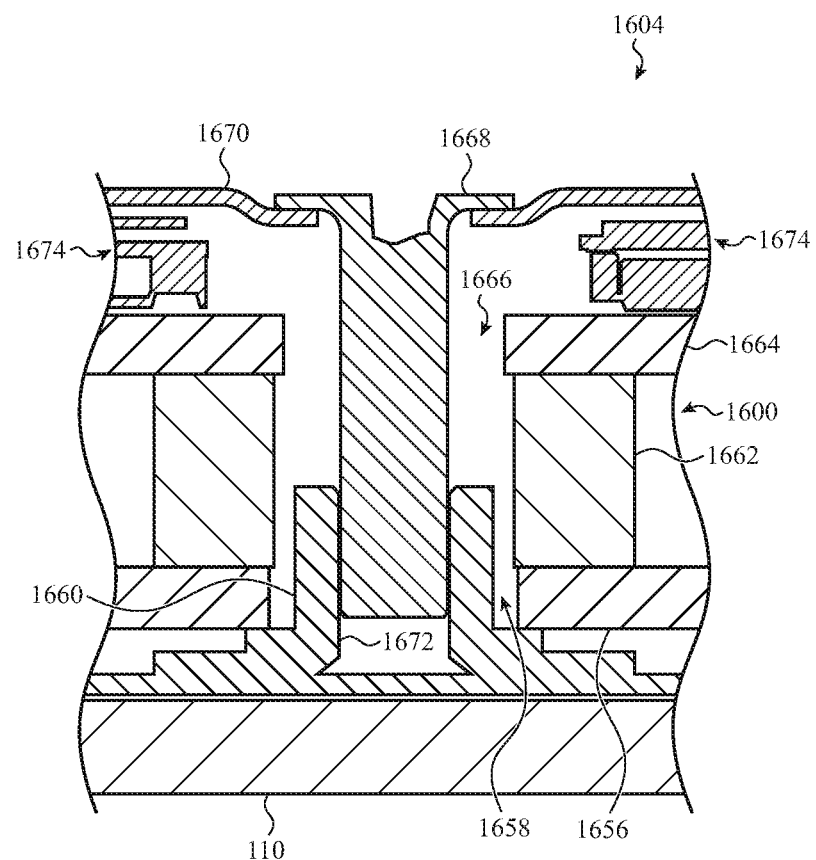

FIG. 16D shows an example of the double ground connection 1604 between the support plate 110 and the logic board 1600. As shown, the logic board 1600 may include a first layer 1656 or logic board having a hole 1658 that receives a boss protrusion 1660. The boss protrusion 1660 may be mechanically and electrically coupled to the support plate 110. The first layer 1656 or logic board may abut the periphery of the boss protrusion 1660. A logic board interposer 1662 may be placed around the boss protrusion 1660 and rest on the first layer 1656 or logic board. The logic board 1600 may further include a second layer 1664 or logic board that rests on the logic board interposer 1662 and has a hole 1666 aligned with the boss protrusion 1660. A screw 1668 may be inserted through a ground connection eye 1670 on the flex circuit shown in FIG. 17B and through aligned holes in the second layer 1664 or logic board, the logic board interposer 1662, and the first layer 1656 or logic board, and may be screwed into a hole 1672 in the boss protrusion 1660, slightly compressing the ground connection eye 1670 against the second layer 1664 or logic board (with other conductive components 1674 sometimes forming part of a conductive path between the ground connection eye 1670 and the second layer 1664 or logic board), compressing the second layer 1664 or logic board against the logic board interposer 1662, compressing the logic board interposer 1662 against the first layer 1656 or logic board, and compressing the first layer 1656 or logic board against the periphery of the boss protrusion 1660. The double ground connection 1604 may ground each of the first layer 1656 or logic board and the second layer 1664 or logic board to the support plate 110.

Figure 17A:
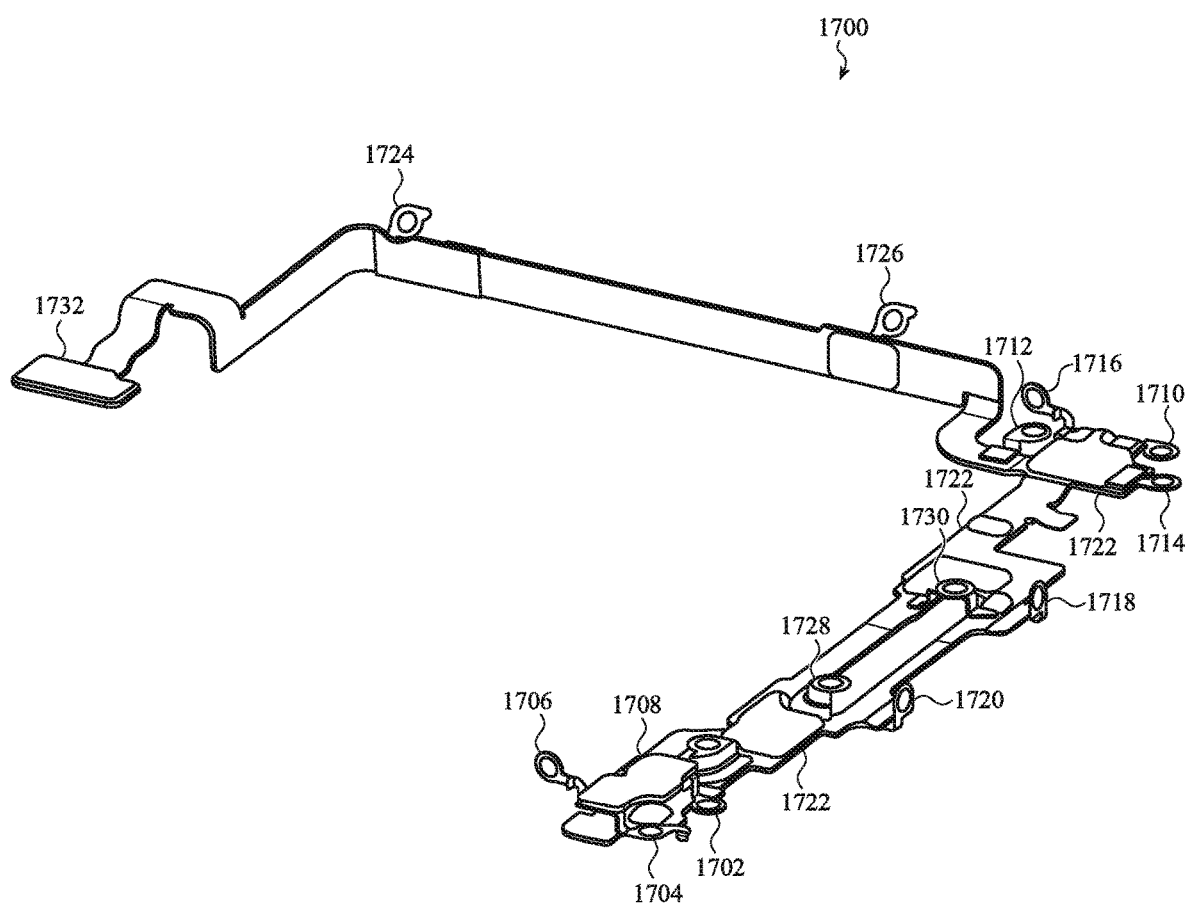
FIGS. 17A & 17B show flex circuits that may be coupled to various ones of the housing segments described with reference to FIGS. 1A-1C, 2A, 3A, 4, 5A-10C, 13A-13D, 14A-14G, & 15A-15C.
Figure 17B:
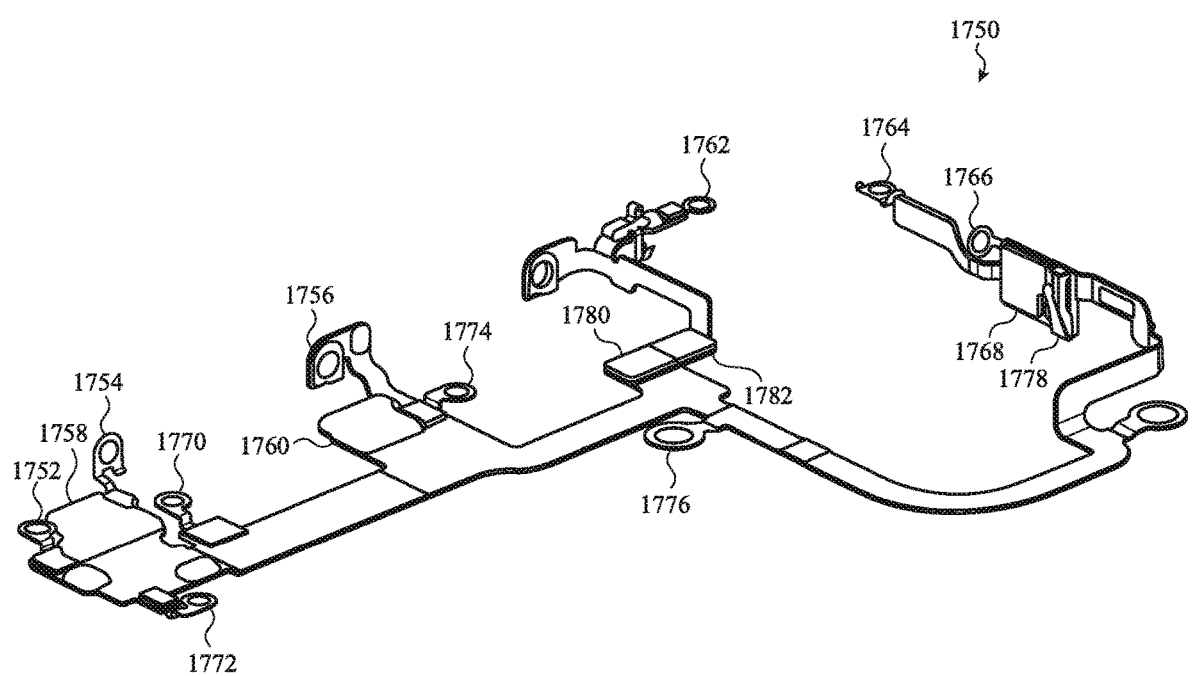

FIGS. 17A & 17B show examples of flex circuits 1700, 1750 that may be coupled to various ones of the housing segments 112 described with reference to FIGS. 1A-1C, 2A, 3A, 4, 5A-10C, 13A-13D, 14A-14G, & 15A-15C. The flex circuits 1700, 1750 may connect to the ground, feed, and tuning connectors of the housing segments 112, and may propagate signals to/from the ground, feed, and tuning connectors to operate the housing segments 112 as antennas. The flex circuit 1700 shown in FIG. 17A may include a ground connector 1702, feed connector 1704, and tuning connector 1706 that may be respectively electrically coupled to the ground connector 1406, feed connector 1410, and tuning connector 1414 of the first housing segment 112*a*, as described with reference to FIG. 14B. The flex circuit 1700 may also include tuning components 1708 that may be electrically coupled to the tuning connector 1706, feed connector 1704, and/or ground connector 1702.

The flex circuit 1700 may also include ground connectors 1710, 1712, feed connectors 1714, and tuning connectors 1716, 1718, 1720 that may be respectively electrically coupled to the ground connectors 1408, 1430, feed connectors 1412, and tuning connectors 1438, 1416, 1436 of the second housing segment 112*b*, as described with reference to FIG. 14B. The flex circuit 1700 may also include tuning components 1722 that may be electrically coupled to the tuning connectors 1716, 1718, 1720, feed connectors 1714, and/or ground connectors 1710, 1712.

The flex circuit 1700 may further include one or more ground connectors 1724, 1726 that may be electrically coupled to the sixth housing segment 112*f* described with reference to other figures, or one or more ground connectors 1728, 1730 that may be electrically coupled to the support plate 110 described with reference to other figures, and/or a board-to-board (B2B) connector 1732 that may electrically couple the flex circuit 1700, its connectors, and its tuning components to the logic board 1600 described with reference to FIGS. 16A-16D. As shown, some portions of the flex circuit 1700 may be bent and routed orthogonal to other portions of the flex circuit 1700 within a device.

The flex circuit 1750 shown in FIG. 17B may include a ground connector 1752, feed connector 1754, and tuning connector 1756 that may be respectively electrically coupled to the ground connector 1320, feed connector 1322, and tuning connector 1324 of the third housing segment 112*c*, as described with reference to FIG. 13C. The flex circuit 1750 may also include tuning components 1758, 1760 that may be electrically coupled to the tuning connector 1756, feed connector 1754, and/or ground connector 1752.

The flex circuit 1750 may also include a ground connector 1762, feed connector 1764, and tuning connector 1766 that may be respectively electrically coupled to the ground connector 1334, feed connector 1336, and tuning connector 1338 of the fourth housing segment 112*d*, as described with reference to FIG. 13C. The flex circuit 1750 may also include tuning components 1768 that may be electrically coupled to the tuning connector 1766, feed connector 1764, and/or ground connector 1762.

The flex circuit 1750 may further include one or more ground connectors 1770, 1772, 1774, 1776 that may be electrically coupled to the support plate 110 described with reference to other figures, a ground spring 1778 that may be electrically coupled to the ground pad 1314 described with reference to FIG. 13B, and/or one or more B2B connectors 1780, 1782 that may electrically couple the flex circuit 1750, its connectors, and its tuning components to the logic board 1600 described with reference to FIGS. 16A-16D. The flex circuit 1750 may further include a Fargo feed connector 1784 and a Fargo logic board connector 1786. The Fargo feed connector 1784 may be electrically connected to the Fargo feed connector 1346 described with reference to FIG. 13C, and the Fargo logic board connector 1786 may be electrically connected to the Stockholm ground connector 1606 described with reference to FIG. 16A. The Fargo connectors 1784, 1786 may be used to establish a near-field communication (NFC) inductive loop usable for NFC communications.

As shown in FIG. 17B, some portions of the flex circuit 1750 may be bent and routed orthogonal to other portions of the flex circuit 1750 within a device.

Figure 18:
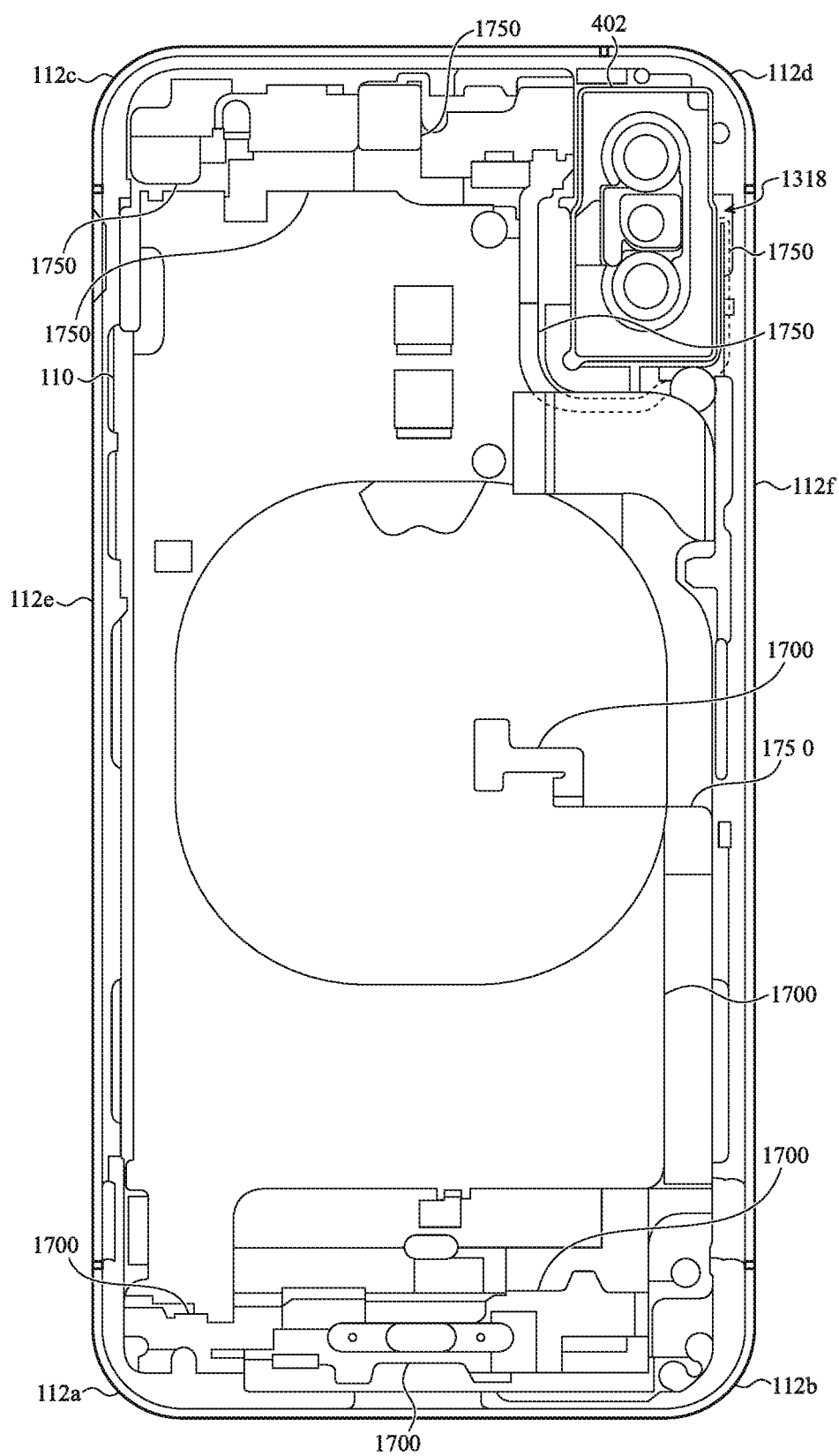
FIG. 18 shows how the flex circuits described with reference to FIGS. 17A & 17B may be placed and routed with respect to the housing segments and support plate described with reference to FIGS. 1A-1C, 2A, 3A, 4, 5A-10C, 13A-13D, 14A-14G, 15A-15C, & 16A-16D.

FIG. 18 shows how the flex circuits 1700, 1750 described with reference to FIGS. 17A & 17B may be placed and routed with respect to the housing segments 112 and support plate 110 described with reference to FIGS. 1A-1C, 2A, 3A, 4, 5A-10C, 13A-13D, 14A-14G, 15A-15C, & 16A-16D. As shown, a portion of the flex circuit 1750 described with reference to FIG. 17B may be oriented perpendicular to the support plate 110 and routed through the channel 1318 between the camera brace 402 and sixth housing segment 112*f*. In some embodiments, portions of the flex circuits 1700, 1750 may be adhesively bonded to the support plate 110.

Figure 19:
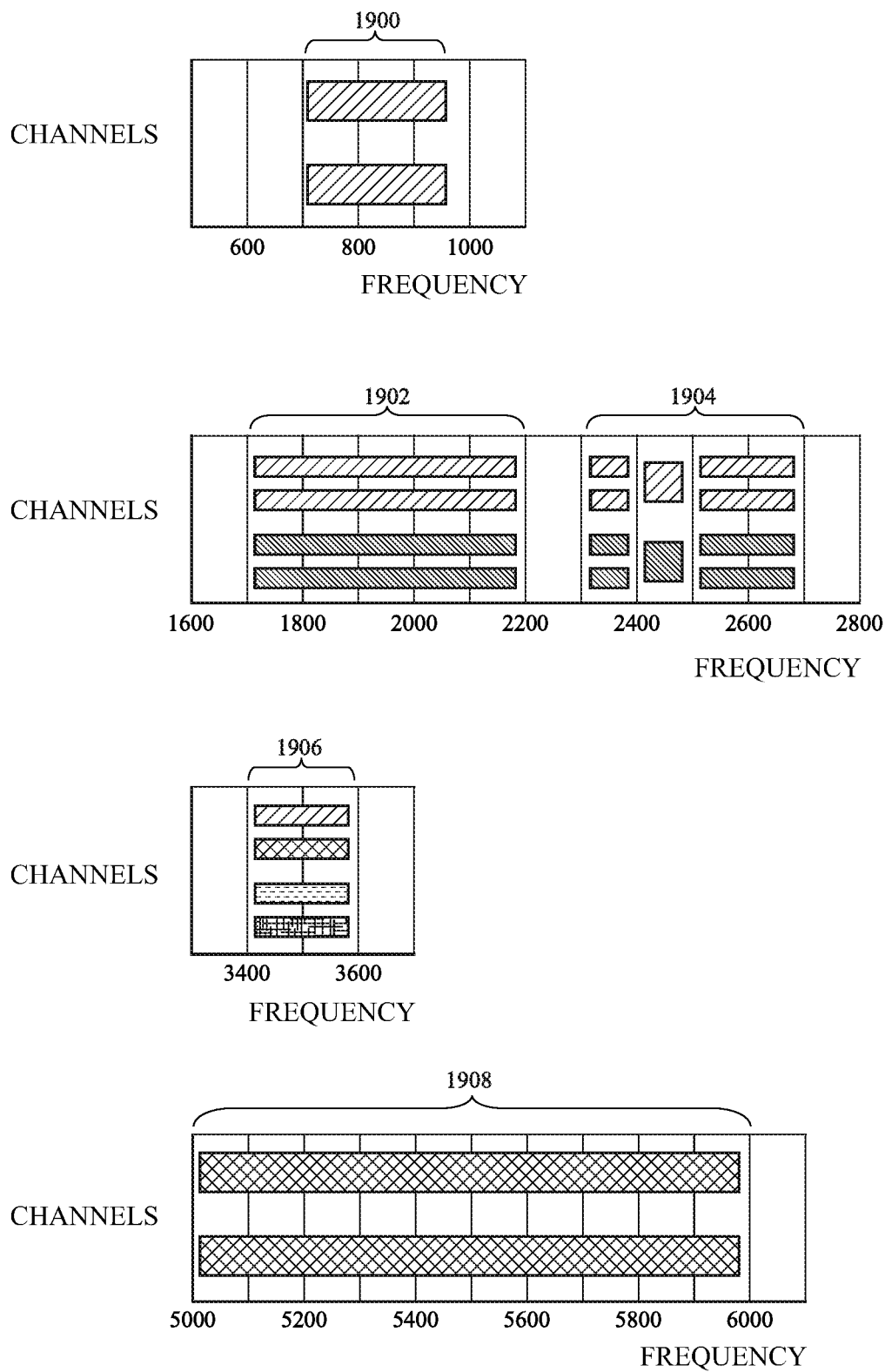
FIG. 19 shows a set of wireless frequency bands that may be used for wireless communication.

Turning now to FIG. 19, there is shown a set of wireless frequency bands 1900, 1902, 1904, 1906, 1908 that may be used for wireless communication. The wireless frequency bands include a low wireless frequency band 1900 extending from about 600-950 MHz, a mid wireless frequency band 1902 extending from about 1700-2200 MHz, a high wireless frequency band 1904 extending from about 2300-2800 MHz, a B42 wireless frequency band 1906 extending from about 3400-3600 MHz (currently defined for use in the European Union (EU) and Japan), and a 5G, Wi-Fi, or B46 band 1908 extending from about 5000-6000 MHz.

In some embodiments of the devices and housings described herein, multiple housing segments disposed along a sidewall of a device housing may be operated individually or simultaneously as antennas, in the wireless frequency bands described with reference to FIG. 19 or in other wireless frequency bands. For example, in some cases, wireless communication circuitry may be operable to communicate in different wireless communication modes, using the same or different combinations of antennas (including, in some cases, housing segments that are configured to operate as antennas).

In some embodiments, wireless communication circuitry may be configured to operate in a first wireless communication mode (e.g., a 2×2 MIMO wireless communication mode). In the first wireless communication mode, the wireless communication circuitry may be configured to use the second and third housing segments 112*b*, 112*c* described with reference to FIG. 2A or 3A as different antennas for wireless communication. In some embodiments, wireless communication in the first wireless communication mode may occur in the low wireless frequency band 1900. Alternatively, the wireless communication circuitry may be operated in a second wireless communication mode (e.g., a 4×4 MIMO wireless communication mode). In the second wireless communication mode, the wireless communication circuitry may be configured to use the first, second, third, and fourth housing segments 112*a*, 112*b*, 112*c*, 112*d* described with reference to FIG. 2A or 3A as different antennas for wireless communication. In some embodiments, wireless communication in the second wireless communication mode may occur in the mid wireless frequency band 1902 or the high wireless frequency band 1904. Alternatively, the wireless communication circuitry may be operated in a third wireless communication mode (e.g., another 4×4 MIMO wireless communication mode). In the third wireless communication mode, the wireless communication circuitry may be configured to use the second housing segment 112*b* in combination with the sixth housing segment 112*f*, a first interior antenna 324 (described with reference to FIG. 3A), a second interior antenna 326 (described with reference to FIG. 3A), and the fourth housing segment 112*d* in combination with the sixth housing segment 112*f* as different antennas for wireless communication. In some embodiments, wireless communication in the third wireless communication mode may occur in the B42 wireless frequency band 1906. Alternatively, the wireless communication circuitry may be operated in a fourth wireless communication mode (e.g., another 2×2 MIMO wireless communication mode). In the fourth wireless communication mode, the wireless communication circuitry may be configured to use the first and second interior antennas 324*a*, 324*b* described with reference to FIG. 3A for wireless communication in the 5G, Wi-Fi, or B46 wireless frequency band 1908.

In general, it can be useful to configure antennas with the greatest physical separation to operate simultaneously in a wireless communication mode that requires two antennas. Thus, two-antenna wireless communication modes may be supported by antennas positioned on diagonally opposite corners of a device, when possible.

The housing segments described with reference to FIGS. 2B-2E may also be used in different combinations (or individually) to communicate in one or more of the wireless frequency bands described with reference to FIG. 19.

Figure 20A:
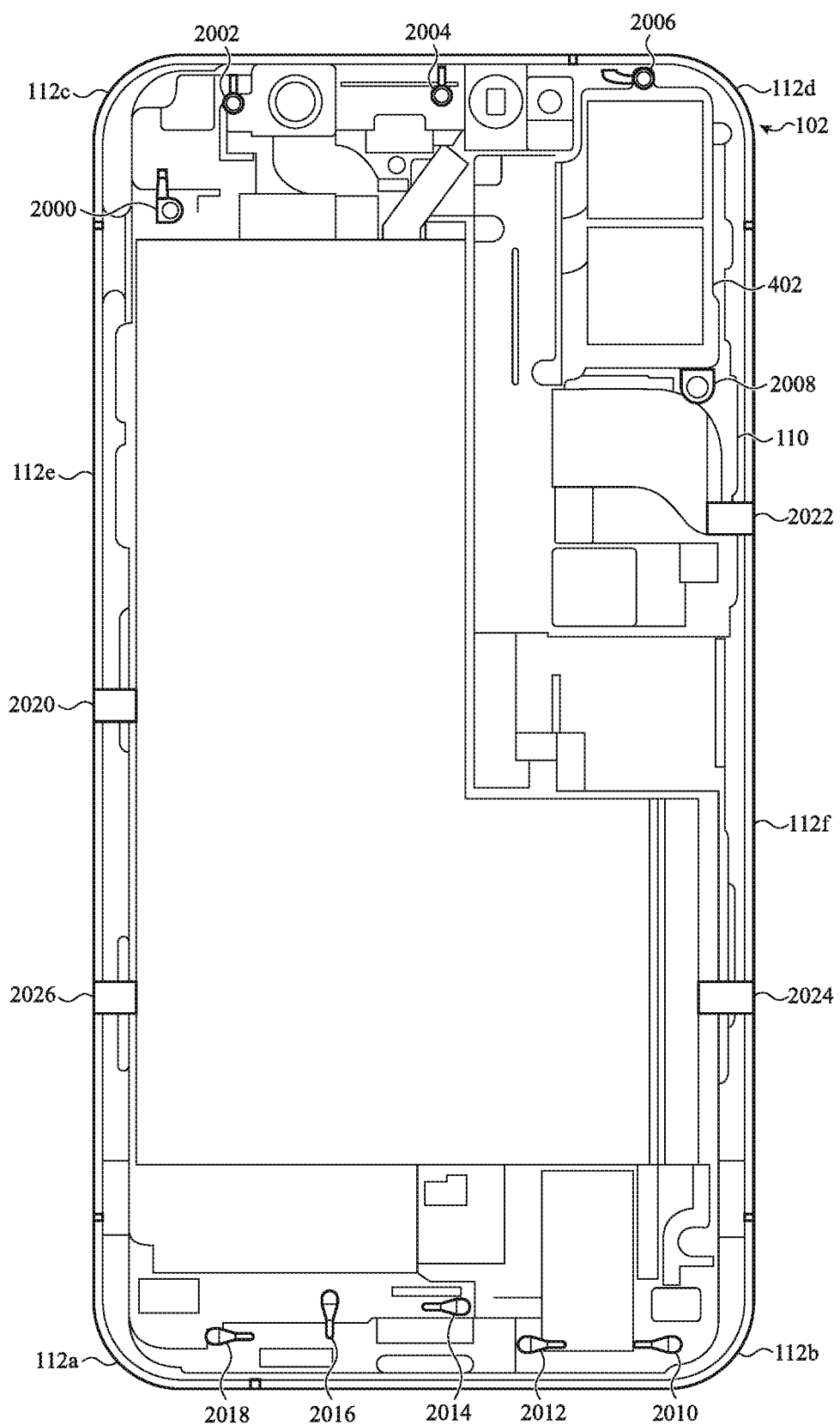
FIGS. 20A & 20B show corresponding ground springs and ground pads on a housing and a cover (e.g., a cover glass) mounted to the housing to enclose a device stack including a display.
Figure 20B:
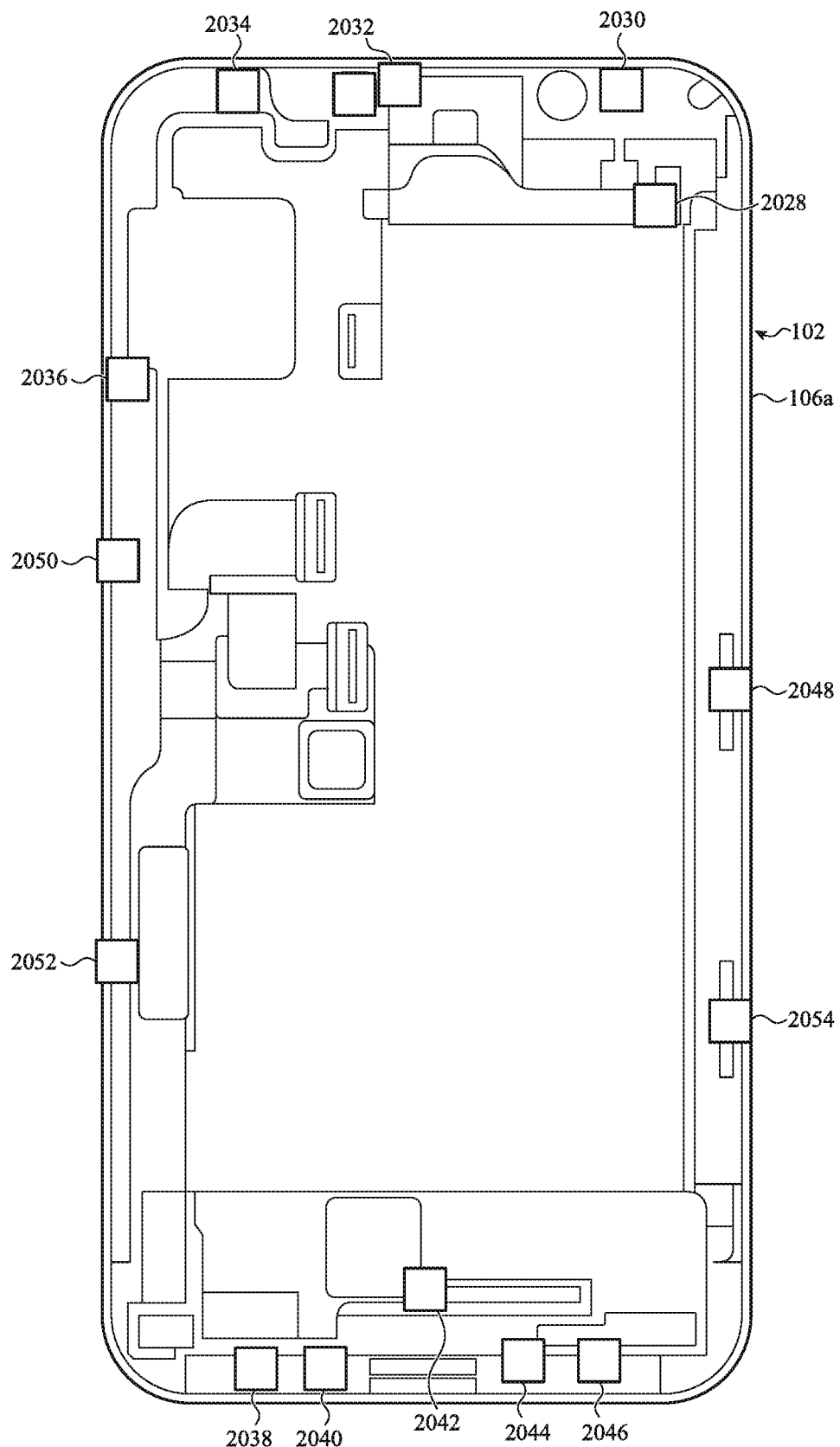

FIGS. 20A & 20B show corresponding ground springs 2000, 2002, 2004, 2006, 2008, 2010, 2012, 2014, 2016, 2018 and ground pads 2028, 2030, 2032, 2034, 2036, 2038, 2040, 2042, 2044, 2046 on the housing 102 (e.g., on the housing segments 112 or support plate 110), and a cover (e.g., the front cover 106*a* described with reference to FIGS. 1A-1C) mounted to the housing 102, to enclose a device stack including a display. The display may be viewable through the cover 106*a*. FIG. 20A shows example locations of ground springs 2000-2018 that are electrically coupled to the housing 102, and FIG. 20B shows example locations of ground pads 2028-2046 that are coupled to the cover 106*a*.

The ground springs 2000-2018 and ground pads 2028-2046 may be positioned about the periphery of the support plate 110 or cover 106*a*, and may be generally located in the device forehead and device chin. A ground spring 2000-2018 that is mechanically and electrically coupled to the support plate 110, a housing segment 112, or the camera brace 402 may electrically contact a respective ground pad 2028-2046 that is mechanically coupled to the cover, and vice versa. Distribution of the ground springs 2000-2018 and ground pads 2028-2046 throughout the device forehead and chin can provide a good ground reference for the housing segments 112 when the housing segments are configured to operate as antennas. The ground springs and ground pads may in some cases be configured to provide low inductance connections between a ground plane on the cover 106*a* and a ground plane provided by the support plate 110. In some embodiments, providing relatively equal spacing between ground springs in the device forehead and device chin can provide a more uniform ground. A uniform ground can improve the resonance of the housing segments 112.

The ground springs 2000-2018 may be mechanically and electrically coupled to the support plate 110, housing segments 112, or camera brace 402 by welds, solder, conductive adhesive, or other types of fasteners. In some embodiments, one or more of the ground springs 2000-2018 may be a preformed, stamped, or bent metal spring. In some embodiments, the ground springs 2000-2018 and ground pads 2028-2046 may be gold or gold plated.

Corresponding mechanical snaps 2020, 2022, 2024, 2026, 2048, 2050, 2052, 2054 may be coupled to the housing 102 (e.g., to the fifth and sixth housing segments 112*e*, 112*f* or portions of the support plate 110 adjacent the fifth and sixth housing segments 112*e*, 1120 and to the cover 106*a*, and may engage one another to mechanically couple the cover 106*a* to the housing segments 112.

Figure 21A:
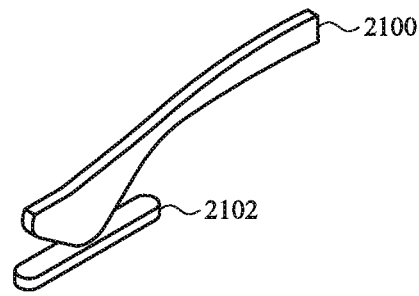
FIGS. 21A-21C show various examples of low force springs and corresponding contact pads, as may be used to implement any of the ground springs and ground pads described with reference to FIGS. 20A, 20B.
Figure 21B:
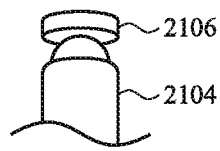
Figure 21C:
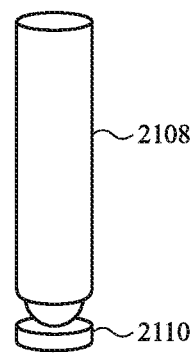

FIGS. 21A-21C show various examples of low force springs and corresponding contact pads, as may be used to implement any of the ground springs and ground pads described with reference to FIGS. 20A, 20B, or other figures. The examples of low force springs include a wiping contact 2100 (FIG. 22A), a point contact 2104 (FIG. 22B), and a magsafe pin 2108 (FIG. 22C). Each of the low force springs 2100, 2104, 2108 may contact a respective contact pad 2102, 2106, or 2110. In some embodiments, each of the low force springs 2100, 2104, 2108 and their corresponding contact pads 2102, 2106, 2110 may be made of gold or be gold plated.

FIG. 22 shows a cross-section 2200 of the device forehead shown in FIGS. 13C & 13D. As shown, a portion of a non-conductive housing component 528 may be molded against the third housing segment 112*c* to form a surface 2202 that supports a front cover 106*a*. The third housing segment 112*c* may also form part of the surface 2202, or alternatively, the third housing segment 112*c* may form the entire surface 2202. A frame 2204 may be positioned about the periphery of the device, between the surface 2202 and the cover 106*a*. In some embodiments, the frame 2204 may be bonded to the surface 2202 and/or cover 106*a* by one or more adhesives 2206, 2208.

In some embodiments, the frame 2204 may include a plastic outer portion 2204*a* that is mechanically coupled to a metallic inner portion 2204*b* (e.g., the metallic inner portion 2204*b* may be insert-molded into the plastic outer portion 2204*a*). In other embodiments, the entire frame 2204 may be plastic or metallic. As shown, the frame 2204 (e.g., the inner portion 2204*b* of the frame 2204) may be attached to a stiffener 2210, which may be metallic or plastic, for example. The stiffener 2210 may be bonded to the cover 106*a*, for example, by an adhesive 2212.

A bracket, such as the alignment bracket 2214, may be attached to the stiffener 2210, and in some cases to the cover 106*a*. The alignment bracket 2214 may be metallic or plastic, and in some cases may be welded (e.g., laser welded) or bonded (e.g., adhesively bonded) to the stiffener 2210 and/or cover 106*a*. The alignment bracket 2214 may serve as a means for mounting a bio-authentication sensor, camera, speaker, or other components within the device forehead.

The alignment bracket 2214 may be positioned adjacent a device stack 130 including a display, touch sensors, force sensors, or other components.

Figure 23:
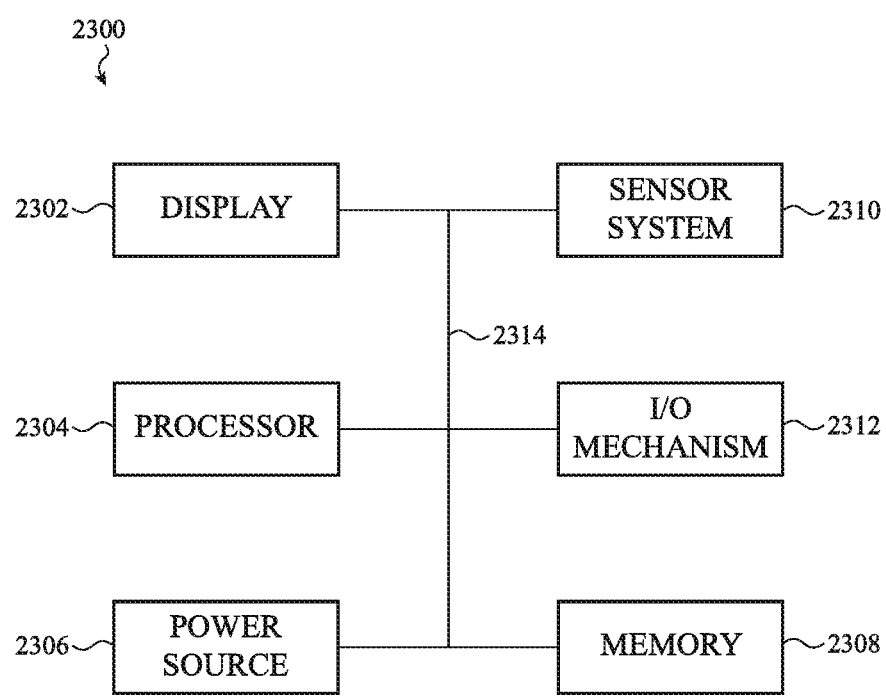
FIG. 23 shows a sample electrical block diagram of an electronic device.

FIG. 23 shows a sample electrical block diagram of an electronic device 2300, which electronic device may in some cases take the form of the device 100 described with reference to FIGS. 1A-1C or other devices described herein. The electronic device 2300 may include a display 2302 (e.g., a light-emitting display), a processor 2304, a power source 2306, a memory 2308 or storage device, a sensor system 2310, or an input/output (I/O) mechanism 2312 (e.g., an input/output device, input/output port, or haptic input/output interface). The processor 2304 may control some or all of the operations of the electronic device 2300. The processor 2304 may communicate, either directly or indirectly, with some or all of the other components of the electronic device 2300. For example, a system bus or other communication mechanism 2314 can provide communication between the display 2302, the processor 2304, the power source 2306, the memory 2308, the sensor system 2310, and the I/O mechanism 2312.

The processor 2304 may be implemented as any electronic device capable of processing, receiving, or transmitting data or instructions, whether such data or instructions is in the form of software or firmware or otherwise encoded. For example, the processor 2304 may include a microprocessor, a central processing unit (CPU), an application-specific integrated circuit (ASIC), a digital signal processor (DSP), a controller, or a combination of such devices. As described herein, the term "processor" is meant to encompass a single processor or processing unit, multiple processors, multiple processing units, or other suitably configured computing element or elements. In some embodiments, the processor 2304 may function as the controller described with reference to FIG. 1C.

It should be noted that the components of the electronic device 2300 can be controlled by multiple processors. For example, select components of the electronic device 2300 (e.g., the sensor system 2310) may be controlled by a first processor and other components of the electronic device 2300 (e.g., the display 2302) may be controlled by a second processor, where the first and second processors may or may not be in communication with each other.

The power source 2306 can be implemented with any device capable of providing energy to the electronic device 2300. For example, the power source 2306 may include one or more batteries or rechargeable batteries. Additionally or alternatively, the power source 2306 may include a power connector or power cord that connects the electronic device 2300 to another power source, such as a wall outlet.

The memory 2308 may store electronic data that can be used by the electronic device 2300. For example, the memory 2308 may store electrical data or content such as, for example, audio and video files, documents and applications, device settings and user preferences, timing signals, control signals, and data structures or databases. The memory 2308 may include any type of memory. By way of example only, the memory 2308 may include random access memory, read-only memory, Flash memory, removable memory, other types of storage elements, or combinations of such memory types.

The electronic device 2300 may also include one or more sensor systems 2310 positioned almost anywhere on the electronic device 2300. The sensor system(s) 2310 may sense one or more type of parameters, such as but not limited to, force or pressure on the display 2302, a crown, a button, or a housing of the electronic device 2300; light; touch; heat; movement; relative motion; biometric data (e.g., biological parameters) of a user; and so on. For example, the sensor system(s) 2310 may include a watch crown sensor system, a heat sensor, a position sensor, a light or optical sensor, an accelerometer, a pressure transducer, a gyroscope, a magnetometer, a bio-authentication sensor, a health monitoring sensor, and so on. Additionally, the one or more sensor systems 2310 may utilize any suitable sensing technology, including, but not limited to, capacitive, ultrasonic, resistive, optical, ultrasound, piezoelectric, and thermal sensing technology.

The I/O mechanism 2312 may transmit or receive data from a user or another electronic device. The I/O mechanism 2312 may include the display 2302, a touch sensing input surface, one or more buttons (e.g., a graphical user interface "home" button), a crown, one or more cameras, one or more microphones or speakers, one or more ports such as a microphone port, and/or a keyboard. Additionally or alternatively, the I/O mechanism 2312 may transmit electronic signals via a communications interface, such as a wireless, wired, and/or optical communications interface. Examples of wireless and wired communications interfaces include, but are not limited to, cellular and Wi-Fi communications interfaces. In some embodiments, the electronic device 2300 may configure one or more of the housing segments 112 described herein to operate as an antenna and/or may configure the electronic device 2300 to communicate in one or more of the wireless frequency bands described with reference to FIG. 19 (or other wireless frequency bands).

The foregoing description, for purposes of explanation, uses specific nomenclature to provide a thorough understanding of the described embodiments. However, it will be apparent to one skilled in the art, after reading this description, that the specific details are not required in order to practice the described embodiments. Thus, the foregoing descriptions of the specific embodiments described herein are presented for purposes of illustration and description. They are not targeted to be exhaustive or to limit the embodiments to the precise forms disclosed. It will be apparent to one of ordinary skill in the art, after reading this description, that many modifications and variations are possible in view of the above teachings.

What is claimed is:

1. A device, comprising:
    a display; and
    a housing surrounding the display and having four corners defining portions of an exterior surface of the device, the housing comprising:
        a first conductive housing segment defining at least part of a first corner of the four corners and configured to operate as an antenna, the first conductive housing segment having a first hole therein;
        a second conductive housing segment defining at least part of a second corner of the four corners and having a second hole therein;
        a third conductive housing segment defining at least part of a third corner of the four corners, the third corner forming part of the housing diagonally opposite the second corner; and
        a non-conductive housing component extending into the first hole and the second hole and structurally coupling the first conductive housing segment to the second conductive housing segment.

2. The device of claim 1, wherein:
    the antenna is a first antenna;
    the second conductive housing segment is configured to operate as a second antenna; and
    the third conductive housing segment is configured to operate as a third antenna.

3. The device of claim 2, further comprising:
    a fourth conductive housing segment defining at least part of a fourth corner of the four corners and configured to operate as a fourth antenna.

4. The device of claim 1, further comprising:
    a fourth conductive housing segment defining at least part of a fourth corner of the four corners; and
    wireless communication circuitry coupled to the first conductive housing segment, the second conductive housing segment, the third conductive housing segment, and the fourth conductive housing segment; wherein:
    the wireless communication circuitry is operable to communicate in different wireless communication modes by configuring different combinations of the first conductive housing segment, the second conductive housing segment, the third conductive housing segment, and the fourth conductive housing segment as two or four antennas.

5. The device of claim 4, wherein:
in a first multiple-input multiple-output (MIMO) wireless communication mode, the wireless communication circuitry is operable to use a combination of the second conductive housing segment and the third conductive housing segment for wireless communication; and
in a second MIMO wireless communication mode, the wireless communication circuitry is operable to use a combination of the first conductive housing segment, the second conductive housing segment, the third conductive housing segment, and the fourth conductive housing segment for wireless communication.

6. The device of claim 1, further comprising:
a first interlock feature extending from a first end of the first conductive housing segment, into an interior volume defined by the housing; and
a second interlock feature extending from a second end of the second conductive housing segment, into the interior volume; wherein:
the first hole is in the first interlock feature; and
the second hole is in the second interlock feature.

7. The device of claim 6, further comprising:
a third interlock feature extending from a third end of the third conductive housing segment, into the interior volume; and
a fourth interlock feature extending from a fourth end of the first conductive housing segment; wherein:
the non-conductive housing component extends into a third opening in the third interlock feature; and
the non-conductive housing component extends into a fourth opening in the fourth interlock feature.

8. The device of claim 1, wherein:
the housing further comprises a support plate disposed under the display;
the non-conductive housing component structurally couples the first conductive housing segment to the second conductive housing segment and the third conductive housing segment; and
the non-conductive housing component structurally couples the first conductive housing segment to the support plate.

9. A device, comprising:
a display;
a housing defining a sidewall of the device surrounding a perimeter of the display, the housing comprising:
a first conductive segment defining at least part of a first corner of the sidewall and configured to operate as a first antenna;
a second conductive segment defining at least part of a second corner of the sidewall and configured to operate as a second antenna;
a third conductive segment defining at least part of a third corner of the sidewall and configured to operate as a third antenna;
a fourth conductive segment defining at least part of a fourth corner of the sidewall and configured to operate as a fourth antenna; and
a non-conductive housing component extending into a first hole in the first antenna and a second hole in the second antenna and structurally coupling the first conductive segment to the second conductive segment; and
wireless communication circuitry coupled to the first conductive segment.

10. The device of claim 9, wherein;
the wireless communication circuitry is further coupled to the second conductive segment, the third conductive segment, and the fourth conductive segment; and
the wireless communication circuitry is configured to operate in at least one multiple-input multiple-output (MIMO) mode using the first conductive segment, the second conductive segment, the third conductive segment, and the fourth conductive segment.

11. The device of claim 9, wherein:
the third corner forms part of the sidewall diagonally opposite the second corner;
the wireless communication circuitry is operable in a first multiple-input multiple-output (MIMO) mode wireless communication mode and a second MIMO wireless communication mode; and
when the wireless communication circuitry is operated in the first MIMO wireless communication mode, the wireless communication circuitry is configured to use the first conductive segment, the second conductive segment, the third conductive segment, and the fourth conductive segment as different antennas for wireless communication in a first wireless frequency band.

12. The device of claim 11, wherein:
when the wireless communication circuitry is operated in the second MIMO wireless communication mode, the wireless communication circuitry is configured to use the second conductive segment and the third conductive segment as different antennas for wireless communication in a second wireless frequency band.

13. The device of claim 9, wherein each of the second conductive segment and the third conductive segment extend along a greater portion of the sidewall than each of the first conductive segment and the fourth conductive segment.

14. The device of claim 13, further comprising:
a second non-conductive housing component extending into a third hole in the third antenna and a fourth hole in the fourth antenna and structurally coupling the third conductive segment and the fourth conductive segment.

15. The device of claim 9, further comprising:
a flex circuit; wherein:
the sidewall defines a short side and a long side;
the first corner and the second corner are disposed at opposite ends of the short side;
the first conductive segment has a first ground connector electrically coupled to the flex circuit and a first antenna feed connector electrically coupled to the flex circuit; and
the second conductive segment has a second ground connector electrically coupled to the flex circuit and a second antenna feed connector electrically coupled to the flex circuit.

16. A device, comprising:
a display;
a housing defining a sidewall of the device and at least partially defining an interior volume including the display, the housing comprising:
a first conductive antenna segment defining a first portion of the sidewall;
a second conductive antenna segment defining a second portion of the sidewall; and
a non-conductive housing component extending into a first hole in the first conductive antenna segment and a second hole in the second conductive antenna segment, the non-conductive housing component structurally coupling the first conductive antenna segment and the second conductive antenna segment and defining a third portion of the sidewall, and the non-conductive housing component electrically insulating the second conductive antenna segment from the first conductive antenna segment; and wireless communication circuitry disposed within the interior volume and operable in a first wireless communication mode with the second conductive antenna segment electrically disconnected from the first conductive antenna segment, and in a second wireless communication mode with the second conductive antenna segment electrically connected to the first conductive antenna segment.

17. The device of claim 16, wherein:
the housing further comprises a conductive support plate disposed under the display and electrically connected to the second conductive antenna segment;
the second conductive antenna segment defines at least a first portion of a slot antenna feature; and
the conductive support plate defines at least a second portion of the slot antenna feature.

18. The device of claim 16, wherein:
the first conductive antenna segment defines a corner of the sidewall; and
the second conductive antenna segment defines a side of the sidewall.

19. The device of claim 18, wherein:
the corner is a first corner;
the housing further comprises:
a third conductive antenna segment defining a fourth portion of the sidewall including a second corner of the sidewall;
the non-conductive housing component defines a fifth portion of the sidewall and electrically insulates the third conductive antenna segment from the second conductive antenna segment;
the second conductive antenna segment is electrically disconnected from the third conductive antenna segment in the first wireless communication mode; and
the second conductive antenna segment is electrically connected to the third conductive antenna segment in the second wireless communication mode.

20. The device of claim 19, wherein:
in the second wireless communication mode, the wireless communication circuitry is operable to conduct a wireless communication using the second conductive antenna segment in combination with the first conductive antenna segment as a first antenna, and using the second conductive antenna segment in combination with the third conductive antenna segment as a second antenna.

* * * * *